US011706934B2

(12) United States Patent
Castro et al.

(10) Patent No.: US 11,706,934 B2
(45) Date of Patent: Jul. 18, 2023

(54) CROSS-POINT MEMORY ARRAY AND RELATED FABRICATION TECHNIQUES

(71) Applicant: Micron Technology, Inc., Boise, ID (US)

(72) Inventors: Hernan A. Castro, Shingle Springs, CA (US); Stephen H. Tang, Fremont, CA (US); Stephen W. Russell, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/174,027

(22) Filed: Feb. 11, 2021

(65) Prior Publication Data

US 2021/0167127 A1    Jun. 3, 2021

Related U.S. Application Data

(62) Division of application No. 15/961,547, filed on Apr. 24, 2018, now Pat. No. 10,950,663.

(51) Int. Cl.
*H01L 27/24* (2006.01)
*H01L 27/11514* (2017.01)
(Continued)

(52) U.S. Cl.
CPC ...... *H01L 27/249* (2013.01); *H01L 27/11514* (2013.01); *H01L 21/76816* (2013.01);
(Continued)

(58) Field of Classification Search
CPC ............ H01L 27/249; H01L 27/11514; H01L 45/065; H01L 45/085; H01L 45/16;
(Continued)

(56) References Cited

U.S. PATENT DOCUMENTS 7,233,522 B2    6/2007   Chen et al.
9,659,998 B1    5/2017   Lung
(Continued)

FOREIGN PATENT DOCUMENTS

CN      105280560 A     1/2016
JP      2004-071935 A   3/2004
(Continued)

OTHER PUBLICATIONS

IPO, "Office Action," issued in connection with ROC (Taiwan) Patent Application No. 108112071, dated Dec. 11, 2019 (7 pages).
(Continued)

*Primary Examiner* — Patricia D Valenzuela
(74) *Attorney, Agent, or Firm* — Holland & Hart LLP

(57) ABSTRACT

Methods and apparatuses for a cross-point memory array and related fabrication techniques are described. The fabrication techniques described herein may facilitate concurrently building two or more decks of memory cells disposed in a cross-point architecture. Each deck of memory cells may include a plurality of first access lines (e.g., word lines), a plurality of second access lines (e.g., bit lines), and a memory component at each topological intersection of a first access line and a second access line. The fabrication technique may use a pattern of vias formed at a top layer of a composite stack, which may facilitate building a 3D memory array within the composite stack while using a reduced number of processing steps. The fabrication techniques may also be suitable for forming a socket region where the 3D memory array may be coupled with other components of a memory device.

20 Claims, 20 Drawing Sheets

(51) Int. Cl.
*H01L 45/00* (2006.01)
*H01L 23/522* (2006.01)
*H01L 21/768* (2006.01)

(52) U.S. Cl.
CPC ........ *H01L 23/5226* (2013.01); *H01L 45/065* (2013.01); *H01L 45/085* (2013.01); *H01L 45/16* (2013.01); *H01L 45/1683* (2013.01)

(58) Field of Classification Search
CPC . H01L 45/1683; H01L 27/2463; H01L 45/06; H01L 45/1233; H01L 45/141; H01L 45/143; H01L 45/1666; H01L 27/2472; H01L 27/2481; H01L 45/1253; H01L 21/76816; H01L 23/5226; G11C 13/0004; G11C 2213/71; G11C 2213/77
See application file for complete search history.

(56) References Cited

U.S. PATENT DOCUMENTS

| | | | |
|---|---|---|---|
| 9,711,392 | B2 | 7/2017 | Dehe et al. |
| 9,735,202 | B1 | 8/2017 | Tanaka et al. |
| 2002/0028558 | A1 | 3/2002 | Yang |
| 2004/0062938 | A1 | 4/2004 | Kai et al. |
| 2006/0113524 | A1 | 6/2006 | Bill et al. |
| 2008/0121961 | A1 | 5/2008 | Schloesser |
| 2008/0164454 | A1 | 7/2008 | Chen |
| 2011/0032772 | A1 | 2/2011 | Aritome |
| 2011/0079836 | A1 | 4/2011 | Lin |
| 2011/0297912 | A1 | 12/2011 | Samachisa et al. |
| 2012/0018868 | A1 | 1/2012 | Oganesian et al. |
| 2012/0276702 | A1 | 11/2012 | Yang et al. |
| 2013/0001501 | A1 | 1/2013 | Sills |
| 2013/0001739 | A1 | 1/2013 | Wells et al. |
| 2013/0105876 | A1 | 5/2013 | Hwang |
| 2013/0223149 | A1 | 8/2013 | Kito et al. |
| 2013/0229846 | A1 | 9/2013 | Chien et al. |
| 2013/0288391 | A1 | 10/2013 | Lee et al. |
| 2014/0011334 | A1 | 1/2014 | Cho et al. |
| 2014/0035025 | A1 | 2/2014 | Su-Chang |
| 2014/0048761 | A1 | 2/2014 | Nojiri et al. |
| 2014/0239376 | A1 | 8/2014 | Zhang et al. |
| 2014/0241026 | A1 | 8/2014 | Tanzawa |
| 2014/0295638 | A1 | 10/2014 | Pio |
| 2014/0332875 | A1 | 11/2014 | Kim et al. |
| 2014/0346428 | A1 | 11/2014 | Sills et al. |
| 2015/0008503 | A1 | 1/2015 | Makala et al. |
| 2015/0108562 | A1 | 4/2015 | Chen et al. |
| 2015/0155482 | A1 | 6/2015 | Lee |
| 2015/0179258 | A1 | 6/2015 | Castro |
| 2015/0200199 | A1* | 7/2015 | Sakamoto ......... H01L 29/66825 257/329 |
| 2015/0236038 | A1 | 8/2015 | Pachamuthu et al. |
| 2015/0279856 | A1 | 10/2015 | Hyun et al. |
| 2015/0280118 | A1 | 10/2015 | Lee et al. |
| 2015/0311217 | A1 | 10/2015 | Chavan et al. |
| 2015/0340374 | A1 | 11/2015 | Jung et al. |
| 2015/0340406 | A1* | 11/2015 | Jo ....................... H01L 27/249 257/4 |
| 2016/0141299 | A1 | 5/2016 | Hong |
| 2017/0148800 | A1 | 5/2017 | Nishikawa et al. |
| 2017/0148811 | A1 | 5/2017 | Zhang et al. |
| 2017/0148851 | A1 | 5/2017 | Hsu |
| 2017/0207273 | A1 | 7/2017 | Sciarrillo et al. |
| 2017/0236871 | A1 | 8/2017 | Tanaka et al. |
| 2017/0271463 | A1 | 9/2017 | Lim et al. |
| 2017/0309681 | A1 | 10/2017 | Tanaka et al. |
| 2017/0358629 | A1 | 12/2017 | Hu et al. |
| 2017/0373078 | A1 | 12/2017 | Chu et al. |
| 2018/0090373 | A1* | 3/2018 | Sharangpani ..... H01L 21/76843 |
| 2018/0108669 | A1 | 4/2018 | Zhu et al. |

FOREIGN PATENT DOCUMENTS

| | | |
|---|---|---|
| JP | 2005-158952 A | 6/2005 |
| JP | 2006-279042 A | 10/2006 |
| JP | 2010-171185 A | 8/2010 |
| JP | 2010-283071 A | 12/2010 |
| JP | 2013-098563 A | 5/2013 |
| JP | 2014-039007 A | 2/2014 |
| JP | 2014-523647 A | 9/2014 |
| JP | 2016-100596 A | 5/2016 |
| JP | 2017-010951 A | 1/2017 |
| JP | 2017-163044 A | 9/2017 |
| JP | 2017-168598 A | 9/2017 |
| JP | 2017-224688 A | 12/2017 |
| KR | 10-2008-0023158 A | 3/2008 |
| KR | 20120121746 A | 11/2012 |
| KR | 10-2013-0046700 A | 5/2013 |
| KR | 10-2014-0005479 A | 1/2014 |
| KR | 20140018544 A | 2/2014 |
| KR | 10-2015-0046149 A | 4/2015 |
| KR | 10-2016-0009685 A | 1/2016 |
| KR | 10-2016-0145811 A | 12/2016 |
| KR | 10-2017-0102391 A | 9/2017 |
| TW | I415257 B | 11/2013 |
| TW | I446509 B | 7/2014 |
| TW | 201539724 A | 10/2015 |
| TW | 201628067 A | 8/2016 |
| TW | 201705135 A | 2/2017 |
| TW | 201810536 A | 3/2018 |
| WO | 2008/062688 A1 | 5/2008 |
| WO | 2011/132423 A1 | 10/2011 |
| WO | 2013/006363 A2 | 1/2013 |

OTHER PUBLICATIONS

IPO, "Office Action," issued in connection with ROC (Taiwan) Patent Application No. 108112416, dated Dec. 9, 2019 (4 pages).
IPO, "Office Action," issued in connection with ROC (Taiwan) Patent Application No. 108112416, dated Jul. 20, 2020 (3 pages).
ISA/KR, International Search Report and Written Opinion of the International Searching Authority, Int'l. Appl. No. PCT/US2019/023887, dated Jul. 9, 2019, Korean Intellectual Property Office, Seo-gu, Daejeon, Republic of Korea, 13 pgs.
ISA/KR, International Search Report and Written Opinion of the International Searching Authority, Int'l. Appl. No. PCT/US2019/024531, dated Jul. 12, 2019, Korean Intellectual Property Office, Seo-gu, Daejeon, Republic of Korea, 13 pgs.
ISA/KR, International Search Report and Written Opinion of the International Searching Authority, Int'l. Appl. No. PCT/US2019/024533, dated Aug. 6, 2019, Korean Intellectual Property Office, Seo-gu, Daejeon, Republic of Korea, 13 pgs.
Taiwanese Intellectual Property Office, "Office Action," issued in connection with Application No. 108112414, dated Mar. 27, 2020, 33 pages with translation.
Rostami, et al., "Novel dual-Vth independent-gate FinFET circuits", Department of Electrical and Computer Engineering, Rice University, Houston, TX., retrieved from http://www.ece.rice.edu/~kmram/publications/PID1069335.pdf, 6 pgs.
Wang, , "Independent-Gate FinFET Circuit Design Methodology", IAENG International Journal of Computer Science, 37:1, IJCS_37_1_06, Feb. 1, 2010, 8 pgs.
Notice of Reasons for Refusal received for Japanese Application No. 2020-558894, dated Dec. 27, 2021, 8 pages (4 pages of English Translation and 4 pages of Original Document).
Notice of Reasons for Refusal received for Japanese Application No. 2020-558980, dated Dec. 24, 2021, 9 pages (5 pages of English Translation and 4 pages of Original Document).
Office Action received for Japanese Patent Application No. 2020-558932, dated Jan. 26, 2022, 10 pages (5 pages of English Translation and 5 pages of Original Document).
Taiwan Intellectual Property Office, "Office Action," issued in connection with ROC (Taiwan) Patent Application No. 109126004, dated Sep. 1, 2021 (4 pages).

(56) References Cited

OTHER PUBLICATIONS

European Patent Office, "Extended Search Report," issued in connection with European Patent Application No. 19791688.5, dated Dec. 17, 2021 (7 pages).
European Patent Office, "Extended Search Report," issued in connection with European Patent Application No. 19792010.1, dated Dec. 20, 2021 (8 pages).
European Patent Office, "Extended Search Report," issued in connection with European Patent Application No. 19792421.0, dated Jan. 7, 2022 (9 pages).
Korean Patent Office, "Request for the Submission of an Opinion", issued in connection with Korean Patent Application No. 10-2022-7021846 dated Oct. 11, 2022 (9 pages).
Japan Patent Office, "Notice of Rejection Ground", issued in connection with Japan Patent Application No. 2020-558932 dated Aug. 30, 2022 (10 pages).
Japan Patent Office, "Decision to Grant a Patent", issued in connection with Japan Patent Application No. 2020-558894 dated Aug. 9, 2022 (5 pages).
Korean Patent Office, "Notice of Allowance," issued in connection with Korean Patent Application No. 10-2022-7021846 dated Dec. 13, 2022 (5 pages) (2 pages of English Translation and 3 pages of Original Document).
Taiwanese Patent Office, "Office Action and Search Report", issued in connection with Taiwanese Patent Application No. 110103412 dated Nov. 3, 2022 (14 pages) (8 pages of English Translation and 6 pages of Original Document).
European Patent Office, "Office Action", issued in connection with European Patent Application No. 19791688.5 dated Mar. 22, 2023, 4 pages.

* cited by examiner

CROSS-POINT MEMORY ARRAY AND RELATED FABRICATION TECHNIQUES

CROSS REFERENCE

The present application for patent is a divisional of and claims priority to and the benefit of U.S. patent application Ser. No. 15/961,547 by Castro et al., entitled "CROSS-POINT MEMORY ARRAY AND RELATED FABRICATION TECHNIQUES" and filed Apr. 24, 2018, which is assigned to the assignee hereof and is expressly incorporated by reference in its entirety herein.

BACKGROUND

The following relates generally to forming a memory array and more specifically to a cross-point memory array and related fabrication techniques.

Memory devices are widely used to store information in various electronic devices such as computers, wireless communication devices, cameras, digital displays, and the like. Information is stored by programing different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may include volatile memory cells or non-volatile memory cells. Non-volatile memory cells may maintain their stored logic state for extended periods of time even in the absence of an external power source. Volatile memory cells may lose their stored state over time unless they are periodically refreshed by an external power source.

Improving memory devices, generally, may include increasing memory cell density, increasing read/write speeds, increasing reliability, increasing data retention, reducing power consumption, or reducing manufacturing costs, among other metrics. Building more memory cells per unit area may be desired to increase memory cell density and reduce per-bit costs without increasing a size of a memory device. Improved techniques for fabricating memory devices (e.g., faster, lower-cost), including memory devices with increased memory cell density, may also be desired.

DETAILED DESCRIPTION

Figure 1:
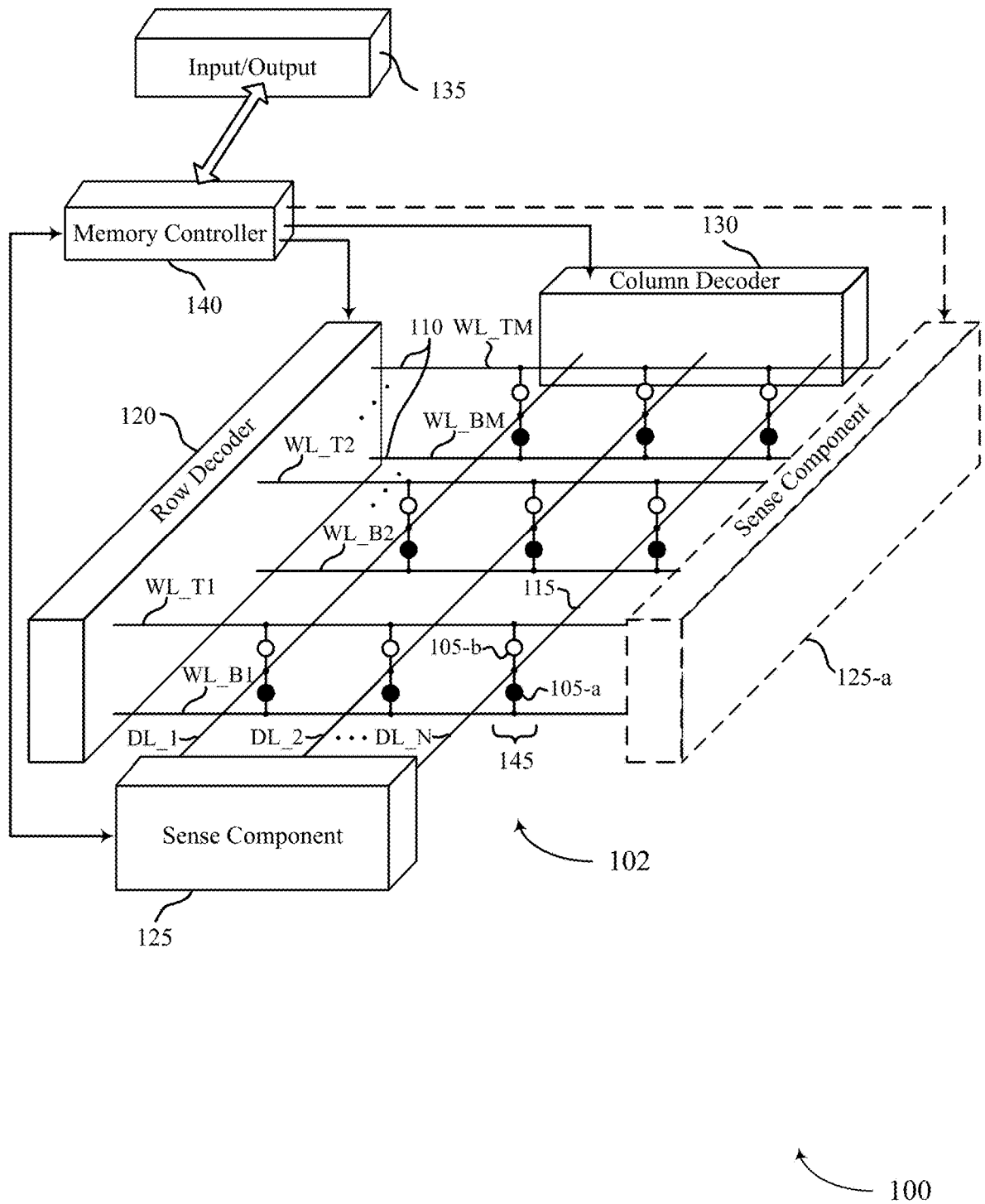
FIG. 1 illustrates an exemplary diagram of a memory device including a three-dimensional array of memory cells that supports a cross-point memory array and related fabrication techniques in accordance with embodiments of the present disclosure.

Building more memory cells per unit area may increase an areal density of memory cells within a memory device. The increased areal density of memory cells may facilitate a lower per-bit-cost of the memory device and/or a greater memory capacity at a fixed cost. Three-dimensional (3D) integration of two or more two-dimensional (2D) arrays of memory cells may increase areal density while also alleviating difficulties that may be associated with shrinking various feature sizes of memory cells. In some cases, a 2D array of memory cells may be referred to as a deck of memory cells, and 3D integration of multiple decks of memory cells may include repeating processing steps associated with building a single deck of memory cells. For example, at least some of the steps used to build one deck of memory cells may be repeated multiple times, as each successive deck of memory cells is built on top of any previously-built deck(s) of memory cells. Such repetition of processing steps may result in increased fabrication costs—e.g., due to a relatively large number of photomasking or other processing steps—and thus may offset benefits that may otherwise be associated with 3D integration.

The techniques, methods, and related devices described herein may relate to facilitating concurrent building of two or more decks of memory cells, along with associated structures (e.g., electrodes), using a pattern of vias (e.g., access vias) formed at a top layer of a composite stack, which may facilitate building a 3D memory device within the composite stack while using a reduced number of processing steps (e.g., photomasking steps). For example, the techniques, methods, and related devices described herein may provide for the formation of various structures (e.g., electrodes, memory cells, dielectric buffers, etc.) in a lower layer, which may be referred to as a buried layer, by selectively removing and replacing material originally included at the buried layer based on the pattern of vias. Further, the techniques, methods, and related devices described herein may facilitate the concurrent formation of like structures at a plurality of the buried layers, thereby reducing the number of photomasking or other processing steps associated with fabricating a 3D memory device, which may reduce fabrication costs of the 3D memory device and yield other benefits that may be appreciated by one of ordinary skill in the art. As used herein, a via may refer to an opening or an opening that has been later filled with a material, including a material that may not be conductive.

The techniques, methods, and related devices described herein may be suitable for building multiple decks of memory cells disposed in a cross-point architecture. For example, each deck of memory cells in a cross-point architecture may include a plurality of first access lines (e.g., word lines) in a first plane and a plurality of second access lines (e.g., bit lines) in a second plane, the first access lines and the second access lines extending in different directions—e.g., first access lines may be substantially perpendicular to second access lines. Each topological cross-point of a first access line and a second access lines may correspond to a memory cell. Hence, a deck of memory cells in a cross-point architecture may include a memory array having a plurality of memory cells placed at topological cross-points of access lines (e.g., a 3D grid structure of access lines).

Various memory technologies may include various forms of memory components that may be suitable for a cross-point architecture (e.g., a resistive component in a phase change memory (PCM) technology or a conductive-bridge random access memory (CBRAM) technology, or a capacitive component in a ferroelectric random access memory (FeRAM) technology). In some cases, a memory cell in a cross-point architecture may include a selection component (e.g., a thin-film switch device) and a memory component. In other cases, a memory cell in a cross-point architecture may not require a separate selection component—e.g., the memory cell may be a self-selecting memory cell.

The techniques, methods, and related devices described herein may relate to constructing a set of first access lines in a first layer and another set of second access lines in a second layer of a composite stack that includes the first layer and the second layer. The first access lines and the second access lines may topologically intersect such that each cross-point between a first access line and a second access line may include a space for a memory component to occupy. For example, the composite stack may be configured to include a memory layer between the first layer and the second layer. The first layer may comprise a first dielectric material, and a part of the first dielectric material may be replaced with a conductive material (e.g., an electrode material) to form a set of first access lines at the first layer. Similarly, another set of second access lines may be formed at the second layer in accordance with the fabrication techniques described herein.

To build a set of first access lines at the first layer, a set of first vias formed at a top layer of the stack may be used to form via holes through the stack. The first vias may be arranged in a row in a first direction (e.g., a horizontal direction within a plane). The via holes may provide access to the first dielectric material of the first layer located below the top layer. An isotropic etch step, by selectively removing a portion of the first dielectric material through the via holes, may create a series of cavities at the first layer. When congruent cavities (e.g., adjacent cavities) overlap, the congruent cavities may merge to form a first channel at the first layer. Subsequently, a conductive material (e.g., an electrode material) may fill the first channel at the first layer through the via holes.

Then, a second channel may be formed in the electrode material within the first channel using the same set of first vias (and associated via holes). Subsequently, a dielectric material may fill the second channel. The width of second channel may be less than the width of the first channel, and hence a portion of the electrode material may remain along the rim of the first channel, thereby forming a band (or elongated loop, or racetrack) of the electrode material formed at the first layer. The band of electrode material may subsequently be severed (e.g., the short ends of the loop may be removed or otherwise separated from the long sides of the loop), thereby forming a set of first access lines (e.g., a set of word lines in the horizontal direction within the plane). One or more sets of first access lines (e.g., one or more sets of word lines, each set of word lines formed at a respective first layer) may be concurrently formed using the fabrication technique if the stack includes one or more first layers.

Similar processing steps may be repeated for building a set of second access lines at a second layer. A set of second vias may be arranged in a row in a different direction than the set of first vias (e.g., in a vertical direction within the plane) such that the second vias may be used to form the set of second access lines at the second layer extending in a different direction than the first access lines (e.g., a set of bit lines at a second layer, where the bit lines in the set of bit lines are orthogonal to the word lines in the set of word lines at a first layer). One or more sets of second access lines (e.g., one or more sets of bit lines, each set of bit lines formed at a second layer) may be concurrently formed using the fabrication techniques described herein if the stack includes one or more second layers.

As described above, the composite stack may include a memory layer between the first layer and the second layer. In some cases, the memory layer included in the initial stack comprises a sheet of memory material (e.g., a chalcogenide material). In other cases, the memory layer included in the initial stack may comprise a placeholder material (e.g., a dielectric material), a portion of which may be replaced with a memory material at a later stage of fabrication process (e.g., after forming a 3D grid structure of access lines in other layers of the stack).

When the memory layer included in the initial stack comprises a sheet of memory material, the sheet of memory material may be modified by subsequent processing steps used to form a 3D cross-point array structure. In some cases, the sheet of memory material may become perforated with a plurality of dielectric plugs (e.g., via holes filled with a dielectric material). A pattern of the plurality of dielectric plugs may correspond to the pattern of the first vias and the second vias—that is, the plurality of dielectric plugs may be a result of forming first access lines (e.g., word lines) using the first vias and second access lines (e.g., bit lines) using the second vias. In other cases, the sheet of memory material may become segmented into a plurality of memory material elements by channels formed in the memory material using the first vias and the second vias. In some cases, each memory material element may be in a 3D rectangular shape. Further, each memory element may also be coupled with at least four electrodes (e.g., two electrodes from above and two electrodes from below) resulting in four memory cells per memory material element.

When the memory layer included in the initial stack comprises a placeholder material (e.g., a dielectric material), either the set of first vias or the set of second vias may be used to form a racetrack (e.g., a band) of memory material within the placeholder material at the memory layer. Processing steps associated with forming a band of memory material at a memory layer may be similar to the processing steps associated with forming a band of an electrode material at the first (or second) layer, but with the first channel filled with the memory material (e.g., as opposed to filled with the electrode material). After a band of memory material is formed at a memory layer (e.g., using the first vias), the band of memory material may be segmented into a plurality of memory material elements by forming channels using the other set of vias (e.g., using the second vias), where the channels intersect the band of memory material and thus divide the band of memory material into multiple discrete memory material elements. In some cases, each memory material element may be in a 3D bar shape. Further, each memory element may also be coupled with at least three electrodes (e.g., two electrodes from above and one electrode from below, or vice versa) resulting in two memory cells per memory material element.

In some cases, when the memory layer included in the initial stack comprises a placeholder material (e.g., a dielectric material), a set of common vias (e.g., a plurality of vias, each of which may be a part of both a set of first vias arranged in a row in a first direction and a set of second vias arranged in a row in a second direction) may be used to form a set of 3D discs of a memory material at a memory layer, with each common via used to form one 3D disc of the memory material at the memory layer. Subsequently, each of the 3D discs of the memory material may be segmented into four discrete memory material elements using the set of first vias and the set of second vias that include the corresponding common via. For example, the set of first vias may be used to form a first channel that divides (e.g., bisects) the 3D disc of the memory material in a first direction, and the set of second vias may be used to form a second channel that divides (e.g., bisects) the 3D disc of the memory material in a second direction. Each of the four discrete memory material elements may have a curved surface, which may correspond to an outer surface of the 3D disc from which the four discrete memory material elements were formed. In some cases, each of the four discrete memory material elements may be in a 3D wedge (e.g., pie slice) shape. Further, each memory element may be coupled with at least two electrodes (e.g., one electrode from above and one electrode from below) resulting in one memory cell per memory material element.

A subset of the first vias and the second vias may be used in a socket region of a memory device. In a context of 3D cross-point memory array architecture, a socket region may include structures configured to provide electrical connections between access lines of a memory array and other components (e.g., decoders, sense components) of a memory device. In some cases, a socket region may include structures having a gap for the purpose of electrical isolation.

In some cases, the subset of the first vias and the second vias may be used to create such a gap in a target electrode (e.g., access lines such as words lines or bit lines) by isotropically etching a portion of a target electrode material at an electrode layer. In some cases, a photomask having an opening may be used to create such a gap by anisotropically etching through the target electrode material.

In order to make connections between access lines and other components of a memory device, a subset of the first vias or the second vias may be used to form via holes that extend through the stack. The via holes may be filled with a conductive material and an etch step may remove a portion of the conductive material to expose a dielectric buffer at a target layer. The dielectric buffer may correspond to a dielectric material, which may have been used to fill a second channel (e.g., a channel at some point surrounded by a band of electrode material) after partially removing an electrode material from a first channel. The dielectric buffer may be removed, and a conductive material may fill the space in the via hole to electrically couple the target electrode material at the target layer to a node of the other components of the memory device. Thus, a socket region including gaps and interconnects may be formed using the pattern of first vias and the second vias.

Features of the disclosure introduced above are further described below in the context of a memory array configured with a cross-point architecture. Specific examples of structures and techniques for fabricating a cross-point memory array are then described. These and other features of the disclosure are further illustrated by and described with reference to apparatus diagrams, method of formation diagrams, and flowcharts that relate to a cross-point memory array and related fabrication techniques.

FIG. 1 illustrates an example memory device 100 that supports a cross-point memory array and related fabrication techniques in accordance with embodiments of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100. In the illustrative example of FIG. 1, the memory device 100 includes a three-dimensional (3D) memory array 102. The 3D memory array 102 includes memory cells 105 that may be programmable to store different states. In some embodiments, each memory cell 105 may be programmable to store two states, denoted as a logic 0 and a logic 1. In some embodiments, a memory cell 105 may be configured to store more than two logic states. A memory cell 105 may, in some embodiments, include a self-selecting memory cell. It is to be understood that the memory cell 105 may also include a memory cell of another type—e.g., a 3D XPoint™ memory cell, a PCM cell that includes a storage component and a selection component, a CBRAM cell, or a FeRAM cell. Although some elements included in FIG. 1 are labeled with a numeric indicator, other corresponding elements are not labeled, though they are the same or would be understood to be similar, in an effort to increase the visibility and clarity of the depicted features.

The 3D memory array 102 may include two or more two-dimensional (2D) memory arrays formed on top of one another. This may increase a number of memory cells that may be placed or created on a single die or substrate as compared with a single 2D array, which in turn may reduce production costs, or increase the performance of the memory device, or both. In the example depicted in FIG. 1, memory array 102 includes two levels of memory cells 105 (e.g., memory cell 105-a and memory cell 105-b) and may thus be considered a 3D memory array; however, the number of levels may not be limited to two, and other examples may include additional levels. Each level may be aligned or positioned so that memory cells 105 may be aligned (exactly, overlapping, or approximately) with one another across each level, thus forming memory cell stacks 145.

In some embodiments, each row of memory cells 105 is connected to a word line 110, and each column of memory cells 105 is connected to a bit line 115. Both word lines 110 and bit lines 115 may also be generically referred to as access lines. Further, an access line may function as a word line 110 for one or more memory cells 105 at one deck of the memory device 100 (e.g., for memory cells 105 below the access line) and as a bit line 115 for one or more memory cells 105 at another deck of the memory device (e.g., for memory cells 105 above the access line). Thus, references to word lines and bit lines, or their analogues, are interchangeable without loss of understanding or operation. Word lines 110 and bit lines 115 may be substantially perpendicular to one another and may support an array of memory cells.

In general, one memory cell 105 may be located at the intersection of two access lines such as a word line 110 and a bit line 115. This intersection may be referred to as the address of the memory cell 105. A target memory cell 105 may be a memory cell 105 located at the intersection of an energized (e.g., activated) word line 110 and an energized (e.g., activated) bit line 115; that is, a word line 110 and a bit line 115 may both be energized in order to read or write a memory cell 105 at their intersection. Other memory cells 105 that are in electronic communication with (e.g., connected to) the same word line 110 or bit line 115 may be referred to as untargeted memory cells 105.

As shown in FIG. 1, the two memory cells 105 in a memory cell stack 145 may share a common conductive line such as a bit line 115. That is, a bit line 115 may be coupled with the upper memory cell 105-*b* and the lower memory cell 105-*a*. Other configurations may be possible, for example, a third layer (not shown) may share a word line 110 with the upper memory cell 105-*b*.

In some cases, an electrode may couple a memory cell 105 to a word line 110 or a bit line 115. The term electrode may refer to an electrical conductor, and may include a trace, wire, conductive line, conductive layer, or the like that provides a conductive path between elements or components of memory device 100. Thus, the term electrode may refer in some cases to an access line, such as a word line 110 or a bit line 115, as well as in some cases to an additional conductive element employed as an electrical contact between an access line and a memory cell 105. In some embodiments, a memory cell 105 may comprise a chalcogenide material positioned between a first electrode and a second electrode. The first electrode may couple the chalcogenide material to a word line 110, and the second electrode couple the chalcogenide material to a bit line 115. The first electrode and the second electrode may be the same material (e.g., carbon) or different material. In other embodiments, a memory cell 105 may be coupled directly with one or more access lines, and electrodes other than the access lines may be omitted.

Operations such as reading and writing may be performed on memory cells 105 by activating or selecting word line 110 and digit line 115. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

In some architectures, the logic storing device of a cell (e.g., a resistive component in a CBRAM cell, a capacitive component in a FeRAM cell) may be electrically isolated from the digit line by a selection component. The word line 110 may be connected to and may control the selection component. For example, the selection component may be a transistor and the word line 110 may be connected to the gate of the transistor. Alternatively, the selection component may be a variable resistance component, which may comprise chalcogenide material. Activating the word line 110 may result in an electrical connection or closed circuit between the logic storing device of the memory cell 105 and its corresponding digit line 115. The digit line may then be accessed to either read or write the memory cell 105. Upon selecting a memory cell 105, the resulting signal may be used to determine the stored logic state. In some cases, a first logic state may correspond to no current or a negligibly small current through the memory cell 105, whereas a second logic state may correspond to a finite current.

In some cases, a memory cell 105 may include a self-selecting memory cell having two terminals and a separate selection component may be omitted. As such, one terminal of the self-selecting memory cell may be electrically connected to a word line 110 and the other terminal of the self-selecting memory cell may be electrically connected to a digit line 115.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and bit line 115) and the presence of a resulting current through the memory cell 105 may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105.

In some cases, the memory cell 105 (e.g., a self-selecting memory cell) may comprise a chalcogenide material. The chalcogenide material of self-selecting memory cell may remain in an amorphous state during the self-selecting memory cell operation. In some cases, operating the self-selecting memory cell may include applying various shapes of programming pulses to the self-selecting memory cell to determine a particular threshold voltage of the self-selecting memory cell—that is, a threshold voltage of a self-selecting memory cell may be modified by changing a shape of a programming pulse, which may alter a local composition of the chalcogenide material in amorphous state. A particular threshold voltage of the self-selecting memory cell may be determined by applying various shapes of read pulses to the self-selecting memory cell. For example, when an applied voltage of a read pulse exceeds the particular threshold voltage of the self-selecting memory cell, a finite amount of current may flow through the self-selecting memory cell. Similarly, when the applied voltage of a read pulse is less than the particular threshold voltage of the self-selecting memory cell, no appreciable amount of current may flow through the self-selecting memory cell. In some embodiments, sense component 125 may read information stored in a selected memory cell 105 by detecting the current flow or lack thereof through the memory cell 105. In this manner, the memory cell 105 (e.g., a self-selecting memory cell) may store one bit of data based on threshold voltage levels (e.g., two threshold voltage levels) associated with the chalcogenide material, with the threshold voltage levels at which current flows through the memory cell 105 indicative of a logic state stored by the memory cell 105. In some cases, the memory cell 105 may exhibit a certain number of different threshold voltage levels (e.g., three or more threshold voltage levels), thereby storing more than one bit of data.

Sense component 125 may include various transistors or amplifiers in order to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115, and at least one logic value may be stored in the memory cell 105. Column decoder 130 or row decoder 120 may accept data, for example input/output 135, to be written to the memory cells 105.

In some memory architectures, accessing the memory cell 105 may degrade or destroy the stored logic state and re-write or refresh operations may be performed to return the original logic state to memory cell 105. In DRAM, for example, the capacitor may be partially or completely discharged during a sense operation, corrupting the stored logic state, so the logic state may be re-written after a sense operation. Additionally, in some memory architectures, activating a single word line 110 may result in the discharge of all memory cells in the row (e.g., coupled with the word line 110); thus, several or all memory cells 105 in the row may need to be re-written. But in non-volatile memory, such as self-selecting memory, PCM, CBRAM, FeRAM, or NAND memory, accessing the memory cell 105 may not destroy the logic state and, thus, the memory cell 105 may not require re-writing after accessing.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals in order to activate the desired word line 110 and digit line 115. Memory controller 140 may also generate and control various voltages or currents used during the operation of memory device 100. In general, the amplitude, shape, polarity, and/or duration of an applied voltage or current discussed herein may be adjusted or varied and may be different for the various operations discussed in operating the memory device 100. Furthermore, one, multiple, or all memory cells 105 within memory array 102 may be accessed simultaneously; for example, multiple or all cells of memory array 102 may be accessed simultaneously during a reset operation in which all memory cells 105, or a group of memory cells 105, are set to a single logic state.

The fabrication techniques described herein may be used to form aspects of memory device 100, including some aspects simultaneously. For example, the fabrication techniques described herein may be used to form the lower word lines 110 (labeled in FIG. 1 as WL_B1) concurrently with forming the upper word lines 110 (labeled in FIG. 1 as WL_T1), as well as word lines at any number of additional layers (not shown). Both the lower word lines 110 and the upper word lines 110 may be disposed in layers initially comprising a same dielectric material, and a single via pattern may be used for one or more processing steps—e.g., removing portions of the dielectric material and replacing it with conductive material—that concurrently form the lower level word lines 110 and the upper level word lines 110 at their respective layers. Similarly, the fabrication techniques described herein may be used to form the lower memory cells 105 (e.g., memory cell 105-a illustrated in FIG. 1 as solid black circles) concurrently with forming the upper memory cells 105 (e.g., memory cell 105-b illustrated in FIG. 1 as white circles), as well as memory cells 105 at any number of additional decks of memory cells (not shown).

Figure 2:
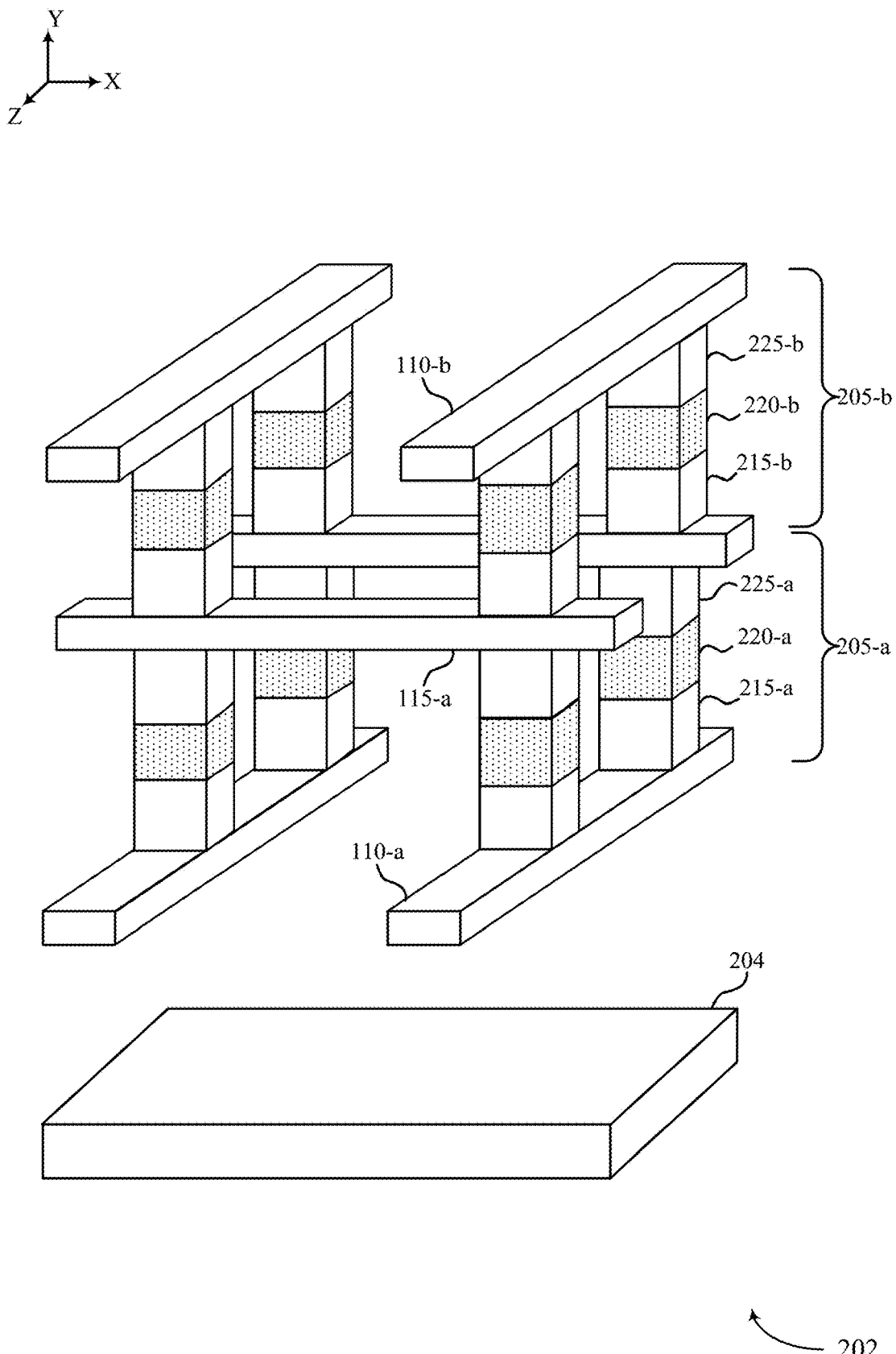
FIG. 2 illustrates an example of a three-dimensional memory array that supports a cross-point memory array and related fabrication techniques in accordance with embodiments of the present disclosure.

FIG. 2 illustrates an example of a 3D memory array 202 that supports a cross-point memory array and related fabrication techniques in accordance with embodiments of the present disclosure. Memory array 202 may be an example of portions of memory array 102 described with reference to FIG. 1. Memory array 202 may include a first array or deck 205-a of memory cells that is positioned above a substrate 204 and a second array or deck 205-b of memory cells on top of the first array or deck 205-a. Memory array 202 may also include word line 110-a and word line 110-b, and bit line 115-a, which may be examples of word lines 110 and a bit line 115, as described with reference to FIG. 1. As in the illustrative example depicted in FIG. 2, memory cells of the first deck 205-a and the second deck 205-b may each include a self-selecting memory cell. In some examples, memory cells of the first deck 205-a and the second deck 205-b may each include another type of memory cell that may be suitable for a cross-point architecture—e.g., a CBRAM cell or an FeRAM cell. Although some elements included in FIG. 2 are labeled with a numeric indicator, other corresponding elements are not labeled, though they are the same or would be understood to be similar, in an effort to increase the visibility and clarity of the depicted features.

In some cases, self-selecting memory cells of the first deck 205-a may each include first electrode 215-a, chalcogenide material 220-a, and second electrode 225-a. In addition, self-selecting memory cells of the second memory deck 205-b may each include first electrode 215-b, chalcogenide material 220-b, and second electrode 225-b. In some embodiments, access lines (e.g., word line 110, bit line 115) may include an electrode layer (e.g., a conformal layer), in lieu of electrodes 215 or 225 and thus may comprise multi-layered access lines. In such embodiments, the electrode layer of the access lines may interface with a memory material (e.g., chalcogenide material 220). In some embodiments, access lines (e.g., word line 110, bit line 115) may directly interface with a memory material (e.g., chalcogenide material 220) without an electrode layer or an electrode in-between.

The self-selecting memory cells of the first deck 205-*a* and second deck 205-*b* may, in some embodiments, have common conductive lines such that corresponding (e.g., vertically aligned in y-direction) self-selecting memory cells of each deck 205-*a* and 205-*b* may share bit lines 115 or word lines 110 as described with reference to FIG. 1. For example, first electrode 215-*b* of the second deck 205-*b* and second electrode 225-*a* of the first deck 205-*a* may both be coupled to bit line 115-*a* such that bit line 115-*a* is shared by vertically aligned and adjacent self-selecting memory cells (in y-direction).

In some embodiments, memory array 202 may include an additional bit line (not shown) such that the first electrode 215-*b* of the second deck 205-*b* may be coupled with the additional bit line and the second electrode 225-*a* of the first deck 205-*a* may be coupled with the bit line 115-*a*. The additional bit line may be electrically isolated from the bit line 115-*a* (e.g., an insulating material may be interposed between the additional bit line and the bit line 115-*a*). As a result, the first deck 205-*a* and the second deck 205-*b* may be separated and may operate independently of each other. In some cases, an access line (e.g., either word line 110 or bit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of memory array 202 may in some cases be referred to as an example of a cross-point architecture, as a memory cell may be formed at a topological cross-point between a word line 110 and a bit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor, which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows two memory decks, other configurations may include any number of decks. In some embodiments, one or more of the memory decks may include self-selecting memory cells that include chalcogenide material 220. In other embodiments, one or more of the memory decks may include FeRAM cells that include a ferroelectric material. In yet another embodiments, one or more of the memory decks may include CBRAM cells that include a metallic oxide or a chalcogenide material. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some embodiment, a chalcogenide material having primarily selenium (Se), arsenic (As), and germanium (Ge) may be referred to as SAG-alloy.

FIGS. 3 through 4 illustrate various aspects of fabrication techniques of the present disclosure. For example, FIGS. 3 through 4 illustrate aspects of creating cavities (e.g., concurrently) at one or more buried target layers of a composite stack, each target layer comprising a target material. Vias may be used to create cavities in the target material at a target buried layer, and cavities may be sized such that adjacent (e.g., contiguous) cavities may overlap and thus may merge to form a channel (e.g., a tunnel) at the target buried layer. The channel may therefore be aligned with the vias—namely, the channel may intersect a vertical axis of each via (e.g., an orthogonal direction with respect to a substrate) used to create the channel. The channel may be filled with a filler material (e.g., a conductive material or a memory material), and in some cases—using similar cavity-etching and channel-creation techniques—a narrower channel within the filler material at the target layer may be created using the same vias. Creating the narrower channel within the filler material may result in an elongated loop (e.g., a band, ring, or racetrack) of filler material surrounding the narrower channel, and the narrower channel may be filled with a second material (e.g., a dielectric or other insulating material). The loop of filler material may subsequently be severed to create discrete segments of the filler material at the target buried layer. These segments may be configured as aspects of a 3D memory array such as the examples of memory array 102 illustrated in FIG. 1 or memory array 202 illustrated in FIG. 2.

For example, the fabrication techniques described herein may facilitate concurrent formation of like structures at different lower layers—e.g., sets of conductive lines (e.g., access lines such as word lines 110 and bit lines 115) or sets of memory material elements configured with a common layout in which each set of conductive lines or set of memory material elements exists in a different lower layer of the stack. As such, the fabrication techniques described herein may facilitate concurrent formation of two or more decks of memory cells, each deck comprising a 3D cross-point structure of access lines (e.g., word lines, bit lines) and memory cells.

Figure 3A:
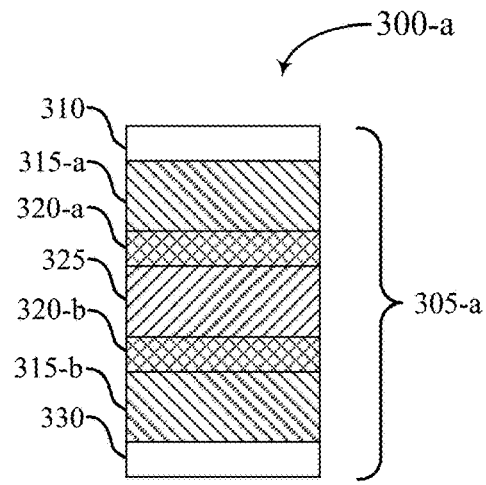
FIGS. 3A-3C illustrate exemplary fabrication techniques that support a cross-point memory array and related fabrication techniques in accordance with embodiments of the present disclosure.
Figure 3B:
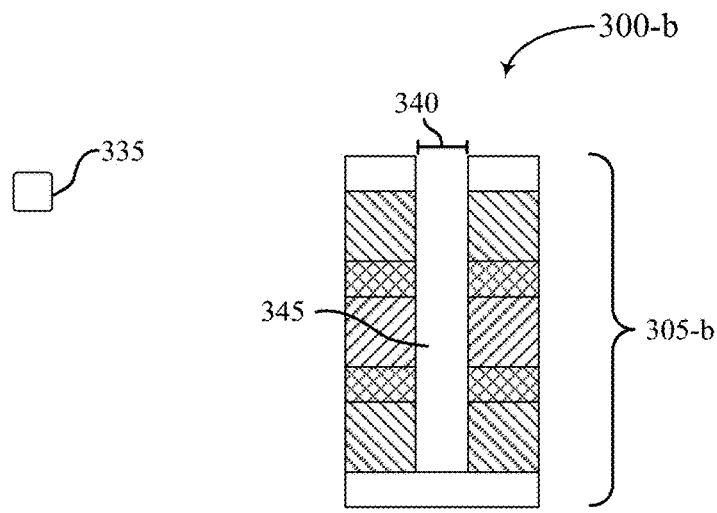
Figure 3C:
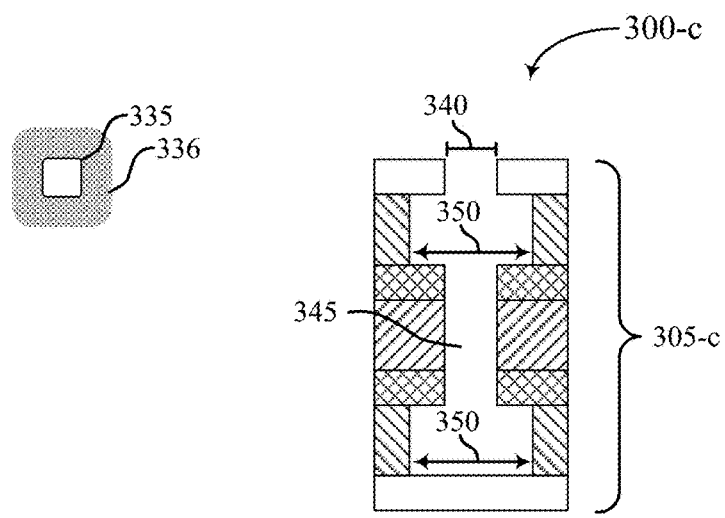

FIGS. 3A-3C illustrate exemplary fabrication techniques in accordance with the present disclosure. In FIG. 3A, processing step 300-*a* is depicted. Processing step 300-*a* may include one or more thin-film deposition or growth steps that form a stack 305-*a*. FIG. 3A illustrates a sideview of the stack 305-*a*, which may be an initial stack of layers prior to the application of further fabrication techniques as described herein. The stack 305-*a* may be formed above a substrate (e.g., substrate 204 described with reference to FIG. 2). The stack 305-*a* may include a number of different layers of various materials, and thus may in some cases be referred to as a composite stack, with the specific materials selected based on a number of factors—e.g., a desired kind of memory technology (e.g., self-selecting memory, FeRAM, CBRAM), a desired number of decks of memory cells (e.g., two or more decks of memory cells), etc. As depicted in the illustrative example of FIG. 3A, the stack 305-*a* may include an initial stack of layers suitable for fabricating two sets of buried lines (e.g., a first set of buried lines at a relatively upper layer that includes word line 110-*b* and a second set of buried lines at a relatively lower layer that includes word line 110-*a* as described with reference to FIG. 2), each set of buried lines at a layer initially comprising a first material. The stack 305-*a* may also include an initial stack of layers suitable for fabricating a single set of buried lines at a layer initially comprising a second material (e.g., a single set of buried lines that includes bit line 115-*a* described with reference to FIG. 2).

In some examples, the stack 305-*a* may include a layer 310, which may be a top layer of the stack 305-*a*. In some embodiments, the layer 310 includes a dielectric material. In some embodiments, the layer 310 includes a hardmask material such that the layer 310 may be referred to as a hardmask layer. A pattern of vias may be formed in the layer 310 as a result of, for example, a photolithography step.

Figure 5:
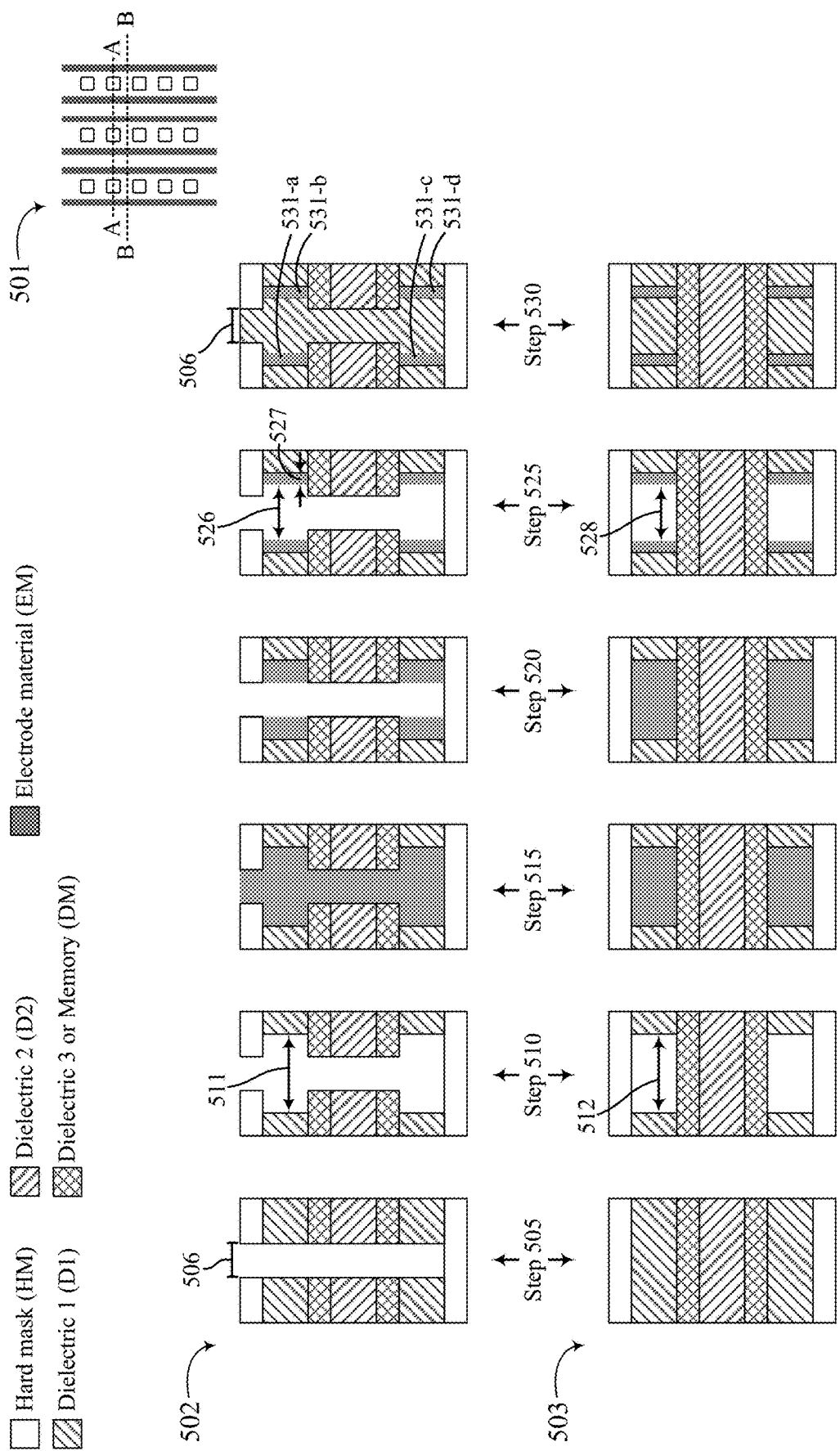
FIGS. 5-7 illustrate example methods of forming three-dimensional cross-point memory array structures that support a cross-point memory array and related fabrication techniques in accordance with embodiments of the present disclosure.

The stack 305-*a* may also include layers 315. In the illustrative example of FIG. 3A, the stack 305-*a* includes two layers 315, namely layer 315-*a* and layer 315-*b*. In some embodiments, the layers 315 may each include a first dielectric material. As illustrated in FIG. 5, each layer 315 may ultimately be modified to include a set of first conductive lines, each first conductive line comprising an electrode material. Hence, the layers 315 may be referred to as first electrode layers. In some cases, first conductive lines may be referred to as buried conductive lines because the first conductive lines are positioned below a surface layer (e.g., below layer 310). First conductive lines may extend in a first direction. Electrodes at two or more first electrode layers— that is, electrodes formed within two or more layers each comprising the first dielectric material—may be formed concurrently in accordance with the fabrication techniques described herein.

The stack 305-*a* may also include layers 320. In the illustrative example of FIG. 3A, the stack 305-*a* includes two layers 320, namely layer 320-*a* and layer 320-*b*, but any number of layers 320 is possible. In some embodiments, each layer 320 may comprise a memory material (e.g., a chalcogenide material 220) formed as a part of the stack 305-*a*. In other embodiments, each layer 320 may comprise a placeholder material, which may later be partially removed and replaced by a memory material (e.g., a chalcogenide material 220 described with reference to FIG. 2). As illustrated in FIGS. 9 through 12, each layer 320 may ultimately include memory cells formed concurrently in accordance with the fabrication techniques described herein. Hence, whether initially comprising a memory material or a placeholder material that is to later be replaced by a memory material, a layer 320 may be referred to as a memory layer.

The stack 305-*a* may also include a layer 325. In the illustrative example of FIG. 3A, the stack 305-*a* includes a single layer 325, but any number of layers 325 is possible. In some embodiments, each layer 325 may include a second dielectric material. As illustrated in FIG. 5, the layer 325 may ultimately be modified to include a set of second conductive lines comprising an electrode material. Hence, each layer 325 may be referred to as a second electrode layer. In some cases, second conductive lines may be referred to as buried conductive lines because the second conductive lines are positioned below a surface layer (e.g., below layer 310). Second conductive lines may extend in a second direction, which may be different than the first direction. In some embodiments, the second direction may be substantially perpendicular to the first direction in which first conductive lines extend. Electrodes at two or more second electrode layers—that is, electrodes formed within two or more layers each comprising the second dielectric material—may be formed concurrently in accordance with the fabrication techniques described herein.

The stack 305-*a* may include a layer 330. In some cases, the layer 330 may include an etch-stop material to withstand various etch processes described herein. The layer 330 may include the same hardmask material as the layer 310 in some cases, or may include a different material. In some cases, the layer 330 may provide a buffer layer with respect to circuits or other structures formed in a substrate (e.g., substrate 204 described with reference to FIG. 2) or other layers (not shown), which may be below layer 330. In some cases, the layer 330 may provide a buffer layer with respect to one or more decks of memory cells fabricated in earlier processing steps.

In FIG. 3B, processing step 300-*b* is depicted. FIG. 3B illustrates a via 335 (e.g., a top-down view of via 335) and a sideview of a stack 305-*b*. The stack 305-*b* may correspond to the stack 305-*a* when processing step 300-*b* is complete. Processing step 300-*b* may include a photolithography step that transfers a shape of via 335 onto the stack 305-*a*. In some examples, the photolithography step may include forming a photoresist layer (not shown) having a shape of via 335 (e.g., defined by lack of the photoresist material inside of the via 335) on top of the layer 310. In some examples, an etch processing step may follow the photolithography step to transfer the shape of via 335 onto layer 310 such that the shape of via 335 established within layer 310 may be repeatedly used as an access via during subsequent processing steps—namely, layer 310 including the shape of via 335 may function as a hardmask layer providing an access via in the shape of via 335 for the subsequent processing steps.

Processing step 300-*b* may further include an anisotropic etch step, which may remove materials from the stack 305-*a* based on the shape of via 335. In some cases, processing step 300-*b* may include a single anisotropic etch step that etches through hardmask layer 310 and additional lower layers based on the shape of via 335 in a photoresist layer above hardmask 310. In other cases, via 335 may exist in hardmask layer 310, and a subsequent anisotropic etch step may etch through additional lower layers based on the shape of via 335 in hardmask layer 310.

An anisotropic etch step may remove a target material in one direction (e.g., an orthogonal direction with respect to a substrate) by applying an etchant (e.g., a mixture of one or more chemical elements) to the target material. Also, the etchant may exhibit a selectivity (e.g., a chemical selectivity) directed to remove only the target material (e.g., layer 310) while preserving other materials (e.g., photoresist) exposed to the etchant. An anisotropic etch step may use one or more etchants during a single anisotropic etch step when removing one or more layers of materials. In some cases, an anisotropic etch step may use an etchant exhibiting a selectivity targeted to remove a group of materials (e.g., oxides and nitrides) while preserving other groups of materials (e.g., metals) exposed to the etchant.

During processing step 300-*b*, the anisotropic etch step may produce a hole (e.g., a via hole 345) penetrating through the stack 305-*a* in which the shape and width 340 (e.g., diameter) of the via hole 345 substantially corresponds to the width of the via 335. As an example depicted in FIG. 3B, the anisotropic etch step in processing step 300-*b* may include four different kinds of etchants—e.g., different etchants for layer 310, layers 315, layers 320, and layer 325, respectively. The anisotropic etch step may terminate at layer 330. In some examples, the width 340 is the same (substantially same) at each layer of the stack 305-*b*.

In FIG. 3C, processing step 300-*c* is depicted. FIG. 3C illustrates a top-down view of cavities 336 and a sideview of a stack 305-*c*. The stack 305-*c* may correspond to the stack 305-*b* when processing step 300-*c* is complete. The cavities 336 may represent a top-down view of one or more cavities formed in one or more buried layers (e.g., layer 315-a and layer 315-b) of the stack 305-c. Each cavity 336 may share a common center with the via 335—e.g., the via 335 and each cavity 336 may be concentric about a vertical axis of the via 335 (e.g., an orthogonal direction with respect to a substrate) as illustrated in FIG. 3C. The via hole 345 may expose a target material (e.g., the first dielectric material of layers 315) within one or more target layers (e.g., layers 315-a and 315-b), and processing step 300-c may include an isotropic etch step that removes target material from each target layer to produce a cavity 336 within each target layer and formed around the via hole 345 (e.g., the via hole 345 penetrating the stack 305-b).

An isotropic etch step may remove a target material in all directions. An isotropic etch step may apply an etchant (e.g., a mixture of one or more chemical elements) exhibiting a selectivity (e.g., a chemical selectivity) directed to remove only a target material while preserving other materials exposed to the etchant. An isotropic etch step may employ different etchant(s) during a single isotropic etch step when removing one or more layers of materials. In some cases, an isotropic etchant (e.g., an etchant used in an isotropic etch step) may be chemically selective between a first dielectric material and at least one other material in the stack.

As in the example depicted in FIG. 3C, an isotropic etch step may concurrently remove a portion of the first dielectric material from each layer 315 (e.g., from both layer 315-a and layer 315-b) while preserving (or substantially preserving) other materials (e.g., at other layers) in the stack 305-b exposed to the etchant—e.g., based at least in part on the etchant's selectivity targeted to remove the first dielectric material of layers 315. As a result of the isotropic etch step, the outer width (e.g., width 350) of each cavity 336 may be greater than the width (e.g., width 340) of via hole 345. As such, an outer width of each cavity 336 (e.g., width 350) may be determined by the width of via 335 (e.g., the width of via hole 345) and an amount of target material removed from each target layer during processing step 300-c. Additionally, each cavity 336 may be referred to as a buried cavity 336 because it may be formed in one or more buried layers—e.g., in one or more layers 315 comprising a first dielectric material and positioned below the layer 310 in the stack 305-c.

It is to be understood that any number of buried cavities 336 may be formed, and in some cases may be concurrently formed, within a stack of layers using processing steps 300-a through 300-c. A number of distinct target layers—that is, a number of distinct layers comprising the target material (e.g., the first dielectric material initially included in layers 315) and separated by other layers—may determine the number of buried cavities 336 concurrently created within the stack 305-c using the isotropic etch step based on via 335. The via hole 345 created using via 335 and penetrating through the stack may provide access (e.g., a path) for etchants during the isotropic etch step such that the isotropic etch step may remove a part of each buried target layer through the via hole 345 so as to create buried cavities 336 at each target layer. Hence, the via 335 may be referred to as an access via in some cases.

Figure 4A:
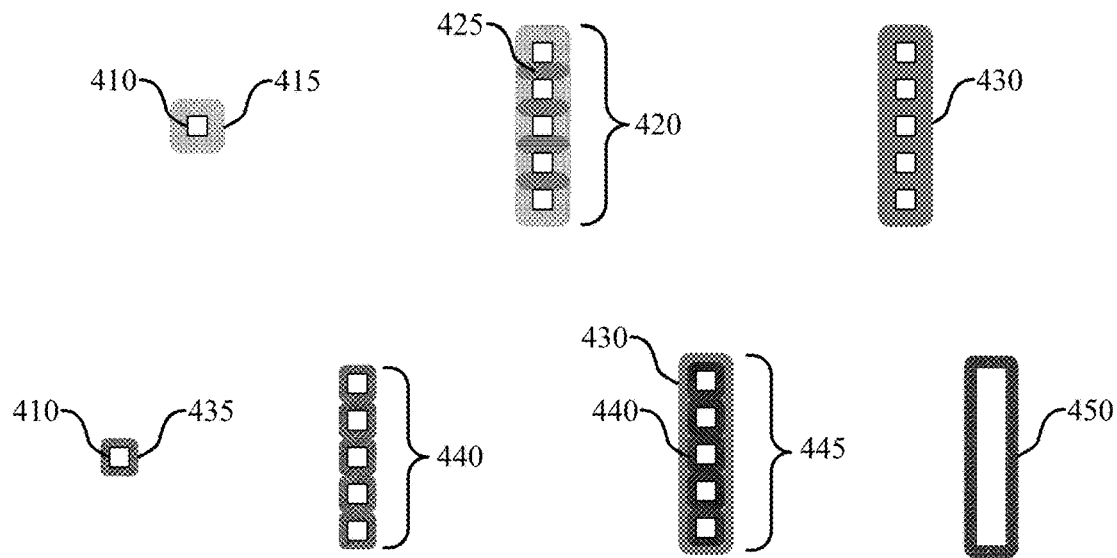
FIGS. 4A-4B illustrate exemplary via patterns and structures that support a cross-point memory array and related fabrication techniques in accordance with embodiments of the present disclosure.
Figure 4B:
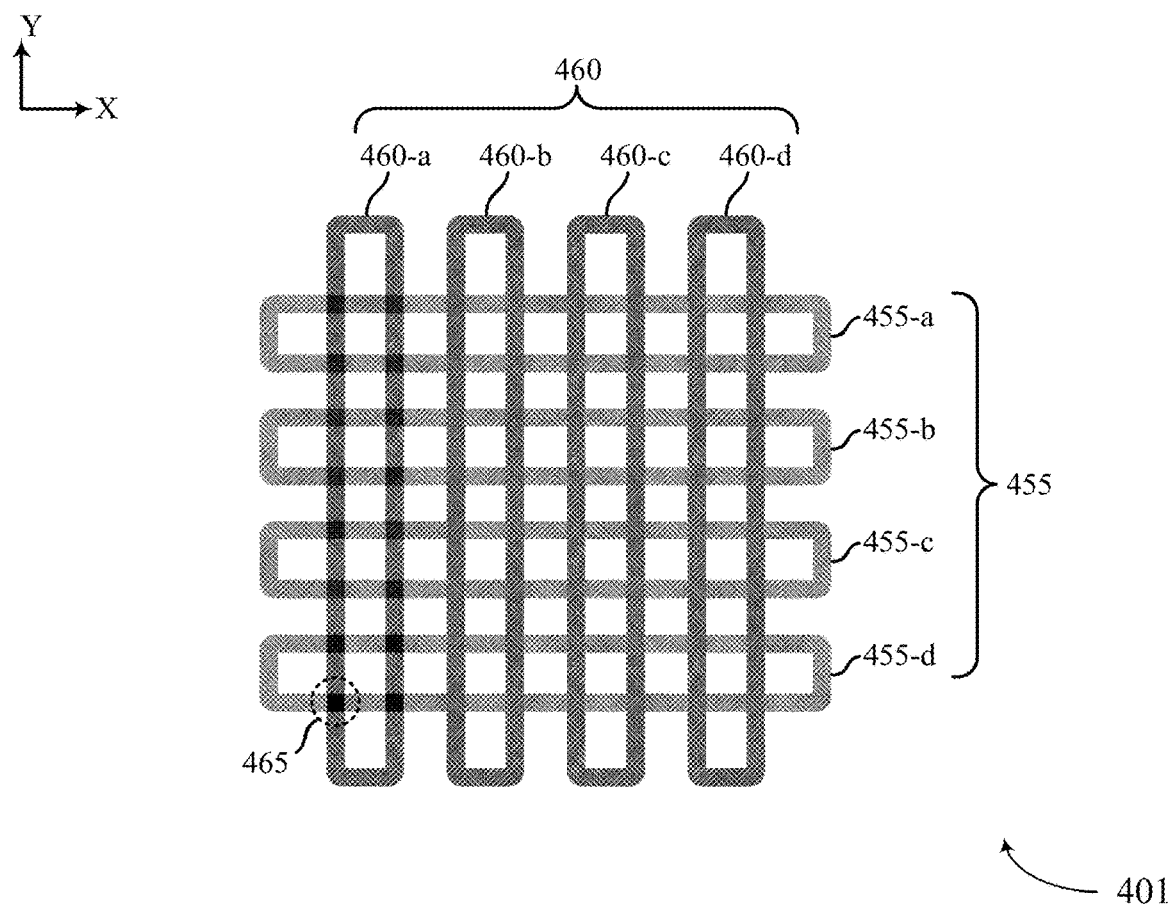

FIGS. 4A-4B illustrate exemplary via patterns and structures that support a cross-point memory array and related fabrication techniques in accordance with the present disclosure. FIG. 4A illustrates a via 410 and an associated first cavity 415. Via 410 may be an example of via 335 described with reference to FIG. 3. First cavity 415 may be an example of cavity 336 described with reference to FIG. 3. First cavity 415 may represent a cavity (e.g., a buried cavity) concentric about a vertical axis of via 410 (e.g., a vertical axis with respect to a substrate) and formed in a target material at a buried layer of a stack (e.g., stack 305).

FIG. 4A also illustrates channel 420, which may be formed at the buried layer using multiple vias 410 (e.g., five vias 410, as illustrated in FIG. 4A) arranged in a linear configuration, as an example. A first cavity 415 corresponding to each via 410 may be formed in the target material at the buried layer. The distance between vias 410 and the amount of target material removed when forming each first cavity 415 may be configured such that adjacent, or contiguous, first cavities 415 may merge (e.g., may overlap as represented by oval shapes 425 within channel 420) to form channel 420. Thus, channel 420 may be aligned with the set of vias 410 corresponding to the first cavities 415 that merge to form channel 420—e.g., channel 420 may intersect a vertical axis of each via 410 (e.g., a vertical axis with respect to a substrate). Channel 420 may have a width same as the width of each first cavity 415 and a length determined by the number of merged first cavities 415 (e.g., the number of vias 410 arranged in a linear fashion, which may be any number).

FIG. 4A also illustrates filled channel 430. Filled channel 430 may correspond to channel 420 after completing at least two subsequent processing steps—e.g., a first processing step of depositing a filler material in the channel 420 and associated via holes, followed by a second processing step of removing the filler material from the associated via holes using an etch process (e.g., an anisotropic etch step such as processing step 300-b described with reference to FIG. 3). In other words, filled channel 430 may include a filler material in the channel 420. Although channel 420 and filled channel 430 are illustrated as having a linear configuration corresponding to the linear configuration of the associated set of vias 410, it is to be understood that channel 420 and filled channel 430 may take any arbitrary shape (e.g., L-shape, X-shape, T-shape, S-shape) corresponding to the spatial configuration of the associated set of vias 410. Thus, a set of vias 410 may be positioned to define an outline of any intended shape, with the spacing between adjacent vias configured such that contiguous cavities at the same target layer, each cavity corresponding to a via 410, merge to form a channel of any intended shape at the target layer. Further, in some embodiments, multiple channels 420 and filled channels 430 may be conjoined to form various shapes of buried lines or interconnects (e.g., when the set of filled channels 430 includes a conductive material).

FIG. 4A also illustrates via 410 and associated second cavity 435. Second cavity 435 may be an example of a cavity 336 described with reference to FIG. 3. The width of second cavity 435 may be less than the width of first cavity 415. As described above, a size of a cavity associated with a via 410 may vary depending on the width of the via 410 and an amount of target material removed during an isotropic etch step. Second cavity 435 may represent a cavity (e.g., a buried cavity) concentric about a vertical axis of via 410 (e.g., a vertical axis with respect to a substrate) and formed in a target material at a buried layer of a stack (e.g., in the filler material within filled channel 430).

FIG. 4A also illustrates channel 440, which may be formed at the buried layer using multiple vias 410 (e.g., five vias 410, as illustrated in FIG. 4A) arranged in a linear configuration, as an example. A second cavity 435 corresponding to each via 410 may be formed in a target material at the buried layer, which may be the filler material deposited to form filled channel 430. The distance between vias 410 and the amount of target material removed when forming each second cavity 435 may be configured such that adjacent, or contiguous, second cavities 435 may merge to form channel 440. Thus, channel 440 may be aligned with the set of vias 410 corresponding to the second cavities 435 that merge to form channel 440—e.g., channel 440 may intersect a vertical axis of each via 410 (e.g., a vertical axis with respect to a substrate). Channel 440 may have a width same as the width of each second cavity 435 and a length determined by the number of merged second cavities 435 (e.g., the number of vias 410 arranged in a linear fashion, which may be any number).

FIG. 4A also illustrates an intermediate pattern 445, which may correspond to a channel 440 formed within filled channel 430. The intermediate pattern 445 may illustrate a result of one or more processing steps in which a portion of the filler material present in a filled channel 430 is removed to form second cavities 435 and thus channel 440 within the filled channel 430. Channel 440 may be formed using the same set of vias 410 used to form channel 420 and filled channel 430, but may have a narrower width (due to the width of the merged second cavities 435 being less than the width of the merged first cavities 415), and with the filler material within filled channel 430 serving as the target material during the formation of channel 440. As the width of channel 440 may be less than width of the filled channel 430, a portion of the filler material within the filled channel 430 may remain along the outer boundary of filled channel 430, surrounding channel 440. Thus, following the formation of channel 440, a loop of filler material from filled channel 430 may remain at the target layer; the loop may be elongated with a length larger than width and may also be referred to as a racetrack or a band.

FIG. 4A also illustrates loop 450, which may correspond to channel 440 being filled with a dielectric material using the corresponding set of vias 410. Thus, loop 450 may comprise a loop of the filler material with which channel 420 was filled (that is, the filler material used to form filled channel 430) surrounding the dielectric material with which channel 440 was filled. In some cases, the dielectric material surrounded by loop 450 may be the same material as the target material comprising the target layer at which channel 420 was formed (e.g., a dielectric material 315 or 325 described with reference to FIG. 3), and the filler material may be a conductive material, and thus loop 450 may be loop of conductive material. A loop 450 of conductive material may be severed into multiple discrete segments, which may function as electrodes (e.g., access lines). A loop 450 of memory material may be severed into multiple discrete segments, which may function as one or more memory cells (e.g., each discrete segment of memory material, which may be referred to as a memory material element, may be configured to comprise one or more memory cells 105).

Although FIG. 4A illustrates the successive formation of five first cavities 415 (which merge to form channel 420), filled channel 430, five second cavities 435 (which merge to from channel 440), and thus loop 450 using five vias 410, it is to be understood that similar techniques may be applied using any number of vias 410. Similarly, although FIG. 4A illustrates the successive formation of five first cavities 415 (which merge to form channel 420), filled channel 430, five second cavities 435 (which merge to form channel 440), and thus loop 450 at a single target layer of a stack, it is to be understood that the stack may comprise multiple distinct target layers, each comprising the same target material, and that the techniques described with reference to FIG. 4A may thus result in multiple loops 450, one at each target layer in the stack.

FIG. 4B illustrates a diagram 401, which illustrates a top-down view of a first plurality of loops 455 (e.g., loops 455-a through 455-d) extending in a first direction (e.g., as drawn on the page, x-direction) and a second plurality of loops 460 (e.g., loops 460-a through 460-d) extending in a second direction (e.g., as drawn on the page, y-direction). The first plurality of loops 455 may be formed at one or more first layers (e.g., layers 315) of a stack (e.g., stack 305), and the second plurality of loops 460 may be formed at one or more second layers (e.g., layer 325) of a stack (e.g., stack 305).

Each loop of the first plurality of loops 455 and of the second plurality of loops 460 of FIG. 4B may be an example of a loop 450 of FIG. 4A. Hence, each of horizontal loops (e.g., loops 455-a through 455-d extending in x-direction) may have been formed using a set of vias (not shown) arranged in a row in the horizontal direction (x-direction). In addition, each of vertical loops (e.g., loops 460-a through 460-d extending in y-direction) may have been formed using a set of vias (not shown) arranged in a row in the vertical direction (y-direction). The diagram 401 illustrates the first plurality of loops 455 and the second plurality of loops 460 in a substantially perpendicular arrangement—that is, with the first plurality of loops 455 substantially perpendicular to the second plurality of loops 460. It is to be understood that the first plurality of loops and the second plurality of loops may be in any angular arrangement.

In some cases, each loop of the first plurality of loops 455 and the second plurality of loops 460 may be of a conductive material (e.g., electrode material as described with reference to FIGS. 1 and 2). The ends (e.g., the shorter sides) of each loop 455, 460 may be removed or otherwise severed from the sides (e.g., the longer sides) of the loop 455, 460 in a subsequent processing step, and the remaining portions of each loop 455, 460 (e.g., the longer sides) may function as access lines for a memory device (e.g., as word lines 110 and bit lines 115 as described with reference to FIGS. 1 and 2). In some embodiments, the first plurality of loops 455 may exist in one or more first layers (e.g., layers 315 as described with reference to FIG. 3) and the second plurality of loops 460 may exist in one or more second layers (e.g., layers 325 as described with reference to FIG. 3). As such, the first plurality of loops 455 and the second plurality of loops 460 may form a matrix of access lines (e.g., a grid structure of access lines) in a 3D cross-point configuration as described with reference to FIGS. 1 and 2. Each topological cross-point of access lines (e.g., a cross-point 465 formed between loop 455-d and loop 460-a) may correspond to a memory cell (e.g., a memory cell 105 as described with reference to FIG. 1), and the memory cell may be interposed between the intersecting access lines. Thus, the exemplary diagram 401 may support 64 memory cells in a single deck of memory cells. It is to be understood that any number of decks of memory cells, each comprising any number of access lines, may be disposed on top of one another and formed simultaneously using a single pattern of vias.

FIGS. 5 through 8 illustrate the construction of an exemplary three-dimensional structure of access lines (e.g., a grid structure of access lines) in accordance with fabrication techniques of the present disclosure. As described above, the fabrication techniques described herein may use a pattern of vias, and FIGS. 5 through 8 illustrate methods of using the pattern of vias to facilitate concurrent construction of a three-dimensional structure of access lines (e.g., a grid structure of access lines) such that two or more decks of a 3D memory array may be formed at the same time.

FIG. 5 illustrates example methods of forming a 3D cross-point memory array structure that may include two or more decks of memory cells in accordance with the present disclosure. FIG. 5, as an illustrative example of fabrication techniques described herein, may show the concurrent formation of two sets of access lines—namely, an upper deck may include one set of word lines 531-*a* and 531-*b*, and a lower deck may include another set of word lines 531-*c* and 531-*d*. Word lines 531 may be examples of two sets of word lines 110 (e.g., a set of word lines WL_T1 through WL_TM and another set of word lines WL_B1 through WL_BM) for two decks of memory array 102 as described with reference to FIG. 1 or a pair of word lines 110-*a* for first deck of memory cells 205-*a* and a pair of word lines 110-*b* for second deck of memory cells 205-*b* as described with reference to FIG. 2.

The stack of layers in FIG. 5 may correspond to stack 305 as described with reference to FIG. 3. For example, a hardmask (HM) layer may correspond to layer 310 (e.g., a top layer of stack 305), a dielectric 1 (D1) layer may correspond to layer 315-*a* and layer 315-*b*, a dielectric 2 (D2) layer may correspond to layer 325, and a placeholder dielectric or a memory material (DM) layer may correspond to layer 320-*a* and layer 320-*b*, respectively. The DM layer may include a memory material (e.g., a memory material formed as a part of the initial stack 305-*a*) or a placeholder material within which memory material may later be deposited. The placeholder material may be a third dielectric material in some cases. In some cases, a DM layer may be referred to as a memory layer or a placeholder layer. In some cases, a D1 layer may be referred to as a first dielectric layer, and a D2 layer may be referred to as a second dielectric layer.

FIG. 5 also includes diagrams 501, 502, and 503. Diagram 501, as an illustrative example, may depict a top view of a stack that includes three rows of vias (e.g., vias 335 or vias 410 as described with reference to FIG. 3 or FIG. 4) and six access lines (e.g., word lines) formed using the rows of vias, with each row of vias used to form one loop (e.g., loop 455-*a* described with reference to FIG. 4) (loop ends not shown in diagram 501) and thus two access lines (e.g., word lines 110 or bit lines 115 as described with reference to FIGS. 1 and 2) between which the row of vias is interposed. Diagram 502 illustrates cross-sectional side views of the stack corresponding to the center of a via of diagram 501, as denoted by reference line A-A in diagram 501, at various stages of processing (e.g., processing steps 505 through 530). Diagram 503 illustrates cross-sectional side views of the stack corresponding to a space between vias of diagram 501, as denoted by reference line B-B, at various stages of processing (e.g., processing steps 505 through 530).

At processing step 505, a photolithography step (e.g., photolithography step described with reference to FIG. 3) may transfer the pattern of vias illustrated in diagram 501 onto the stack (e.g., stack 305). In some cases, a plurality of holes (e.g., holes associated with the pattern of vias illustrated in diagram 501) that each have a first width (e.g., width 506) may be formed at a top layer (e.g., HM layer) of a stack. The first width (e.g., width 506) may correspond to a width of via 335 or 410 as illustrated with reference to FIGS. 3 and 4. Subsequently, an anisotropic etch step may remove some materials from the stack creating via holes that penetrate through the stack. Diagram 502 at processing step 505 illustrates one of the vias and a corresponding via hole that penetrates the stack and exposes buried layers of the stack to subsequent processing steps. Diagram 503 at processing step 505 may illustrate that, between vias, the initial stack (e.g., stack 305) may remain unchanged during processing step 505. Processing step 505 may be an example of processing step 300-*b* as described with reference to FIG. 3.

At processing step 510, an isotropic etch step may selectively remove some portion of the dielectric material at each D1 layer in the stack (e.g., layer 315-*a* and layer 315-*b*) that is exposed to an etchant of the isotropic etch. The dielectric material at each D1 layer may be referred to as a first dielectric material. The etchant of isotropic etch at processing step 510 may exhibit a selectivity with respect to other materials of the stack (e.g., materials at other layers of the stack). Namely, the etchant of the isotropic etch at processing step 510 may remove some portion of the first dielectric material at each D1 layer while preserving (or substantially preserving) other materials (e.g., materials at other layers, such as the DM layer, D2 layer, or HM layer of the stack). Selective removal of a portion of the first dielectric material from each D1 layer (e.g., layer 315-*a* and layer 315-*b*) may create a cavity (e.g., cavity 336 or first cavity 415 described with reference to FIG. 3 and FIG. 4) at each D1 layer. As the via hole penetrating the stack may expose sidewalls of both D1 layers (e.g., 315-*a* and layer 315-*b*), the isotropic etch may concurrently create cavities at each D1 layer (e.g., layer 315-*a* and layer 315-*b*).

Diagram 502 illustrates that processing step 510 concurrently creates cavities at both D1 layers (e.g., cavities are concurrently formed at both layer 315-*a* and layer 315-*b*) while the width of the via hole at other layers remains intact. Width 511 may represent a final width of the cavities formed in both D1 layers. Additionally, diagram 503 at processing step 510 illustrates that cavities formed at the same layer using adjacent vias may merge, due to the isotropic nature of isotropic etch step expanding the size of each cavity in all directions, forming a channel (e.g., channel 420 described with reference to FIG. 4) within the first dielectric material at both D1 layers (e.g., layer 315-*a* and layer 315-*b*). The width of the channel (e.g., width 512) at reference line B-B as depicted in diagram 503 at processing step 510 may relate to the overlap regions 425 described with reference to FIG. 4. Width 512 may be approximately same as width 511 in some cases. In other cases, width 512 may be less than width 511.

At processing step 515, channels and associated via holes may be filled with an electrode material, which may be a conductive material. In some cases, excess electrode material may be formed on top of the stack (e.g., on top of HM layer (e.g., layer 310)) and may be removed by an etch-back process or chemical-mechanical polishing process. As used herein, via holes filled with a material (e.g., a conductive material) may be referred as holes after having been filled with the material. Diagram 503 at processing step 515 illustrates that the electrode material may flow into the portions of channels between vias and thus concurrently fill each channel created at processing step 510.

At processing step 520, an anisotropic etch step may use the vias to remove a portion of the electrode material, creating new via holes corresponding to the vias. The anisotropic etch step may use the same via pattern of the hardmask layer as processing step 505 (e.g., the via pattern depicted in diagram 501) and create via holes that expose, at each D1 layer, a sidewall of the electrode material deposited at processing step 515 for subsequent processing. At the processing step 520, a top-down view of a portion of diagram 501 depicting a single row of vias may correspond to a top-down view of filled channel 430 as described with reference to FIG. 4.

At processing step 525, an isotropic etch step may selectively remove some portion of the electrode material from each D1 layer—e.g., some portion of the electrode material deposited at processing step 515 and thus filling the channel created at each D1 layer (e.g., layer 315-*a* and layer 315-*b*) at processing step 510. The etchant of isotropic etch at processing step 525 may exhibit a selectivity with respect to other materials (e.g., materials at other layers of the stack.) Namely, the etchant of isotropic etch at processing step 525 may remove the electrode material while preserving (or substantially preserving) other materials (e.g., materials at other layers, such as the DM layer, D2 layer, or HM layer of the stack). Selective removal of the electrode material from the cavities at D1 layers (e.g., layer 315-*a* and layer 315-*b*) may leave a portion of the electrode material in the channel as illustrated in diagram 502 and diagram 503 at processing step 525, and the remaining portion of the electrode material may form a loop 450 as described in reference to FIG. 4. In other words, width 526 may be less than width 511. In some cases, a width (e.g., width 527) of the remaining portion of the electrode material (e.g., a width of access line comprising the electrode material) may be smaller than a minimum feature size of a given technology generation, such as a minimum feature size determined by a minimum width of a line (or a minimum space between lines) that may be defined by a photomasking step.

Diagram 503 illustrates that processing step 525 concurrently creates cavities at both D1 layers (e.g., cavities are concurrently formed at both layer 315-*a* and layer 315-*b* by selectively removing some portion of the electrode material formed at processing step 515) while the width of the via hole at other layers remains intact (not shown in diagram 503). Width 526 may represent a final size of the cavities formed in both D1 layers. Additionally, diagram 503 at processing step 525 illustrates that cavities formed at the same layer using adjacent vias may merge (e.g., adjoin), due to the isotropic nature of isotropic etch step expanding the size of each cavity in all directions, forming a channel (e.g., channel 440 described with reference to FIG. 4) within the electrode material at both D1 layers (e.g., layer 315-*a* and layer 315-*b*). The width of the channel (e.g., width 528) at reference line B-B as depicted in diagram 503 at processing step 525 may relate to the width of channel 440 described with reference to FIG. 4. Width 528 may be approximately same as width 526 in some cases. In other cases, width 528 may be less than width 526.

At processing step 530, the channels at each D1 layer and associated via holes may be filled with a dielectric material. In some cases, the dielectric material may be the same as the first dielectric material at each D1 layer. In other cases, the dielectric material may be different from the first dielectric material. As used herein, via holes filled with a material (e.g., a dielectric material) may be referred to as holes after having been filled with the material. Diagrams 502 and 503 at processing step 530 may illustrate that two loops 450 of electrode material have been concurrently formed using the same row of vias, a first loop at a the upper D1 layer (e.g., layer 315-*a*) and a second loop at the lower D1 layer (e.g., layer 315-*b*). It is to be understood that, in other examples, the stack may include any number of D1 layers, with a loop 450 of electrode material concurrently formed at each D1 layer using the processing steps described in reference to FIG. 5. After processing step 530, a top-down view of a portion of diagram 501 depicting a single row of vias may correspond to a top-down view of a portion of the loop 455-*a* described with reference to FIG. 4.

In some cases, at the completion of processing step 530, a first electrode layer (e.g., layer 315 or D1 layer as described with reference to FIG. 3 or 5) may include a first electrode (e.g., electrode 531-*a*), a second electrode (e.g., electrode 531-*b*), and a dielectric channel (e.g., a dielectric channel that may be formed by filling the channel associated with width 526 with a dielectric material) that separates the first electrode and the second electrode by a first distance (e.g., width 526). The first distance (e.g., width 526) may be greater than the first width (e.g., width 506). Further, the dielectric channel may be aligned with the plurality of holes formed at the top layer (e.g., HM layer) of the stack, one of which is depicted at HM layer having the first width (e.g., width 506). In some cases, the first electrode layer may include an immediately neighboring electrode (not shown) next to the second electrode where the second electrode separates the first electrode from the immediately neighboring electrode and the second electrode is nearer the immediately neighboring electrode than the first electrode. For example, as shown in diagram 501, two electrodes formed from a single loop (e.g., with a single row of vias interposed between them) may be separated by a different (e.g., greater) distance than the distance between adjacent loops and thus the distance between two electrodes formed from different loops.

Figure 6:
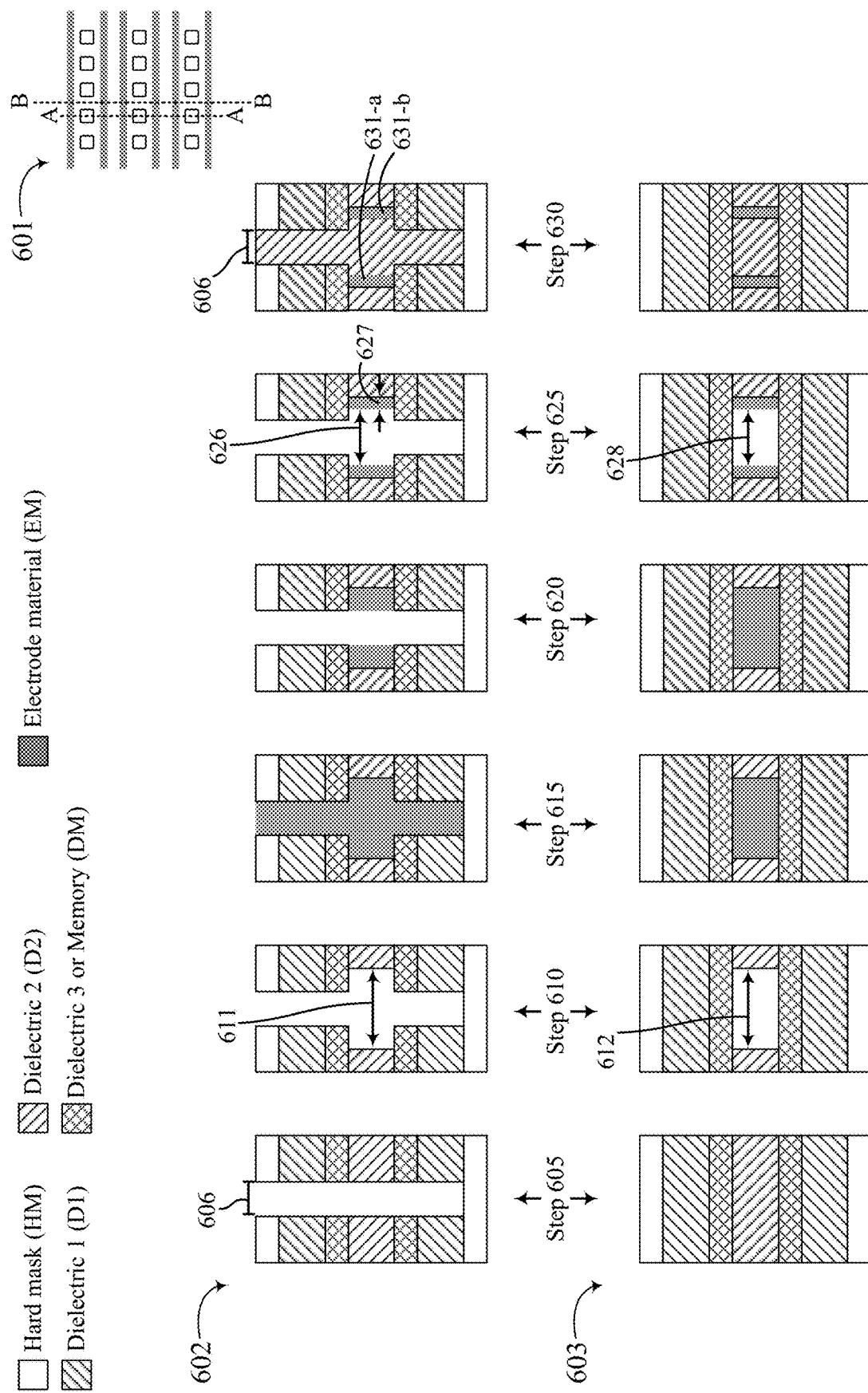

FIG. 6 illustrates example methods of forming a 3D cross-point memory array structure that may include two or more decks of memory cells in accordance with the present disclosure. FIG. 6, as an illustrative example of fabrication techniques described herein, may show the formation of one set of access lines positioned in-between two decks of memory cells—namely, an upper deck and a lower deck may share one set of bit lines 631-*a* and 631-*b*. Bit lines 631 may be examples of bit lines 115 common for two decks of memory array 102 as described with reference to FIG. 1 or a pair of bit lines 115-*a*, which is common for first deck of memory cells 205-*a* and second deck of memory cells 205-*b* as described with reference to FIG. 2. The stack of layers in FIG. 6 may correspond to the stack described with reference to FIG. 5 (e.g., stack 305 described with reference to FIG. 3).

FIG. 6 also includes diagrams 601, 602, and 603. Diagram 601, as an illustrative example, may depict a top view of a stack that includes three rows of vias (e.g., vias 335 or vias 410 as described with reference to FIG. 3 or FIG. 4) and six access lines (e.g., bit lines) formed using the rows of vias, with each row of vias used to form one loop (e.g., loop 460-*a* described with reference to FIG. 4) (loop ends not shown in diagram 601) and thus two access lines (e.g., word lines 110 or bit lines 115 as described with reference to FIGS. 1 and 2) between which the row of vias is interposed. Diagram 602 illustrates cross-sectional side views of the stack corresponding to the center of a via of diagram 601, as denoted by reference line A-A in diagram 601, at various stages of processing (e.g., processing steps 605 through 630). Diagram 603 illustrates cross-sectional side views of the stack corresponding to a space between vias of diagram 601, as denoted by reference line B-B, at various stages of processing (e.g., processing steps 605 through 630).

At processing step 605, a photolithography step (e.g., photolithography step described with reference to FIG. 3) may transfer the pattern of vias illustrated in diagram 601 onto the stack (e.g., stack 305). In some cases, a plurality of second holes (e.g., holes associated with the pattern of vias illustrated in diagram 601) that each have a second width (e.g., width 606) may be formed at a top layer (e.g., HM layer) of a stack. The second width (e.g., width 606) may correspond to a width of via 335 or 410 as illustrated with reference to FIGS. 3 and 4. In some cases, a subset of vias in diagram 501 and diagram 601 may be common as later illustrated in FIG. 8. Subsequently, an anisotropic etch step may remove some materials from the stack creating via holes that penetrate the stack. Diagram 602 at processing step 605 illustrates one of the vias and a corresponding via hole that penetrates the stack and exposes buried layers of the stack to subsequent processing steps. Diagram 603 at processing step 605 may illustrate that, between vias, the initial stack (e.g., stack 305) may remain unchanged during processing step 605. Processing step 605 may be an example of processing step 300-b as described with reference to FIG. 3.

At processing step 610, an isotropic etch may selectively remove some portion of the dielectric material at D2 layer in the stack (e.g., layer 325) that is exposed to an etchant of the isotropic etch. The dielectric material at D2 layer may be referred to as a second dielectric material. The etchant of isotropic etch at processing step 610 may exhibit a selectivity with respect to other materials of the stack (e.g., materials at other layers of the stack). Namely, the etchant of the isotropic etch at processing step 610 may remove some portion of the second dielectric material at D2 layer while preserving (or substantially preserving) other materials (e.g., materials at other layers, such as DM layer, D1 layer, or HM layer of the stack). Selective removal of a portion of the second dielectric material from D2 layer (e.g., layer 325) may create a cavity (e.g., cavity 336 or first cavity 415 described with reference to FIG. 3 and FIG. 4) at D2 layer.

Diagram 602 illustrates that processing step 610 creates cavities at D2 layer (e.g., cavities are formed at layer 325) while the width of the via hole at other layers remains intact. Width 611 may represent a final width of the cavities formed at D2 layer. Additionally, diagram 603 at processing step 610 illustrates that cavities formed at the same layer using adjacent vias may merge, due to the isotropic nature of isotropic etch step expanding the size of each cavity in all directions, forming a channel (e.g., channel 420 described with reference to FIG. 4) within the second dielectric material at D2 layer (e.g., layer 325). The width of the channel (e.g., width 612) at reference line B-B as depicted in diagram 603 at processing step 610 may relate to the overlap regions 425 described with reference to FIG. 4. Width 612 may be approximately same as width 611 in some cases. In other cases, width 612 may be less than width 611.

At processing step 615, channels and associated via holes may be filled with an electrode material, which may be a conductive material. In some cases, the electrode material used at processing step 615 may be the same electrode material used at processing step 515. In some cases, excess electrode material may be formed on top of the stack (e.g., on top of HM layer (e.g., layer 310)) and may be removed by an etch-back process or chemical-mechanical polishing process. As used herein, via holes filled with a material (e.g., a conductive material) may be referred as holes after having been filled with the material. Diagram 603 at processing step 615 illustrates that the electrode material may flow into the portions of channels between vias and thus concurrently fill each channel created at processing step 610.

At processing step 620, an anisotropic etch may use the vias to remove a portion of the electrode material, creating new via holes corresponding to the vias. The anisotropic etch step may use the same via pattern of the hardmask layer as processing step 605 (e.g., the via pattern depicted in diagram 601) and create via holes that expose, at D2 layer, a sidewall of the electrode material deposited at processing step 615 for subsequent processing. At the processing step 620, a top-down view of a portion of diagram 601 depicting a single row of vias may correspond to a top-down view of filled channel 430 as described with reference to FIG. 4.

At processing step 625, an isotropic etch may selectively remove some portion of the electrode material from D2 layer—e.g., some portion of the electrode material deposited at processing step 615 thus filling the channel created at D2 layer (e.g., layer 325) at processing step 610. The etchant of isotropic etch at processing step 625 may exhibit a selectivity with respect to other materials (e.g., materials at other layers of the stack). Namely, the etchant of isotropic etch at processing step 625 may remove the electrode material while preserving (or substantially preserving) other materials (e.g., materials at other layers, such as the DM layer, D1 layer, HM layer of the stack). Selective removal of the electrode material from the cavities at D2 layer (e.g., layer 325) may leave a portion of the electrode material in the channel as illustrated in diagram 602 and diagram 603 at processing step 625, and the remaining portion of the electrode material may form a loop 460 as described with reference to FIG. 4. In other words, width 626 may be less than width 611. In some cases, a width (e.g., width 627) of the remaining portion of the electrode material (e.g., a width of access line comprising the electrode material) may be smaller than a minimum feature size of a given technology generation, such as a minimum feature size determined by a minimum width of a line (or a minimum space between lines) that may be defined by a photomasking step.

Diagram 603 illustrates that processing step 625 creates cavities at D2 layer (e.g., cavities are formed at layer 325 by selectively removing some portion of the electrode material formed at processing step 615) while the width of the via hole at other layers remains intact (not shown in diagram 603). Width 626 may represent a final size of the cavities formed in D2 layer. Additionally, diagram 603 at processing step 625 illustrates that cavities formed at the same layer using adjacent vias may merge (e.g., adjoin), due to the isotropic nature of isotropic etch step expanding the size of each cavity in all directions, forming a channel (e.g., channel 440 described with reference to FIG. 4) within the electrode material at D2 layer (e.g., layer 325). The width of the channel (e.g., width 628) at reference line B-B as depicted in diagram 603 at processing step 625 may relate to the width of channel 440 described with reference to FIG. 4. Width 628 may be approximately same as width 626 in some cases. In other cases, width 628 may be less than width 626.

At processing step 630, the channels at D2 layer and associated via holes may be filled with a dielectric material. In some cases, the dielectric material may be the same as the second dielectric material at D2 layer. In other cases, the dielectric material may be different from the first dielectric material. As used herein, via holes filled with a material (e.g., a dielectric material) may be referred to as holes after having been filled with the material. Diagrams 602 and 603 at processing step 630 may illustrate that one loop 460 of electrode material has been formed using the row of vias (e.g., vias depicted in diagram 601). it is to be understood that, in other examples, the stack may include any number of D2 layers, with a loop 460 of electrode material concurrently formed at each D2 layer using the processing steps described in reference to FIG. 6. After processing step 630, a top-down view of a portion of diagram 601 depicting a single row of vias may correspond to a top-down view of the loop 460-a described with reference to FIG. 4.

In some cases, at the completion of processing step 630, a second electrode layer (e.g., layer 325 or D2 layer as described with reference to FIG. 3 or 6) may include a third electrode (e.g., electrode 631-*a*), a fourth electrode (e.g., electrode 631-*b*), and a second dielectric channel (e.g., a dielectric channel that may be formed by filling the channel associated with width 626 with a dielectric material) that separates the third electrode and the fourth electrode by a second distance (e.g., width 626). The second distance (e.g., width 626) may be greater than the second width (e.g., width 606). Further, the second dielectric channel may be aligned with the plurality of second holes formed at the top layer (e.g., HM layer) of the stack, one of which is depicted at HM layer having the second width (e.g., width 606). In some cases, the second electrode layer may include an immediately neighboring electrode (not shown) next to the fourth electrode where the fourth electrode separates the third electrode from the immediately neighboring electrode and the fourth electrode is nearer the immediately neighboring electrode than the third electrode. For example, as shown in diagram 601, two electrodes formed from a single loop (e.g., with a single row of vias interposed between them) may be separated by a different (e.g., greater) distance than the distance between adjacent loops and thus the distance between two electrodes formed from different loops.

In some cases, an apparatus that includes a 3D cross-point memory array (e.g., a 3D cross-point memory array that may be built using the fabrication techniques described with reference to FIGS. 5 and 6) may include an upper layer of a stack, the upper layer comprising a plurality of holes that each have a first width, a first electrode layer within the stack, the first electrode layer comprising a first electrode and a second electrode, and a dielectric channel aligned with the plurality of holes and separating the first electrode from the second electrode by a first distance that is greater than the first width. In some examples of the apparatus described above, the first electrode has at least one dimension smaller than a minimum feature size. In some examples of the apparatus described above, the upper layer comprises a hardmask material. In some examples of the apparatus described above, a conformal liner (e.g., a conformal liner described with reference to FIG. 7) in contact with a plurality of surfaces of the first electrode.

In some cases, the apparatus described above may further include a memory layer within the stack, the memory layer comprising a sheet of memory material perforated by a plurality of dielectric plugs.

In some cases, the apparatus described above may further include a second electrode layer within the stack, the second electrode layer comprising a third electrode and a fourth electrode, and a memory layer within the stack, the memory layer comprising a memory material element that is coupled with the first electrode, the second electrode, and the third electrode. In some examples of the apparatus described above, the memory material element is coupled with the fourth electrode.

In some cases, the apparatus described above may further include a memory layer within the stack, the memory layer comprising a plurality of memory material elements, each memory material element having a curved surface.

In some cases, the apparatus described above may further include a plurality of second holes in the upper layer, each second hole having a second width, a second electrode layer within the stack, the second electrode layer comprising a third electrode and a fourth electrode, and a second dielectric channel aligned with the plurality of second holes and separating the third electrode from the fourth electrode by a second distance that is greater than the second width. In some examples of the apparatus described above, the first electrode and the second electrode are disposed in a first direction, and the third electrode and the fourth electrode are disposed in a second direction. In some cases, the apparatus described above may further include an immediately neighboring electrode at the first electrode layer, in which the second electrode separates the first electrode from the immediately neighboring electrode, and the second electrode is nearer the immediately neighboring electrode than the first electrode.

Figure 7:
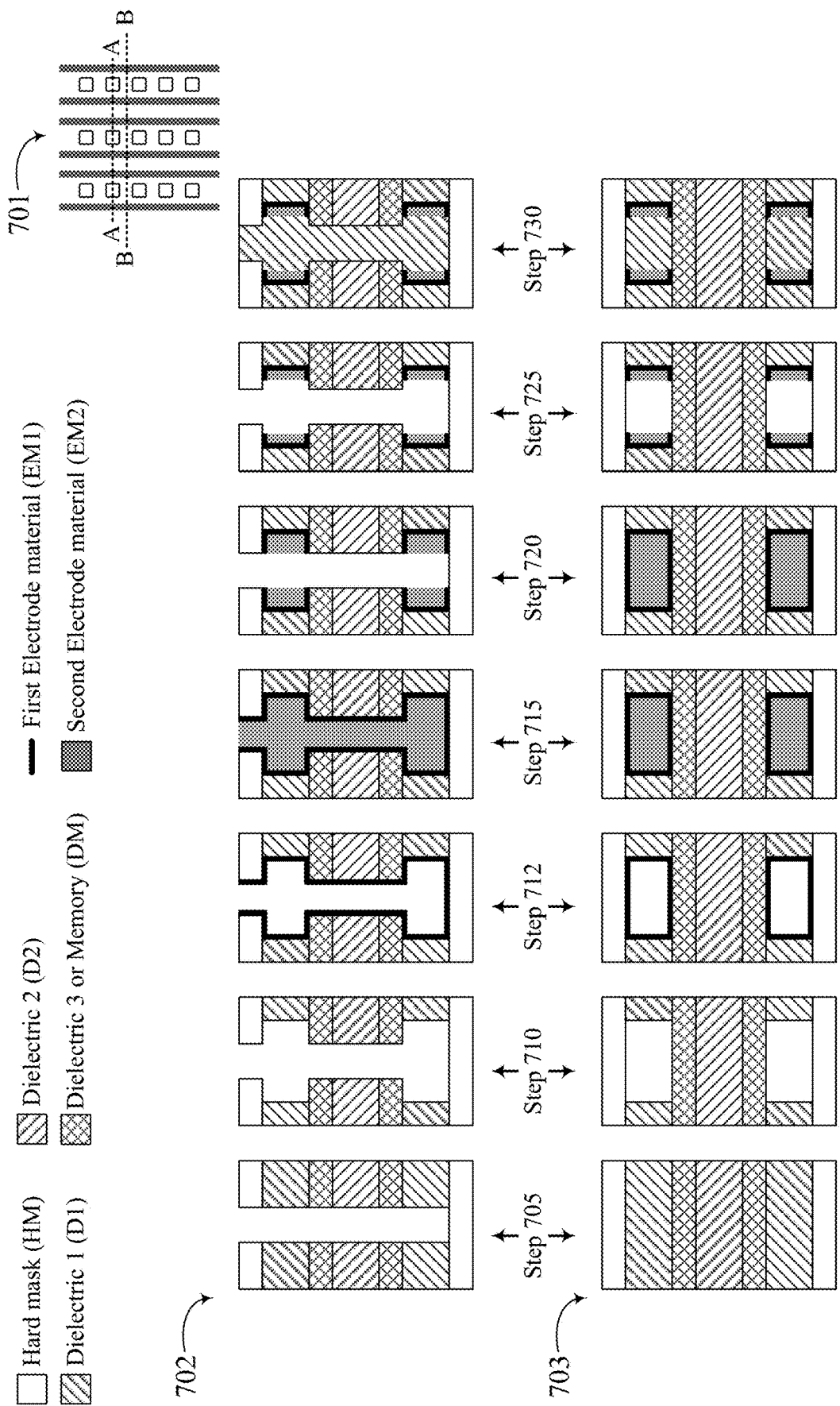

FIG. 7 illustrates example methods of forming a 3D cross-point memory array structure that may include two or more decks of memory cells in accordance with the present disclosure. FIG. 7, as an illustrative example of fabrication techniques described herein, may show a method of forming a bi-layer electrode (e.g., a bi-layer access line). Some aspects of the methods illustrated in FIG. 7 may be similar to corresponding aspects of FIG. 5. For example, in some cases, processing step 705, processing step 710, processing step 715, and processing step 730 may be same as processing step 505, processing step 510, processing step 515, and processing step 530 described with reference to FIG. 5, respectively.

As illustrated in processing step 712, a first electrode material (EM1) may be formed on surfaces exposed as a result of step 710 (e.g., on the surface of the channels and via holes generated at processing step 710). In some cases, EM1 may be formed as a conformal liner on the surface exposed as a result of step 710. In some cases, EM1 may be a carbon-based material. At processing step 715, a second electrode material (EM2) may fill the remaining volume of channels and via holes, as described with reference to processing step 515. In some cases, EM2 may be the same electrode material described with reference to FIGS. 5 and 6. As used herein, via holes filled with a material (e.g., a bi-layer material comprising the first electrode material and the second electrode material) may be referred as holes after having been filled with the material. Hence, a conformal liner (e.g., a carbon-based electrode material) may be interposed between a first dielectric material (e.g., a first dielectric material at layers 315 (e.g., D1 layers)) and the second electrode material (e.g., EM2). In some cases, a conformal liner (e.g., a carbon-based electrode material) may be in contact with a plurality of surface of the first electrode (e.g., the electrode comprising EM2).

Subsequently, an anisotropic etch step included in processing step 720 may remove both EM1 material and EM2 material. The anisotropic etch at processing step 720 may be a variation of the anisotropic etch step in processing step 520 (or processing step 620), as processing step 720 may remove both EM1 material and EM2 material whereas processing step 520 may remove EM2 material only. In addition, an isotropic etch step included in processing step 725 may remove both EM1 material and EM2 material. The isotropic etch at processing step 725 may be a variation of the isotropic etch step in processing step 525 (or processing step 625), as processing step 725 may remove both EM1 material and EM2 material whereas processing step 525 may remove EM2 material only.

Diagram 702 and diagram 703 illustrate that processing step 712 may result in EM1 material being interposed between EM2 material and the DM layer at all locations where EM2 material in a D1 layer would otherwise be in contact with the DM layer. In some cases, the EM1 material (e.g., a carbon-based material) may function as a buffer layer between the EM2 material (e.g., a tungsten-based material) and the material of each DM layer (e.g., a chalcogenide material 220 described with reference to FIG. 2 or a placeholder dielectric material that may subsequently be at least partially replaced with a memory material). In some cases, each memory material element—such as a memory material element comprising a memory material (e.g., chalcogenide material 220) at the DM layer or a memory material element comprising a memory material (e.g., chalcogenide material 220) subsequently formed by partially replacing a placeholder dielectric material at the DM layer—may be coupled with the at least one first electrode through a conformal liner that may be in contact with three surfaces of the at least one first electrode.

Though the processing steps of FIG. 7 have been illustrated and described as modifying the processing steps described with reference to FIG. 5, it is to be understood that the processing steps of FIG. 6 may be similarly modified (not shown) to form access lines comprising bi-layer electrodes (e.g., a bi-layer access line) at each D2 layer as well. As such, both the upper surface and the lower surface of material at the DM layer may interface with EM1 material instead of EM2 material—thus, a memory cell at an DM layer may interface with two bi-layer electrodes (e.g., a word line 110 and a bit line 115). In some cases, only one access line (e.g., word line 110 or bit line 115) for a memory cell may include a bi-layer electrode such that an asymmetric electrode configuration between two access lines may facilitate an asymmetric operation of a memory cell.

Figure 8:
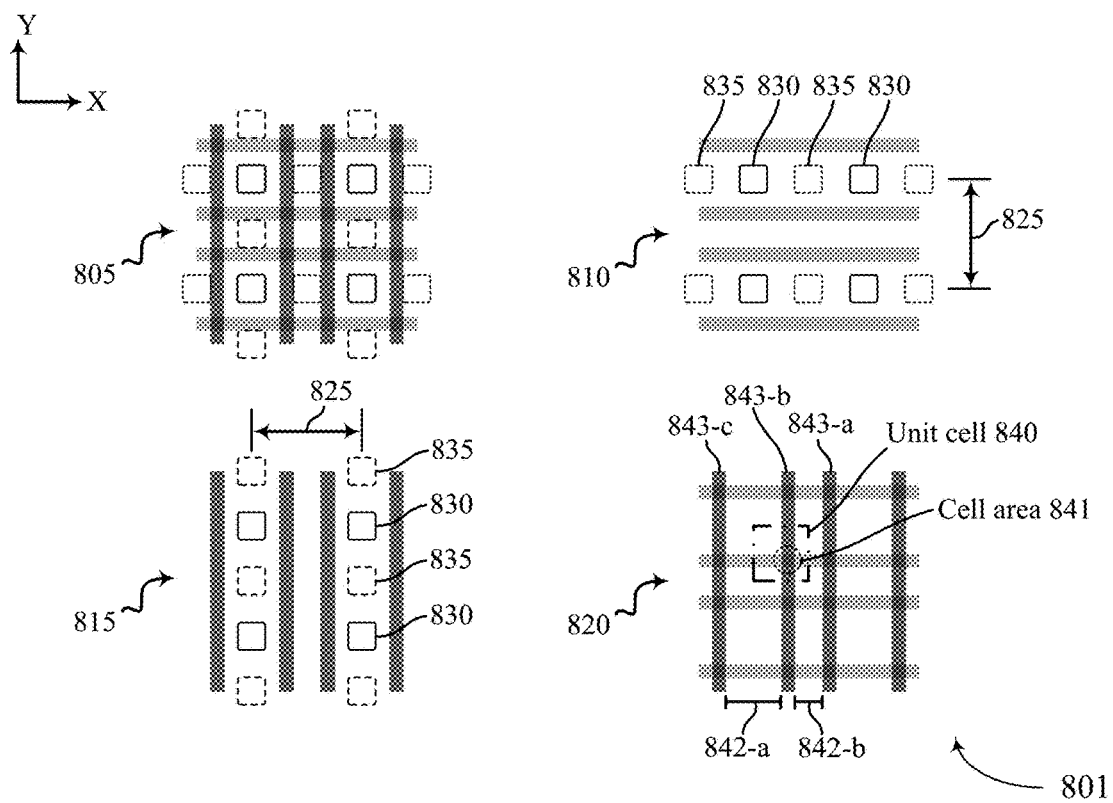
FIG. 8 illustrates exemplary via patterns and structures that support a cross-point memory array and related fabrication techniques in accordance with embodiments of the present disclosure.
Figure 8:
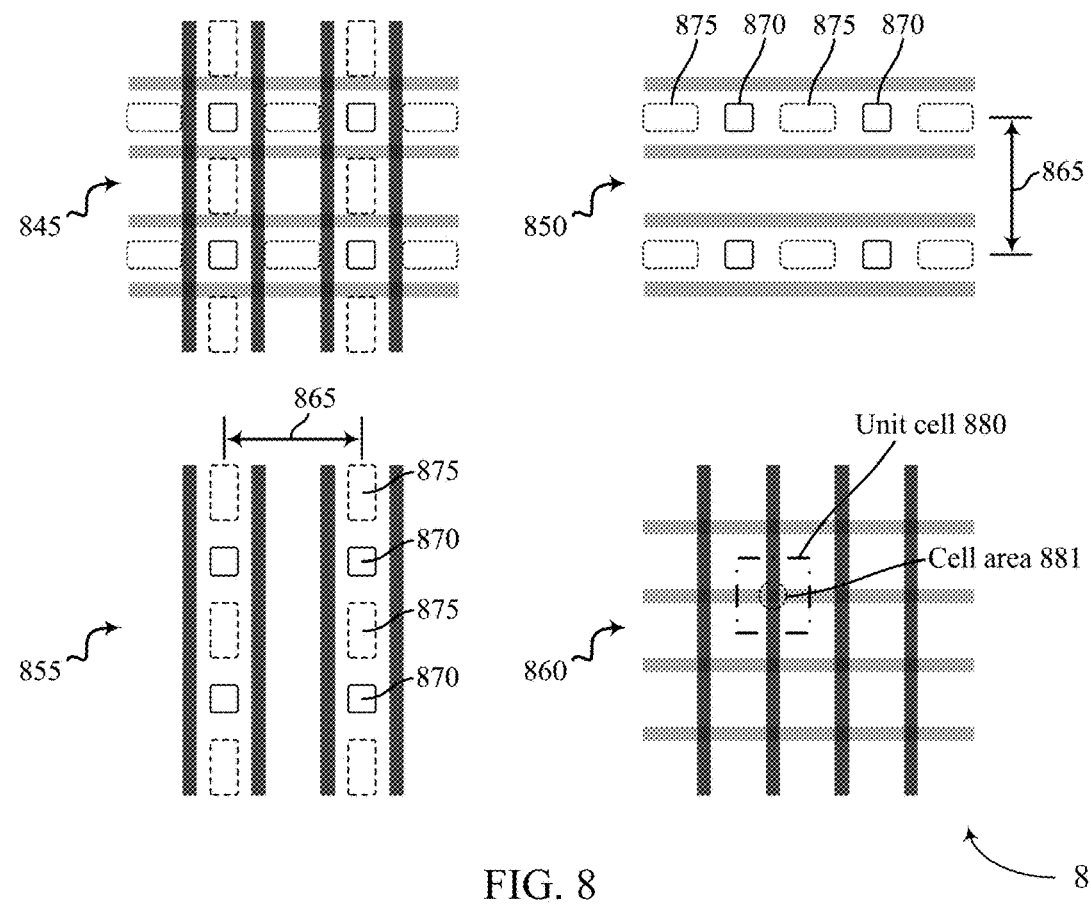

FIG. 8 illustrates exemplary via patterns and structures that support a cross-point memory array and related fabrication techniques in accordance with the present disclosure. The fabrication techniques may be used to form a 3D cross-point memory array structure that may include two or more decks of memory cells. FIG. 8, as an illustrative example of fabrication techniques described herein, includes diagram 801 and diagram 802, and each diagram may represent a top-down view of a layout of a portion of a 3D cross-point memory array.

Diagram 801 includes layouts 805, 810, 815, and 820. Layout 805 is a composite plot depicting a pattern of vias, a set of first access lines, and a set of second access lines. Layout 805, as an illustrative example, may depict 16 memory cells in a single deck of memory array—e.g., one memory cell located at each of the 16 cross-points between the four first access lines and the four second access lines.

Layout 810 illustrates a subset of the elements of the layout 805, which includes two sets of first vias, each set of first vias arranged in a row in a first direction (e.g., on the page, a horizontal direction or x-direction), and four first access lines that extend in the first direction. In some cases, the first access lines may be of a conductive material (e.g., electrode material as described with reference to FIGS. 1 and 2) and may be examples of word lines (e.g., word lines 110 as described with reference to FIGS. 1 and 2). The four first access lines may represent portions (e.g., the longer sides) of two loops of electrode material with the ends (e.g., the shorter sides) removed, and each loop of electrode material may have been formed using the set of first vias surrounded by the loop of electrode material. Thus, layout 810 illustrates a set of four first access lines formed using two sets of first vias, each set of first vias arranged in a row in the first direction, for example. Further, using layout 810, sets of four first access lines may be concurrently formed in any number of first layers (e.g., layers initially comprising a first dielectric material, such as layer 315-*a*, layer 315-*b*) of a composite stack (e.g., stack 305-*a*) as described with reference to FIG. 3.

Similarly, layout 815 illustrates another subset of the elements of the layout 805, which includes two sets of second vias, each set of second vias arranged in a row in a second direction (e.g., on the page, a vertical direction or y-direction) and four second access lines that extend in the second direction. In some cases, the second access lines may be of a conductive material (e.g., electrode material as described with reference to FIGS. 1 and 2) and may be examples of bit lines (e.g., bit lines 115 as described with reference to FIGS. 1 and 2). The four second access lines may represent portions (e.g., the longer sides) of two loops of electrode material with the ends (e.g., the shorter sides) removed, and each loop of electrode material may have been formed using the set of second vias surrounded by the loop of electrode material. Thus, layout 815 illustrates a set of four second access lines formed using two sets of second vias, each set of second vias arranged in a row in the second direction, for example. Further, using layout 815, sets of four second access lines may be concurrently formed in any number of second layers (e.g., layers initially comprising a second dielectric material, such as layer 325) of a composite stack (e.g., stack 305-*a*) as described with reference to FIG. 3.

Layout 820 illustrates another subset of the elements of the layout 805, which includes the four first access lines in the first direction (e.g., a horizontal direction or x-direction) and the four second access lines in the second direction (e.g., a vertical direction or y-direction). A memory component may be disposed at each location where a first access line and a second access line topologically intersect each other. As described above, one or more sets of the first access lines (e.g., word lines) may be formed in one or more first layers of a composite stack, and one or more sets of the second access lines (e.g., bit lines) may be formed in one or more second layers of the composite stack. Thus, layout 820 may be a representation of a 3D cross-point array of memory cells in which each deck of memory cells comprises four word lines, four bit lines, and sixteen memory cells.

Layout 820 also illustrates a unit cell 840. In the context of memory technology, unit cell may refer to a single memory cell including a complete set of its constituents (e.g., word line, bit line, selection component, memory component). Repetitions of a unit cell of memory may build any size of an array of memory cells. In addition, layout 820 illustrates cell area 841. In the context of cross-point memory architecture, cell area 841 may refer to an area corresponding to an area of topological intersection of access lines (e.g., a word line and a bit line). In other words, a width of word line multiplied by a width of bit line may define cell area 841.

In some cases, as illustrated in layout 820, an electrode layer—namely, a first electrode layer at which a set of first access lines (e.g., access line comprising an electrode material) may be formed—may include a plurality of first electrodes. In some cases, separation distances between first electrodes (e.g., distances 842) within the plurality of first electrodes may be non-uniform. In some cases, an immediately neighboring electrode (e.g., access line 843-*a*) may be present next to an electrode (e.g., access line 843-*b*) where the electrode (e.g., access line 843-*b*) separates other electrode (e.g., access line 843-*c*) from the immediately neighboring electrode (e.g., access line 843-*a*) and the electrode (e.g., access line 843-*b*) may be nearer the immediately neighboring electrode (e.g., access line 843-*a*) than the other electrode (e.g., access line 843-*c*).

Further, it is to be understood that a subset of vias may be common between a set of first vias arranged in a row in the horizontal direction (x-direction) and a set of second vias arranged in a row in the vertical direction (y-direction)—that is, one or more vias may be included in both a horizontal row of first vias and a vertical row of second vias. Such vias may be referred to as common vias (e.g., common via 830). Common vias 830 may be used both for forming a set of first access lines and for forming a set of second access lines. In other words, processing steps forming the first access lines (e.g., word lines) and processing steps forming the second access lines (e.g., bit lines) may both use the common vias 830. In other words, the common vias 830 may be subject to the processing steps 505 through 530 and processing steps 605 through 630 as described with reference to FIGS. 5 and 6. In contrast, other vias may be used to form either the first access lines (e.g., processing steps 505 through 530 to form word lines) or the second access lines (e.g., processing steps 605 through 630 to form bit lines), but not both. Such vias may be referred to as uncommon vias (e.g., uncommon vias 835). Sizes of vias, distances between vias, and sizes of cavities associated with vias may vary to achieve various layouts of a memory array—e.g., layout 805 and layout 845.

Diagram 802 illustrates a variation of layout 805 as an example of achieving a different layout of memory array by modifying a dimension associated with vias (e.g., a size of via, a distance between vias, a size of cavity associated with a via, etc.). Diagram 802 includes layouts 845, 850, 855, and 860. Layout 845 is a composite plot depicting a pattern of vias, a set of first access lines, and a set of second access lines. Layout 845, as an illustrative example similar to layout 805, may depict 16 memory cells in a single deck of memory array—e.g., one memory cell located at each of the 16 cross-points between the four first access lines and the four second access lines.

A difference between layout 845 and layout 805 may be that vias may be square or rectangular in layout 845. In some cases, layout 845 may have common vias that are square and uncommon vias that are rectangular. As a result of the difference, layout 860 (e.g., when compared to the layout 820) illustrates uniformly distributed access lines and a constant distance between active cell areas. Layout 860 also illustrates a unit cell 880, and the area of unit cell 880 may be greater than the area of unit cell 840. In addition, layout 860 illustrates cell area 881, and the area of cell area 881 may correspond to the area of cell area 841 if widths of access lines remain unchanged between layout 845 and layout 805. In some cases, more uniformly distributed access lines and therefore more uniform distances between active cell areas may facilitate more efficient operation of a memory array, whereas non-uniformly distributed access lines and therefore non-uniform distances between active cell areas may facilitate greater memory cell density within a memory array. These and other benefits and tradeoffs may be apparent to one of ordinary skill in the art.

FIGS. 9 through 12 illustrate various aspects of constructing memory material elements in accordance with fabrication techniques of the present disclosure, which may be used for example, to make a 3D memory array such as the examples of memory array 102 illustrated in FIG. 1 and memory array 202 illustrated in FIG. 2. The fabrication techniques described herein may include using a single pattern of vias in a top (e.g., exposed) layer of a composite stack to form one or more memory material elements in one or more lower (e.g., buried) layers of the composite stack. As used herein, a via may refer to an opening that has been later filled with a material that may not be conductive. In some cases, such lower layers in which the memory material elements are formed may be referred to as memory layers— e.g., DM layers as described with reference to FIGS. 5 and 6. In some embodiments, DM layers (e.g., layer 320-a and layer 320-b) may initially include a memory material (e.g., chalcogenide material 220). In other embodiments, DM layers (e.g., layer 320-a and layer 320-b) may initially include a placeholder material (e.g., a third dielectric material as described with reference to FIG. 5).

Figure 9:
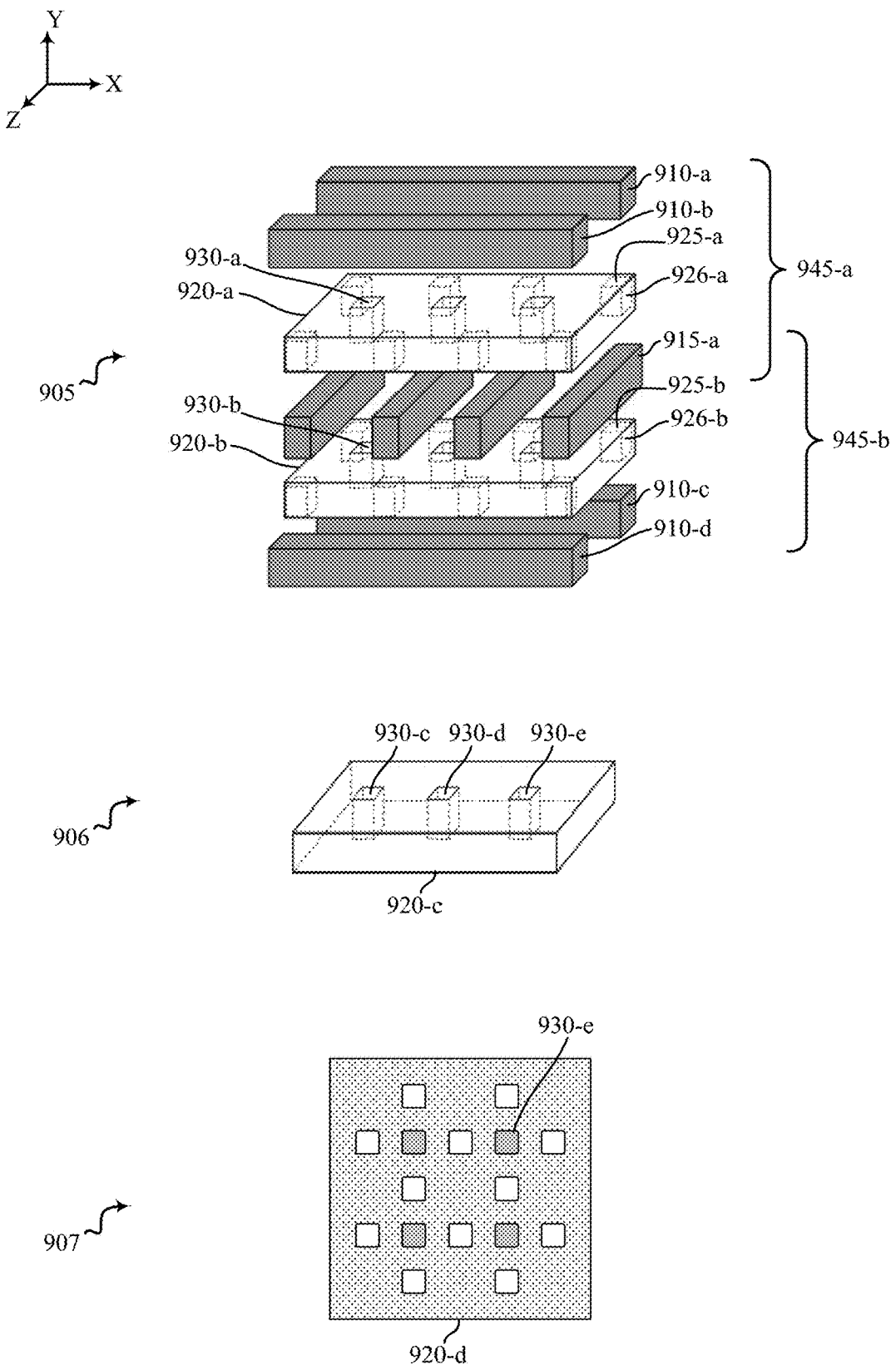
FIGS. 9-12 illustrate examples of 3D cross-point memory array structures that support a cross-point memory array and related fabrication techniques in accordance with embodiments of the present disclosure.

FIG. 9 illustrates an example of a 3D cross-point memory array structure 905 that may include two or more decks of memory cells and may be formed in accordance with the fabrication techniques of the present disclosure. Array structure 905 may comprise two decks of memory cells (e.g., an upper deck 945-a and a lower deck 945-b). The two decks of memory cells collectively include two sets of first access lines (e.g., upper deck 945-a includes one set of word lines 910-a and 910-b, and lower deck 945-b includes another set of word lines 910-c and 910-d) that may be concurrently formed, two memory layers of memory materials (e.g., memory layers 920-a and 920-b) that may be concurrently formed, and one set of second access lines (e.g., bit lines 915) that is common for both decks of memory cells. First access lines (e.g., word lines 910) may extend in a first direction (e.g., x-direction) while second access lines (e.g., bit lines 915) may extend in a second, different direction (e.g., z-direction). Each first access lines of the set of first access lines (e.g., word lines 910) may be parallel to each other first access line of the set of first access lines, and each second access lines of the set of second access lines (e.g., bit lines 915) may be parallel to each other second access line of the set of second access lines. The first access lines (e.g., word lines 910) may be substantially orthogonal to the second access lines (e.g., bit lines 915) as depicted in the array structure 905.

The upper deck 945-a may include word lines 910-a and 910-b, memory layer 920-a, and bit lines 915, and the lower deck 945-b may include word lines 910-c and 910-d, memory layer 920-b, and bit lines 915. Thus, bit lines 915 may be common to upper deck 945-a and lower deck 945-b in the array structure 905. Further, the word lines 910 may be examples of the first conductive lines formed in the first electrode layers (e.g., layer 315-a and layer 315-b as described with reference to FIG. 3, D1 layer as described with reference to FIGS. 5-7). Similarly, the bit lines 915 may be examples of the second conductive lines formed in the second electrode layer (e.g., layer 325 as described with reference to FIG. 3, D2 layer as described with reference to FIGS. 5-7). Lastly, the memory layers 920 may be examples of the memory layers (e.g., layer 320-a and layer 320-b as described with reference to FIG. 3, DM layer as described with reference to FIGS. 5-7). Hence, the upper deck 945-a may correspond to an upper deck of memory cells formed in a first subset of the composite stack 305-a comprising layer 315-a, layer 320-a, and layer 325 while the lower deck 945-b may correspond to a lower deck of memory cells formed in a second subset of the composite stack 305-a comprising layer 325, layer 320-b, and layer 315-b.

The array structure 905 shows horizontal (x- or z-direction) spaces between structures within a layer (e.g., a space between word line 910-a and word line 910-b within a first electrode layer), which may be filled with a dielectric material. The array structure 905 also shows vertical (y-direction) spaces between layers—e.g., a space between the memory layer 920-a and the first electrode layer including word lines 910-a and 910-b—for illustration purposes only. Such vertical spaces shown in the array structure 905 may not exist in actual embodiments. In some cases, a portion of an interface between the memory layer and the electrode layer may include other materials, such as an additional electrode material (e.g., carbon) as describe with reference to FIG. 7.

The array structure 905 includes two memory layers 920-a and 920-b, a first memory layer 920-a included in upper deck 945-a and a second memory layer 920-b included in lower deck 945-b. An initial stack of layers (e.g., stack 305-a described with reference to FIG. 3) may include one or more memory layers 920, which may each comprise a sheet of memory material (e.g., chalcogenide material 220). Including one or more memory layers as a part of an initial stack may provide benefits in terms of reduced manufacturing time and costs, due to fewer processing steps associated with fabricating the array structure 905. In some cases, the processing steps described with reference to FIGS. 5 and 6 may be used to build the array structure 905, and may result in each memory layer comprising a sheet of memory material perforated by a plurality of dielectric plugs (e.g., dielectric plugs 930). The dielectric plugs that perforate the sheets of memory material may result, for example, from processing steps 530 and 630 as described with reference to FIGS. 5 and 6.

FIG. 9 includes a diagram 906 that illustrates memory layer 920-c in isolation, which comprises a sheet of memory material perforated by a plurality of dielectric plugs (e.g., dielectric plugs 930-c through 930-e). Some portions of memory layer 920-c may comprise memory cells 105 and may operate in conjunction with the first access lines and the second access lines. Such portions of memory layer 920-c may be referred to as cell areas 925 (e.g., cell area 925-a) and may be located where first access lines (e.g., word line 910-a) and second access lines (e.g., bit line 915-a) topologically intersect. The cell areas 925 may correspond to cross-points 465 (e.g., an area of a cross-point associated with widths of access lines) as described with reference to FIG. 4. In addition, the cell area 925 may be an example of cell area 841 or cell area 881 as described with reference to FIG. 8.

Further, the cell area 925 and the thickness of a memory layer 920 (e.g., thickness of a sheet of memory material perforated by a plurality of dielectric plugs) may define a cell volume 926. Cell volume 926 may refer to a volume of memory material that functions as a memory cell 105 (e.g., as a portion of memory material configured to store a logic state). In some cases, the memory material may include different crystallographic phases, and different crystallographic phases may correspond to different logical states. In other cases, the memory material may include different local compositions, and different local compositions may correspond to different logical states. In some cases, electrical operations associated with access lines (e.g., a voltage difference between a word line and a bit line) may alter the crystallographic phase of the memory material (or the local composition of the memory material) included in a cell volume 926 without altering remaining portions of the memory layer 920 (e.g., a sheet of memory material perforated by a plurality of dielectric plugs). Such electrical delineation between the memory material included in a cell volume 926 and the remaining portions of the memory layer may be referred to as electrical confinement of an active cell volume. In some cases, the cell volume 926 of a memory cell 105 may be referred to as the active cell volume of the memory cell 105.

FIG. 9 also illustrates a top-down view diagram 907 of memory layer 920-d (e.g., a sheet of memory material perforated by a plurality of dielectric plugs) in isolation. The memory layer 920-d may be an example of memory layer 920-a through 920-c. The memory layer 920-d may be positioned in a plane defined by the x-axis and z-axis. The memory layer 920-d may include a pattern of dielectric plugs corresponding to a pattern of vias. The pattern of dielectric plugs may, for example, correspond to the pattern of vias depicted in layout 805.

In some cases, a first subset of vias may have been used to generate one or more sets of first access lines (e.g., word lines 910) and left the first subset of dielectric plugs arranged in a row in a horizontal direction (e.g., x-direction in a x-z plane defined by the x-axis and z-axis). Additionally, a second subset of vias may have been used to generate one or more sets of second access lines (e.g., bit lines 915) and left the second subset of dielectric plugs arranged in a row in a vertical direction (e.g., z-direction in a x-z plane defined by the x-axis and z-axis). For example, the first subset of dielectric plugs may result from processing step 530 as described in reference FIG. 5, and the second subset of dielectric plugs may result from processing step 630 as described in reference to FIG. 6. Thus, in some cases, a first subset of dielectric plugs arranged in a row in a horizontal direction (e.g., corresponding via holes disposed in a first linear configuration having a first direction) may comprise a first dielectric material, and a second subset of dielectric plugs arranged in a row in a vertical direction (e.g., corresponding via holes disposed in a second linear configuration having a second direction that intersects the first direction) may comprise a second dielectric material. In some cases, a dielectric plug (e.g., dielectric plug 930-e, which is illustrated in diagram 907, like other common dielectric plugs, as a dark-shaded dielectric plug) may be common to the rows of dielectric plugs (e.g., the first subset of dielectric plugs and the second subset of dielectric plugs).

In some cases, sizes of vias and distances between vias may vary to achieve various memory array configurations (e.g., layout 805 or layout 845 described with reference to FIG. 8). As such, a pattern of dielectric plugs in one or more memory layers 920, each comprising a sheet of memory material, may vary such that the sheet of memory material may be perforated by a plurality of dielectric plugs having various sizes and distances between the dielectric plugs.

Figure 10:
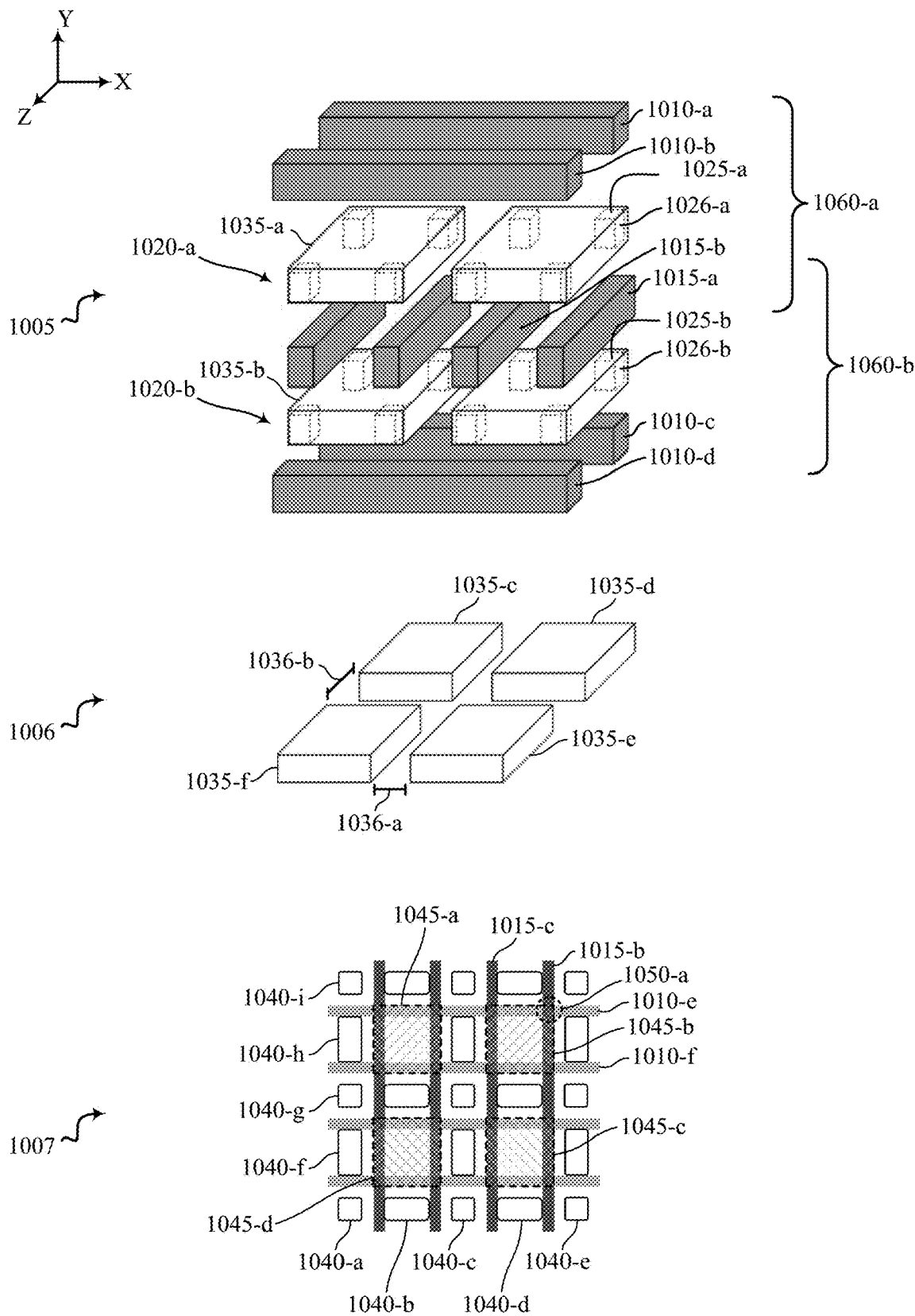

FIG. 10 illustrates an example of a 3D cross-point memory array structure 1005 that may include two or more decks of memory cells and may be formed in accordance with the fabrication techniques of the present disclosure. Array structure 1005 may comprise two decks of memory cells (e.g., an upper deck 1060-a and a lower deck 1060-b). The two decks of memory cells collectively include two set of first access lines (e.g., upper deck 1060-a includes one set of word lines 1010-a and 1010-b, and lower deck 1060-b includes another set of word lines 1010-c and 1010-d included in) that may be concurrently formed, two memory layer of memory material (e.g., memory layers 1020-a and 1020-b) that may be concurrently formed, and one set of second access lines (e.g., bit lines 1015) that is common for both decks of memory cells. First access lines (e.g., word lines 1010) may extend in a first direction (e.g., x-direction) while second access lines (e.g., bit lines 1015) may extend in a second, different direction (e.g., z-direction). Each first access lines of the set of first access lines (e.g., word lines 1010) may be parallel to each other first access line of the set of first access lines, and each second access lines of the set of second access lines (e.g., bit lines 1015) may be parallel to each other second access line of the set of second access lines. The first access lines (e.g., word lines 1010) may be substantially orthogonal to the second access lines (e.g., bit lines 1015) as depicted in the array structure 1005.

The upper deck 1060-*a* may include word lines 1010-*a* and 1010-*b*, memory layer 1020-*a*, and bit lines 1115, and the lower deck 1060-*b* may include word lines 1010-*c* and 1010-*d*, memory layer 1020-*b*, and bit lines 1015. Thus, bit lines 1015 may be common to upper deck 1060-*a* and lower deck 1060-*b* in the array structure 1005. Further, the word lines 1010 may be examples of the first conductive lines formed in the first electrode layers (e.g., e.g., layer 315-*a* and layer 315-*b* as described with reference to FIG. 3, D1 layer as described with reference to FIGS. 5-7). Similarly, the bit lines 1015 may be examples of the second conductive lines formed in the second electrode layer (e.g., layer 325 as described with reference to FIG. 3, D2 layer as described with reference to FIGS. 5-7). Lastly, each of memory layers 1020 comprising memory material elements (e.g., memory layer 1020-*a* comprising memory material element 1035-*a*, memory layer 1020-*b* comprising memory material element 1035-*b*) may be an example of the memory layers (e.g., layer 320-*a* and layer 320-*b* as described with reference to FIG. 3, DM layer as described with reference to FIGS. 5-7). Hence, the upper deck 1060-*a* may correspond to an upper deck of memory cells formed in a first subset of the composite stack 305-*a* comprising layer 315-*a*, layer 320-*a*, and layer 325 while the lower deck 1060-*b* may correspond to a lower deck of memory cells formed in a second subset of the composite stack 305-*a* comprising layer 325, layer 320-*b*, and layer 315-*b*

The array structure 1005 shows horizontal (x- or z-direction) spaces between structures within a layer (e.g., a space between word line 1010-*a* and word line 1010-*b* within a first electrode layer), which may be filled with a dielectric material. The array structure 1005 also shows vertical (y-direction) spaces between layers—e.g., a space between the memory layer 1020-*a* and the first electrode layer including word lines 1010-*a* and 1010-*b*—for illustration purposes only. Such vertical spaces shown in the array structure 1005 may not exist in actual embodiments. In some cases, a portion of an interface between the memory layer and the electrode layer may include other materials, such as an additional electrode material (e.g., carbon) as describe with reference to FIG. 7.

The array structure 1005 includes two memory layers 1020-*a* and 1020-*b*, a first memory layer 1020-*a* included in upper deck 1060-*a* and a second memory layer 1020-*b* included in lower deck 1060-*b*. An initial stack of layers (e.g., stack 305-*a* described with reference to FIG. 3) may include one or more memory layers 1020, which may each comprise a sheet of memory material (e.g., chalcogenide material 220). In some cases, each memory layer 1020 may include a plurality of memory material elements 1035, each memory material element 1035 in a 3D rectangular shape as illustrated in diagram 1006.

FIG. 10 includes a diagram 1006 that illustrates a memory layer 1020 in isolation, which includes four 3D rectangular-shaped memory material elements (e.g., 1035-*c* through 1035-*f*). It is to be understood that a memory layer 1020 may include any number of memory material elements 1035. 3D rectangular-shaped memory material elements 1035-*c* and 1035-*d* of diagram 1006 may correspond to two 3D rectangular-shaped memory material elements depicted in memory layer 1020-*a* of array structure 1005. Further, the plurality of memory material elements 1035 depicted in diagram 1006 may have at some time been a part of a single sheet of memory material included in a composite stack.

Some portions of each 3D rectangular-shaped memory material element 1035 may comprise memory cells 105 and may operate in conjunction with the first access lines and the second access lines. Such portions of memory material elements 1035 may be referred to as cell areas 1025 (e.g., cell area 1025-*a* of upper deck 1060-*a*) and may be located within a memory layer 1020 where first access lines (e.g., word line 1010-*a*) and second access lines (e.g., bit line 1015-*a*) topologically intersect. The cell areas 1025 may correspond to cross-points 465 (e.g., an area of the cross-point associated with widths of access lines) as described with reference to FIG. 4. In addition, the cell area 1025 may be an example of cell area 841 or cell area 881 described with reference to FIG. 8.

Further, the cell area 1025 and the thickness of a memory layer 1020 (e.g., thickness of 3D rectangular-shaped memory material element 1035-*a*) may define a cell volume 1026. Cell volume 1026 may refer to a volume of memory material that functions as a memory cell 105 (e.g., as a portion of memory material configured to store a logic state). In some cases, the memory material may include different crystallographic phases, and different crystallographic phases may correspond to different logical states. In other cases, the memory material may include different local compositions, and different local compositions may correspond to different logical states. In some cases, electrical operations associated with access lines (e.g., a voltage difference between a word line and a bit line) may alter the crystallographic phase of the memory material (or the local composition of the memory material) included in a cell volume 1026 without altering remaining portions of the memory material element 1035. Such electrical delineation between the memory material included in a cell volume 1026 and the remaining portions of the memory material element 1035 may be referred to as electrical confinement of an active cell volume. In some cases, the cell volume 1026 of a memory cell 105 may be referred to as the active cell volume of the memory cell 105.

In addition, one or more physical separations (e.g., channel 1036-*a* or 1036-*b* filled with a dielectric material as illustrated in diagram 1006), which separate each 3D rectangular-shaped memory material element from each other, may also define the cell volume 1026 and provide physical separation on at least two surfaces of a memory cell 105 (e.g., two surfaces of a cell volume 1026). In some case, such physical separation may be referred to a physical confinement of an active cell volume—e.g., in contrast to electrical confinement of an active cell volume.

In an illustrative example of cell volume 1026, each cell volume 1026 includes two interfaces defined by electrical confinement and another two interfaces defined by physical confinement. In some cases, a memory cell 105 comprising a memory material defined by physical confinement of active cell volume may be less prone to various undesirable phenomena (e.g., disturbs) during memory cell operations. For example, a memory cell 105 of the array structure 1005 includes an active cell volume defined by two interfaces of physical confinement and two interfaces of electrical confinement. In contrast, a memory cell 105 of the array structure 905 includes an active cell volume defined by four interfaces of electrical confinement. Thus, a memory cell 105 of the array structure 1005 may be less prone to the undesirable phenomena than a memory cell 105 of the array structure 905.

FIG. 10 also illustrates a top view of a layout 1007. The layout 1007 may be an example of layout 845 described with reference to FIG. 8, and may illustrate how a pattern of vias may concurrently form one or more 3D rectangular-shaped memory material elements 1035 within each of multiple memory layers (e.g., layer 320-*a*, layer 320-*b* described with reference to FIG. 3) included in a stack. As illustrated with reference to FIG. 4A, a set of vias arranged in a row may be used to form a channel (e.g., channel 420) in a target material at a target layer. Forming such a channel (e.g., channel 420) at a target layer may sever (e.g., divide, separate) a target material at the target layer into two distinct sections of the target material. Similarly, forming multiple channels at a target layer may sever a target material at the target layer into more than two distinct sections of target material.

In the illustrative example using the layout 1007, one or more sets of first vias, each set of first vias (e.g., vias 1040-*a* through 1040-*e*) arranged in a row in a horizontal direction (e.g., the first vias may be linearly disposed in x-direction) may be formed at a top layer (e.g., layer 310) of a composite stack (e.g., stack 305-*a*) that includes a sheet of memory material at a memory layer (e.g., layer 320-*a*). In addition, one or more sets of second vias, each set of second vias (e.g., via 1040-*a* and vias 1040-*f* through 1040-*i*) arranged in a row in a vertical direction (e.g., the second vias may be linearly disposed in z-direction) may be formed at the top layer of the composite stack.

The sets of first vias may be used to form a group of first channels in the horizontal direction (x-direction) in the memory material at the memory layer in which each first channel is aligned with a set of first vias. In addition, the sets of second vias may be used to form a group of second channels in the vertical direction (z-direction) in the memory material at the same memory layer such that each second channel may intersect the group of first channels. Each of the first channels and each of the second channels may be filled with a dielectric material (e.g., channel 1036-*a* or 1036-*b* filled with a dielectric material as illustrated in diagram 1006). Forming the first channels (e.g., extending in x-direction) filled with a dielectric material at the memory layer may divide (e.g., separate, sever) a sheet of memory material at the memory layer (e.g., layer 320-*a*) into a first plurality of discrete sections (e.g., horizontal stripes extending in x-direction) of memory material at the memory layer. In addition, forming the second channels (e.g., extending in z-direction) filled with a dielectric material at the memory layer may further divide (e.g., separate, sever) each of the first plurality of discrete sections into a second plurality of discrete sub-sections of memory material (e.g., rectangles 1045-*a* through 1045-*d* of layout 1007) at the memory layer. The rectangles of memory material (e.g., rectangles 1045-*a* through 1045-*d* of layout 1007) may correspond to the 3D rectangular-shaped memory material elements 1035 (e.g., memory material elements 1035-*c* through 1035-*f* of diagram 1006).

Thus, two sets of vias—e.g., the sets of first vias and the sets of second vias—may be used to concurrently divide a 3D sheet of memory material at one or more memory layers (e.g., layer 320-*a*, layer 320-*b*) within a stack of layers (e.g., stack 305-*a*) into a plurality of 3D rectangular-shaped memory material elements within each of the memory layers.

In some cases, a top layer (e.g., layer 310) of a stack (e.g., stack 305-*a*) may include a pattern of vias including both the sets of first vias and the sets of second vias, hence forming a set of vias in a two-dimensional matrix, as a result of a photolithography step and an anisotropic etch step creating the 2D matrix pattern of vias in the top layer. In some cases, the top layer may include a hardmask material, which may retain the pattern of vias (e.g., the vias in the 2D matrix) throughout various processing steps as described with FIGS. 3 through 7. As such, processing steps for forming a channel may simultaneously form channels (e.g., channel 1036-*a* or 1036-*b* filled with a dielectric material) in both directions (e.g., horizontal and vertical direction, namely x-direction and z-direction) and may produce a plurality of 3D rectangular-shaped memory materials simultaneously.

It should be appreciated that the same set of vias (e.g., the sets of first vias and the sets of second vias) used to form the plurality of rectangular-shaped memory material elements (e.g., memory material elements 1035 of diagram 1006, memory material elements 1045 of layout 1007) may also be used to form sets of access lines (e.g., word lines 1010 and bit lines 1015) at electrode layers as described, for example, with reference to layout 850 and layout 855 of FIG. 8. For example, the set of first vias arranged in a row in a horizontal direction (e.g., vias 1040-*a* through 1040-*e* linearly disposed in x-direction) may be used to form a first number of channels filled with a dielectric material at a memory layer comprising a sheet of memory material (e.g., memory layer 320-*a*) and to form a first number of loops of electrode material at an electrode layer (e.g., electrode layer 315-*a* or electrode layer 315-*b*) to form first access lines (e.g., word lines 1010).

Further, each rectangular-shaped memory material element of layout 1007 (e.g., memory material element 1045-*a* through 1045-*d*) may include four corner regions (e.g., region 1050-*a*) where a word line (e.g., 1010-*e*) and a bit line (e.g., 1015-*b*) topologically intersect, and the portion of the memory material element at the topological intersection may be configured to function as a memory cell 105. Hence, the area corresponding to the intersecting access lines (e.g., word line 1010-*e* and bit line 1015-*b*) of the corner region of each rectangular-shaped memory material elements of layout 1007 (e.g., memory material element 1045-*b*) may be equivalent to cell areas 1025 of array structure 1005. In other words, each rectangular-shaped memory material element may support four memory cells 105. In addition, each rectangular-shaped memory material element (e.g., memory material element 1045-*b*) may be coupled with four electrodes—e.g., bit line 1015-*b*, bit line 1015-*c*, word line 1010-*e*, and word line 1010-*f* as illustrated in layout 1007, or word line 1010-*a*, word line 1010-*b*, bit line 1015-*a*, and bit line 1015-*b* as illustrated in array structure 1005.

Figure 11:
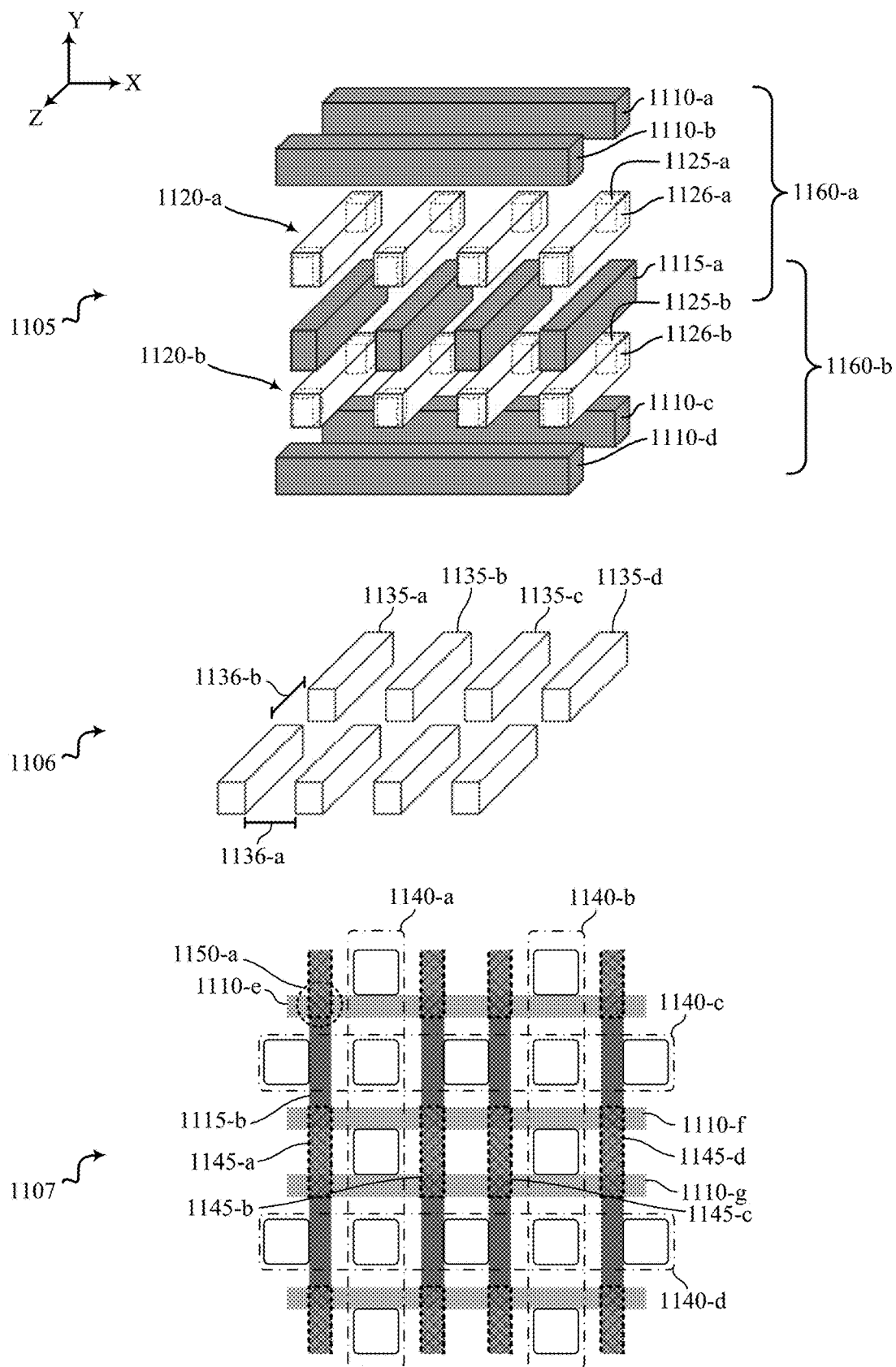

FIG. 11 illustrates an example of a 3D cross-point memory array structure 1105 that may include two or more decks of memory cells and may be formed in accordance with the fabrication techniques of the present disclosure. Array structure 1105 may comprise two decks of memory cells (e.g., an upper deck 1160-*a* and a lower deck 1160-*b*). The two decks of memory cells collectively include two sets of first access lines (e.g., upper deck 1160-*a* includes one set of word lines 1110-*a* and 1110-*b*, and lower deck 1160-*b* includes another set of word lines 1110-*c* and 1110-*d*) that may be concurrently formed, two memory layers of memory materials (e.g., memory layers 1120-*a* and 1120-*b*) that may be concurrently formed, and one set of second access lines (e.g., bit lines 1115) that is common for both decks of memory cells. First access lines (e.g., word lines 1110) may extend in a first direction (e.g., x-direction) while second access lines (e.g., bit lines 1115) may extend in a second, different direction (e.g., z-direction). Each first access lines of the set of first access lines (e.g., word lines 1110) may be parallel to each other first access line of the set of first access lines, and each second access lines of the set of second access lines (e.g., bit lines 1115) may be parallel to each other second access line of the set of second access lines. The first access lines (e.g., word lines 1110) may be substantially orthogonal to the second access lines (e.g., bit lines 1115) as depicted in the array structure 1105.

The upper deck 1160-*a* includes word lines 1110-*a* and 1110-*b*, memory layer 1120-*a*, and bit lines 1115, and the lower deck 1160-*b* includes word lines 1110-*c* and 1110-*d*, memory layer 1120-*b*, and bit lines 1115. Thus, bit lines 1115 are common to both upper deck 1160-*a* and lower deck 1160-*b*. Further, the word lines 1110 may be examples of the first conductive lines formed in the first electrode layer (e.g., layer 315-*a* and layer 315-*b* as described with reference to FIG. 3, D1 layer as described with reference to FIGS. 5-7). Similarly, the bit lines 1115 may be examples of the second conductive lines formed in the second electrode layer (e.g., layer 325 as described with reference to FIG. 3, D2 layer as described with reference to FIGS. 5-7). Lastly, the memory layers 1120 may be examples of the memory layers (e.g., layer 320-*a* and layer 320-*b* as described with reference to FIG. 3, DM layer as described with reference to FIGS. 5-7). Hence, the upper deck 1160-*a* may correspond to an upper deck of memory cells formed in a first subset of the composite stack 305-*a* comprising layer 315-*a*, layer 320-*a*, and layer 325 while the lower deck 1160-*b* may correspond to a lower deck of memory cells formed in a second subset of the composite stack 305-*a* comprising layer 325, layer 320-*b*, and layer 315-*b*.

The array structure 1105 shows horizontal (x- or z-direction) spaces between structures within a layer (e.g., a space between word line 1110-*a* and word line 1110-*b* within a first electrode layer), which may be filled with a dielectric material. The array structure 1105 also shows vertical (y-direction) spaces between layers—e.g., a space between the memory layer 1120-*a* and the first electrode layer including word lines 1110-*a* and 1110-*b*—for illustration purposes only. Such vertical spaces shown in the array structure 1105 may not exist in actual embodiments. In some cases, a portion of an interface between the memory layer and the electrode layer may include other materials, such as an additional electrode material (e.g., carbon) as describe with reference to FIG. 7.

The array structure 1105 includes memory layers 1120-*a* and 1120-*b* corresponding to two respective decks of memory cells. An initial stack of layers (e.g., stack 305-*a* described with reference to FIG. 3) may include one or more memory layers 1120. One or more memory layers 1120, as a part of the initial stack, may include a sheet of a placeholder material. In some cases, the placeholder material may be a third dielectric material as described reference to FIG. 5. In some cases, memory layers 1120, after completing processing steps to build the array structure 1105, may include a plurality of memory material elements, each memory material element in a 3D bar shape as illustrated in diagram 1106.

FIG. 11 includes a diagram 1106 that illustrates a memory layer 1120 in isolation, which includes eight 3D bar-shaped memory material elements (e.g., bar-shaped memory material elements 1135). 3D bar-shaped memory material elements 1135-*a* through 1135-*d* of diagram 1106 may correspond to four of the 3D bar-shaped memory material elements depicted in memory layer 1120-*a* of array structure 1105.

One or more portions of each 3D bar-shaped memory material element (e.g., memory material element 1135-*a*) may comprise memory cells 105 and may operate in conjunction with the first access lines and the second access lines. Such portions of memory material element 1135-*a* may be referred to as cell areas 1125 (e.g., cell area 1125-*a*) and may be located within a memory layer 1120 where first access lines (e.g., word line 1110-*a*) and second access lines (e.g., bit line 1115-*a*) topologically intersect. The cell areas 1125 may correspond to cross-points 465 (e.g., an area of the cross-point associated with widths of access lines) described with reference to FIG. 4. In addition, the cell area 1125 may be an example of cell area 841 or cell area 881 as described with reference to FIG. 8.

Further, the cell area 1125 and the thickness of memory layer 1120 (e.g., thickness of memory material element 1135-*a*) may define a cell volume 1126. Cell volume 1126 may refer to a volume of memory material that functions as a memory cell 105 (e.g., as a portion of memory material configured to store a logic state). In some cases, the memory material may include different crystallographic phases, and different crystallographic phases may correspond to different logical states. In other cases, the memory material may include different local compositions, and different local compositions may correspond to different logical states. In some cases, electrical operations associated with access lines (e.g., a voltage difference between a word line and a bit line) may alter the crystallographic phase of the memory material (or the local composition of the memory material) included in a cell volume 1126 without altering remaining portions of the memory material element 1135. Such electrical delineation between the memory material included in a cell volume 1126 and the remaining portions of the memory material element 1135 may be referred to as electrical confinement of an active cell volume. In some cases, the cell volume 1126 of a memory cell 105 may be referred to as the active cell volume of the memory cell 105.

In addition, one or more physical separations (e.g., channel 1136-*a* or 1136-*b* filled with a dielectric material as illustrated in diagram 1106), which separate each 3D bar-shaped memory material element from each other, may also define the cell volume 1126 and provide physical separation on at least three surfaces of a memory cell 105 (e.g., three surfaces of a cell volume 1126). In some case, such physical separation may be referred to a physical confinement of an active cell volume—e.g., in contrast to electrical confinement of an active cell volume.

In an illustrative example of cell volume 1126, each cell volume 1126 includes one interface defined by electrical confinement and another three interfaces defined by physical confinement. In some cases, a memory cell 105 comprising a memory material defined by physical confinement of active cell volume may be less prone to various undesirable phenomena (e.g., disturbs) during memory cell operations. For example, a memory cell 105 of the array structure 1105 includes an active cell volume defined by three interfaces of physical confinement and two interfaces of electrical confinement. In contrast, a memory cell 105 of the array structure 1005 includes an active cell volume defined by two interfaces of physical confinement and two interfaces of electrical confinement. Thus, a memory cell 105 of the array structure 1105 may be less prone to the undesirable phenomena than a memory cell 105 of the array structure 1005 (and a memory cell 105 of the array structure 905).

FIG. 11 also illustrates a layout 1107. The layout 1107 may be an example of a layout 805 as described with reference to FIG. 8, and may illustrate how a pattern of vias may concurrently form one or more 3D bar-shaped memory material elements 1135 within each of multiple memory layers (e.g., layer 320-*a*, layer 320-*b* described with reference to FIG. 3) included in a stack. As illustrated with reference to FIG. 4A, a set of vias arranged in a row may be used to form a loop (e.g., loop 450) of a filler material at a target layer. In the context of FIG. 4A, as well as, for example, FIGS. 5 and 6, the filler material may be a conductive material, such as an electrode material. But similar techniques may also be used to form a loop of memory material (e.g., chalcogenide material 220) in each memory layer (e.g., layer 320-a, layer 320-b) by using a memory material as the filler material—that is, a portion of a placeholder material (e.g., a third dielectric material) at each memory layer may be replaced by a loop of memory material (e.g., chalcogenide material 220). Subsequently, the loop of memory material may be severed (e.g., separated) into any number of segments by using another set of vias to form channels (e.g., channels such as channel 420) at the memory layer, where the channels intersect (and thereby separate, divide, sever) the loop of memory material into multiple memory material elements. The channels that sever the loops of memory material may be filled with a dielectric material.

In the illustrative example using the layout 1107, one or more sets of first vias, each set of first vias arranged in a row in a vertical direction (z-direction)—e.g., either of groups of five vias 1140-a and 1140-b—may be used to form, in some cases concurrently, a first number of loops of memory material (e.g., two loops of memory material) within each of one or more memory layers (e.g., memory layers 320-a or 320-b). The sets of first vias may be formed at a top layer (e.g., layer 310) of a composite stack (e.g., stack 305-a), as a result of a photolithography step and an anisotropic etch step. A first channel may be formed using one of the sets of first vias at the memory layer by removing a portion of a placeholder material from the memory layer through the set of first vias. As such, the first channel may be aligned with the set of first vias. Subsequently, a memory material may fill the first channel. Then, a second channel may be formed within the first channel filled with the memory material by removing a portion of memory material using the same set of first vias. The second channel may be narrower than the first channel and may be filled with a dielectric material. Filling the second channel with a dielectric material may create a loop (e.g., a band, ring, or racetrack) of memory material that surrounds the dielectric material in the second channel.

Subsequently, one or more sets of second vias, each set of second vias arranged in a row in a horizontal direction (x-direction)—e.g., either of groups of five vias 1140-c and 1140-d—may be used to form, in some cases concurrently, a second number of horizontal channels (e.g., two horizontal channels) filled with a dielectric material at each of the one or more memory layers comprising a first number of loops of memory material. The sets of second vias may be formed at a top layer (e.g., layer 310) of a composite stack (e.g., stack 305-a), as a result of a photolithography step and an anisotropic etch step. As depicted in the layout 1107, the sets of second vias arranged in a row in the horizontal direction (x-direction) may each intersect the sets of first vias arranged in a row in the vertical direction (z-direction). Formation of horizontal (x-direction) channels (e.g., a third channel) filled with a dielectric material may divide (e.g., sever or separate) the loops of memory material at the memory layer (e.g., layer 320-a) to produce a plurality of discrete sections (e.g., bars) of memory material at the memory layer (e.g., memory material 1145-a through 1145-d). In other words, the third channel may separate the memory material within the first channel (e.g., the band of memory material) into a plurality of memory material elements (e.g., memory material elements 1135 of diagram 1106).

Thus, two sets of vias—e.g., the sets of first vias and the sets of second vias—may respectively be used to form a number of loops of memory material at one or more memory layers (e.g., layer 320-a, layer 320-b) that initially comprises a placeholder material (e.g., using the sets of first vias) and to divide the loops of memory material into a plurality of 3D bar-shaped memory material elements (e.g., using the sets of second vias).

It should be appreciated that the same sets of vias (e.g., the sets of first vias and the sets of second vias) used to form the plurality of 3D bar-shaped memory material elements at the memory layer may also be used to form sets of access lines (e.g., word lines 1110 and bit lines 1115) at electrode layers as described, for example, with reference to layout 850 and layout 855 of FIG. 8. For example, the sets of first vias (e.g., groups of five vias 1140-a and 1140-b) may be used to form a first number of loops of memory material at a memory layer (e.g., memory layer 320-a) and to form a first number of loops of electrode material at an electrode layer (e.g., electrode layer 315-a or electrode layer 315-b).

Further, each bar-shaped memory material element (e.g., memory material element 1145) of layout 1107 may include two end regions (e.g., region 1150-a) where a word line (e.g., 1110-e) and a bit line (e.g., 1115-b) topologically intersect, and the portion of the memory material element at the topological intersection may be configured to function as a memory cell 105. Hence, the area corresponding to the intersecting access lines (e.g., word line 1110-e and bit line 1115-b) of the end regions of each bar-shaped memory material element of layout 1107 may be equivalent to cell area 1125 of array structure 1105. In other words, each bar-shaped memory material element may support two memory cells 105. In addition, each bar-shaped memory material element (e.g., 1145-a) may be coupled with at least three electrodes—e.g., word line 1110-f, word line 1110-g, and bit line 1115-b as illustrated in layout 1107, or word line 1110-a, word line 1110-b, and bit line 1115-a as illustrated in array structure 1105.

In some cases, an apparatus that includes a 3D cross-point memory array structure (e.g., array structure 1005 or 1105 that may be built using the fabrication techniques described with reference to FIGS. 10 and 11) may include a stack that comprises a first electrode layer, a second electrode layer, and a memory layer between the first electrode layer and the second electrode layer, a plurality of first electrodes in the first electrode layer, a plurality of second electrodes in the second electrode layer, and a plurality of memory material elements at the memory layer, each memory material element coupled at least one first electrode of the plurality of first electrodes and at least two second electrodes of the plurality of second electrodes.

In some examples of the apparatus described above, each memory material element is coupled with two first electrodes and one second electrode. In some examples of the apparatus described above, each memory material element is coupled with two first electrodes and two second electrodes. In some examples of the apparatus described above, each memory material element is coupled with the at least one first electrode through a conformal liner that is in contact with three surfaces of the at least one first electrode. In some examples of the apparatus described above, separation distances between first electrodes within the plurality of first electrodes are non-uniform. In some examples of the apparatus described above, a subset of the plurality of first electrodes have a common longitudinal axis. In some examples of the apparatus described above, a first electrode has at least one dimension smaller than a minimum feature size. In some examples of the apparatus described above, each memory material element comprises a chalcogenide material.

In some cases, an apparatus that includes a 3D cross-point memory array structure (e.g., array structure 905, 1005 or 1105 that may be built using the fabrication techniques described with reference to FIGS. 9 through 11) may include a stack that comprises a first electrode layer, a second electrode layer, and a memory layer between the first electrode layer and the second electrode layer, a plurality of first electrodes in the first electrode layer, a plurality of second electrodes in the second electrode layer, and a memory material element at the memory layer, the memory material element configured to comprise a plurality of memory cells.

In some examples of the apparatus described above, the memory material element is configured to comprise two memory cells. In some examples of the apparatus described above, the memory material element is configured to comprise four memory cells. In some examples of the apparatus described above, the memory material element comprises a sheet of memory material perforated by a plurality of dielectric plugs. In some examples of the apparatus described above, the plurality of dielectric plugs comprises a first row of dielectric plugs in a first direction, and a second row of dielectric plugs in a second direction different from the first direction. In some examples of the apparatus described above, a dielectric plug is common to the first row of dielectric plugs and the second row of dielectric plugs. In some examples of the apparatus described above, the memory material element comprises a chalcogenide material.

Figure 12:
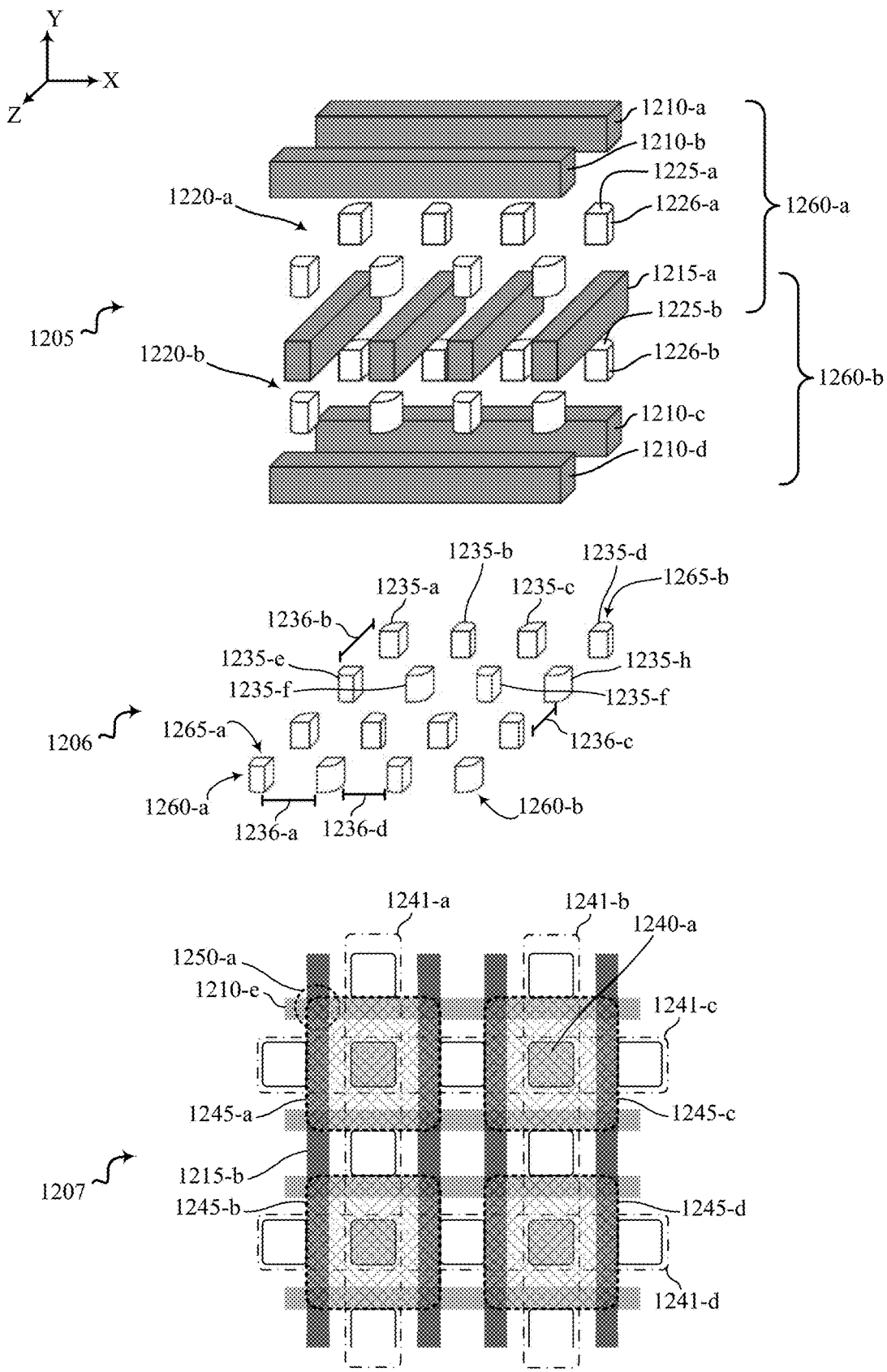

FIG. 12 illustrates an example of a 3D cross-point memory array structure 1205 that may include two or more decks of memory cells and may be formed in accordance with the fabrication techniques of the present disclosure. Array structure 1205 may comprise two decks of memory cells (e.g., an upper deck 1260-a and a lower deck 1260-b). The two decks of memory cells collectively include two sets of first access lines (e.g., upper deck 1260-a includes one set of word lines 1210-a and 1210-b, and lower deck 1260-b includes another set of word lines 1210-c and 1210-d) that may be concurrently formed, two memory layers of memory materials (e.g., memory layers 1220-a and 1220-b) that may be concurrently formed, and one set of second access lines (e.g., bit lines 1215) that is common for both decks of memory cells. First access lines (e.g., word lines 1210) may extend in a first direction (e.g., x-direction) while second access lines (e.g., bit lines 1215) may extend in a second, different direction (e.g., z-direction). Each first access lines of the set of first access lines (e.g., word lines 1210) may be parallel to each other first access line of the set of first access lines, and each second access lines of the set of second access lines (e.g., bit lines 1215) may be parallel to each other second access line of the set of second access lines. The first access lines (e.g., word lines 1210) may be substantially orthogonal to the second access lines (e.g., bit lines 1215) as depicted in the array structure 1205.

The upper deck 1260-a includes word lines 1210-a and 1210-b, memory layer 1220-a, and bit lines 1215, and the lower deck 1260-b includes word lines 1210-c and 1210-d, memory layer 1220-b, and bit lines 1215. Thus, bit lines 1215 are common to both upper deck 1260-a and lower deck 1260-b. Further, the word lines 1210 may be examples of the first conductive lines formed in the first electrode layers (e.g., layer 315-a and layer 315-b as described with reference to FIG. 3, D1 layer as described with reference to FIGS. 5-7). Similarly, the bit lines 1215 may be examples of the second conductive lines formed in the second electrode layer (e.g., layer 325 as described with reference to FIG. 3, D2 layer as described with reference to FIGS. 5-7). Lastly, the memory layers 1220 may be examples of the memory layers (e.g., layer 320-a and layer 320-b as described with reference to FIG. 3, DM layer as described with reference to FIGS. 5-7). Hence, the upper deck 1260-a may correspond to an upper deck of memory cells formed in a first subset of the composite stack 305-a comprising layer 315-a, layer 320-a, and layer 325 while the lower deck 1260-b may correspond to a lower deck of memory cells formed in a second subset of the composite stack 305-a comprising layer 325, layer 320-b, and layer 315-b.

The array structure 1205 shows horizontal (x- or z-direction) spaces between structures within a layer (e.g., a space between word line 1210-a and word line 1210-b within a first electrode layer), which may be filled with a dielectric material. The array structure 1205 also shows vertical (y-direction) spaces between layers—e.g., a space between the memory layer 1220-a and the first electrode layer including word lines 1210-a and 1210-b—for illustration purposes only. Such vertical spaces shown in the array structure 1205 may not exist in actual embodiments. In some cases, a portion of an interface between the memory layer and the electrode layer may include other materials, such as an additional electrode material (e.g., carbon) as describe with reference to FIG. 7.

The array structure 1205 includes memory layers 1220-a and 1220-b corresponding to two respective decks of memory cells. An initial stack of layers (e.g., stack 305-a described with reference to FIG. 3) may include one or more memory layers 1220. One or more memory layers 1220, as a part of the initial stack, may include a sheet of a placeholder material. In some cases, the placeholder material may be a third dielectric material as described reference to FIG. 5. In some cases, memory layers 1220, after completing processing steps to build the array structure 1205, may include a plurality of memory material elements, each memory material element in a 3D wedge shape as illustrated in diagram 1206.

FIG. 12 includes a diagram 1206 that illustrates a memory layer 1220 in isolation, which includes sixteen 3D wedge-shaped (e.g., at least two planar surfaces and at least one curved surface) memory material elements (e.g., memory material elements 1235). 3D wedge-shaped memory material elements 1135-a through 1135-h of diagram 1206 may correspond to eight 3D wedge-shaped memory material elements as depicted in memory layer 1220-a of array structure 1205.

Each 3D wedge-shaped memory material element as a whole (or substantially as a whole) may comprise memory cells 105 and may operate in conjunction with the first access lines and the second access lines. Thus, an area (e.g., an area corresponding to a top-down view of the 3D wedge-shaped memory material element) of memory material element 1235-a as a whole may be referred to as cell areas 1225 (e.g., cell area 1225-a) and may be located within a memory layer 1220 where first access lines (e.g., word line 1210-a) and second access lines (e.g., bit line 1215-a) topologically intersect. The cell areas 1225 may correspond to crosspoints 465 (e.g., an area of the cross-point associated with widths of access lines) described with reference to FIG. 4. In addition, the cell area 1225 may be an example of cell area 841 or cell area 881 as described with reference to FIG. 8.

Further, cell area 1225 and the thickness of memory layer 1220 (e.g., thickness of 3D wedge-shaped memory material element 1235-a) may define a cell volume 1226. Cell volume 1226 may refer to a volume of memory material that functions as a memory cell 105. In some cases, the memory material may include different crystallographic phases, and different crystallographic phases may correspond to different logical states. In other cases, the memory material may include different local compositions, and different local compositions may correspond to different logical states. In some cases, electrical operations associated with access lines (e.g., a voltage difference between a word line and a bit line) may alter the crystallographic phase of the memory material (or the local composition of the memory material) included in an entire cell volume 1226 (or substantially entire cell volume 1226). In some cases, the cell volume 1226 of a memory cell 105 may be referred to as the active cell volume of the memory cell 105.

Each of the 3D wedge-shaped memory material elements may be surrounded by physical separations (e.g., each of channel 1236-*a* through 1236-*d* filled with a dielectric material as illustrated in diagram 1206) on all sides except surfaces coupled with a word line and a bit line, or an intervening electrode material (e.g., carbon) as described with reference to FIG. 7—that is, each 3D wedge-shaped memory material element may be fully physically confined (e.g., negligible electrical confinement of the active cell volume 1226). Further, an area of 3D wedge-shaped memory material element (e.g., the area corresponding to a top-down view of the 3D wedge-shaped memory material element 1235) may approximately correspond to an area corresponding to the intersecting access lines (e.g., a word line and a bit line).

In some cases, a memory cell 105 comprising a memory material defined by physical confinement of active cell volume may be less prone to various undesirable phenomena (e.g., disturbs) during memory cell operations. For example, a memory cell 105 of the array structure 1205 includes an active cell volume defined by four interfaces of physical confinement (e.g., full physical confinement) and no (or negligible) interfaces of electrical confinement. In contrast, a memory cell 105 of the array structure 1105 includes an active cell volume defined by three interfaces of physical confinement and one interface of electrical confinement. Thus, a memory cell 105 of the array structure 1205 may be less prone to the undesirable phenomena than a memory cell 105 of the array structure 1105 (and a memory cell 105 of the array structure 1005 or a memory cell 105 of the array structure 905).

FIG. 12 also illustrates a layout 1207. The layout 1207 may be an example of a layout 805 as described with reference to FIG. 8, and may illustrate how a pattern of vias may form one or more 3D wedge-shaped memory material elements within each of multiple memory layers (e.g., layer 320-*a*, layer 320-*b* described with reference to FIG. 3). As described with reference to FIG. 4A, a via (e.g., via 410) may be used to form a cavity (e.g., a cavity 415) in a placeholder material (e.g., a dielectric material) at a memory layer, and the cavity may be filled with a filler material (e.g., a memory material). Accordingly, a 3D disc of memory material (e.g., chalcogenide material 220) may be formed in the memory layer (e.g., layer 320-*a*, layer 320-*b*) when the filler material is a memory material—that is, a portion of placeholder material (e.g., a third dielectric material) at the memory layer may be replaced by a disc of memory material (e.g., chalcogenide material 220). Subsequently, the disc of memory material may be severed (e.g., separated) into any number of segments by using sets of vias to form channels (e.g., channels such as channel 420) at the memory layer, where the channels intersect (and thereby separate, divide, sever) the disc of memory material into multiple discrete memory material elements. The channels that sever the disc of memory material may be filled with a dielectric material.

In the illustrative example using the layout 1207, a via that is common to multiple sets (e.g., rows) of vias (e.g., via 1240-*a*, which is illustrated in layout 1207, like other common vias, as a dark-shaded via) may be used to form cavities, in some cases concurrently, at each of one or more memory layers (e.g., memory layers 320-*a* or 320-*b*). In other words, a via may be used to form a cavity within a memory layer, which includes a placeholder material. The size of the cavity may be configured (e.g., by determining the associated via width along with an amount of the placeholder material to be removed by an isotropic etch step as described with reference to FIGS. 3 through 7) such that a portion of the cavity may overlap in the x- or z-direction with a cross-sectional area of a word line and a bit line (e.g., an area of topologically intersecting portion of a word line and a bit line) that may be above and below the cavity, respectively, in the y-direction. Subsequently, a memory material (e.g., chalcogenide material 220) may fill the cavity, thereby creating a 3D disc of memory material 1245 (e.g., 3D discs filled with a memory material) within each cavity. Thus, the size of each 3D disc 1245 (e.g., 3D discs 1245-*a* through 1245-*d*) may illustrate a size of a cavity that was filled to create the 3D discs 1245

Subsequently, one or more sets of first vias, each set of first via arranged in a row in a vertical direction (z-direction)—e.g., either of groups of five vias 1241-*a* and 1241-*b*—may be used to form, in some cases concurrently, a first number of first channels (e.g., using the techniques described in reference to FIG. 4) filled with a dielectric material within a memory layer (e.g., memory layers 320-*a* or 320-*b*) comprising the 3D discs 1245. Formation of the first channels may include removing a portion of the memory material from each 3D disc 1245 using a corresponding set of first vias. As a result, each of the 3D discs may be separated (e.g., bisected) into two portions. In other words, the first channels may separate the 3D discs of memory materials into discrete memory material elements at the memory layer along the z axis.

In some cases, a portion of the memory material of a 3D disc 1245 of memory material may be removed, using the via used to form the 3D disc 1245 and preceding cavity, prior to forming the first channels such that a ring of memory material may be formed at the memory layer. The ring of memory material may surround a vertical axis (e.g., y-direction, a vertical axis with respect to a substrate) of the via used to for the 3D disc 1245. Subsequently, forming the first channels may separate (e.g., bisect) the rings of memory material into discrete memory material elements at the memory layer along the z axis.

In addition, one or more sets of second vias, each set of second vias arranged in a row in a horizontal direction (x-direction)—e.g., groups of five vias 1241-*c* and 1241-*d*—may be used to form, in some cases concurrently, a second number of horizontal channels (e.g., using the techniques described in reference to FIG. 4) filled with a dielectric material within the memory layer. Formation of the second channels may include removing an additional portion of the memory material from each 3D disc 1245 using a corresponding set of second vias. As a result, each of the two discrete portions (e.g., segments) of a 3D disc 1245 resulting from the formation of the corresponding first channel may be further separated (e.g., bisected) along the x-axis, thereby creating four discrete wedge-shaped memory material elements from each disc 1245 (or ring, as applicable) of memory material. In other words, the second channel filled with a dielectric material further separates (e.g., bisects) the memory material of the 3D discs 1245 filled with the memory material into additional discrete memory material elements at the memory layer along the x-axis.

Thus, formation of vertical (z-direction) and horizontal (x-direction) channels filled with a dielectric material using two sets of vias—e.g., the sets of first vias and the sets of second vias—may divide (e.g., separate, sever, split) each of the 3D discs 1245 into four 3D wedge-shaped memory material elements. Each of the four 3D wedge-shaped memory material elements may have a curved surface (e.g., surface 1260 as illustrated in diagram 1206). The curved surface of memory material may be a result of filling the cavity, which may have had a curved outer surface, with the memory material. Additionally, each of the four 3D wedge-shaped memory material elements may have one or more planarized surfaces (e.g., surface 1265 as illustrated in diagram 1206).

In some cases, a top layer (e.g., layer 310) of a stack (e.g., stack 305-*a*) may include a pattern of vias including both the sets of first vias and the sets of second vias, hence forming a set of vias in a two-dimensional matrix, as a result of a photolithography step and an anisotropic etch step creating the 2D matrix pattern of vias in the top layer. In some cases, the top layer may include a hardmask material, which may retain the pattern of vias (e.g., the vias in the 2D matrix) throughout various processing steps as described with FIGS. 3 through 7. As such, processing steps for forming a channel may simultaneously form channels (e.g., channels 1236-*a* through 1236-*d* filled with a dielectric material) in both directions (e.g., horizontal and vertical directions, namely x-direction and z-direction) and may produce four 3D wedge-shaped memory material elements (e.g., memory material elements 1235) from each of the 3D discs of memory material (e.g., 3D discs 1245).

It should be appreciated that the same set of vias (e.g., the sets of first vias and the sets of second vias) used to form the plurality of 3D wedge-shaped memory material elements (e.g., memory material elements 1235 of diagram 1206, memory material elements 1250-*a* of layout 1207) may be used to form sets of access lines (e.g., word lines 1210 and bit lines 1215) at electrode layers as described, for example, with reference to layout 850 and layout 855 of FIG. 8. For example, the set of first vias arranged in a row in a horizontal direction (e.g., groups of five vias 1241-*c* and 1241-*d*) may be used to separate the 3D discs of memory material at a memory layer (e.g., memory layer 320-*a*) and to form a first number of loops of electrode material at an electrode layer (e.g., electrode layer 315-*a* or electrode layer 315-*b*) to form first access lines (e.g., word lines 1210).

Further, each 3D wedge-shaped memory material elements of layout 1207 (e.g., memory material element 1250-*a*) may correspond to an area where a word line (1210-*e*) and a bit line (e.g., 1215-*b*) topologically intersect, and the memory material element in its entirety (substantial entirety) may be configured to function as a memory cell 105. Hence, the area corresponding to the intersecting access lines (e.g., word line 1210-*e* and bit line 1215-*b*) may correspond (substantially correspond) to cell area 1225 of array structure 1205. In other words, each wedge-shaped memory material element may support one memory cells 105. In addition, each wedge-shaped memory material element (e.g., memory material element 1235 or 1250) may be coupled with two electrodes—e.g., word line 1210-*e* and bit line 1215-*b* as illustrated in layout 1207, or word line 1210-*a* and bit line 1215-*a* as illustrated in array structure 1205. In some cases, each wedge-shaped memory material element may be couple with the one first electrode and the one second electrode through a conformal liner (e.g., carbon-based material as described with reference to FIG. 7).

In some cases, an apparatus that includes a 3D cross-point memory array structure (e.g., array structure 1205 that may be built using the fabrication techniques described with reference to FIG. 12) may include a stack that comprises a first layer, a memory layer, and a second layer, the memory layer between the first layer and the second layer, a plurality of first electrodes in the first layer, a plurality of second electrodes in the second layer, and a plurality of memory material elements in the memory layer, each memory material element having a curved surface.

In some examples of the apparatus described above, each memory material element has a planarized surface. In some examples of the apparatus described above, each memory material element is coupled with one first electrode and one second electrode. In some examples of the apparatus described above, a memory material element is coupled with the one first electrode and the one second electrode through a conformal liner. In some examples of the apparatus described above, each memory material element is configured to comprise a single memory cell. In some examples of the apparatus described above, each memory material element comprises a chalcogenide material. In some examples of the apparatus described above, each first electrode of the plurality of first electrodes is parallel to each other first electrode of the plurality of first electrodes, and each second electrode of the plurality of second electrodes is parallel to each other second electrode of the plurality of second electrodes.

Figure 13:
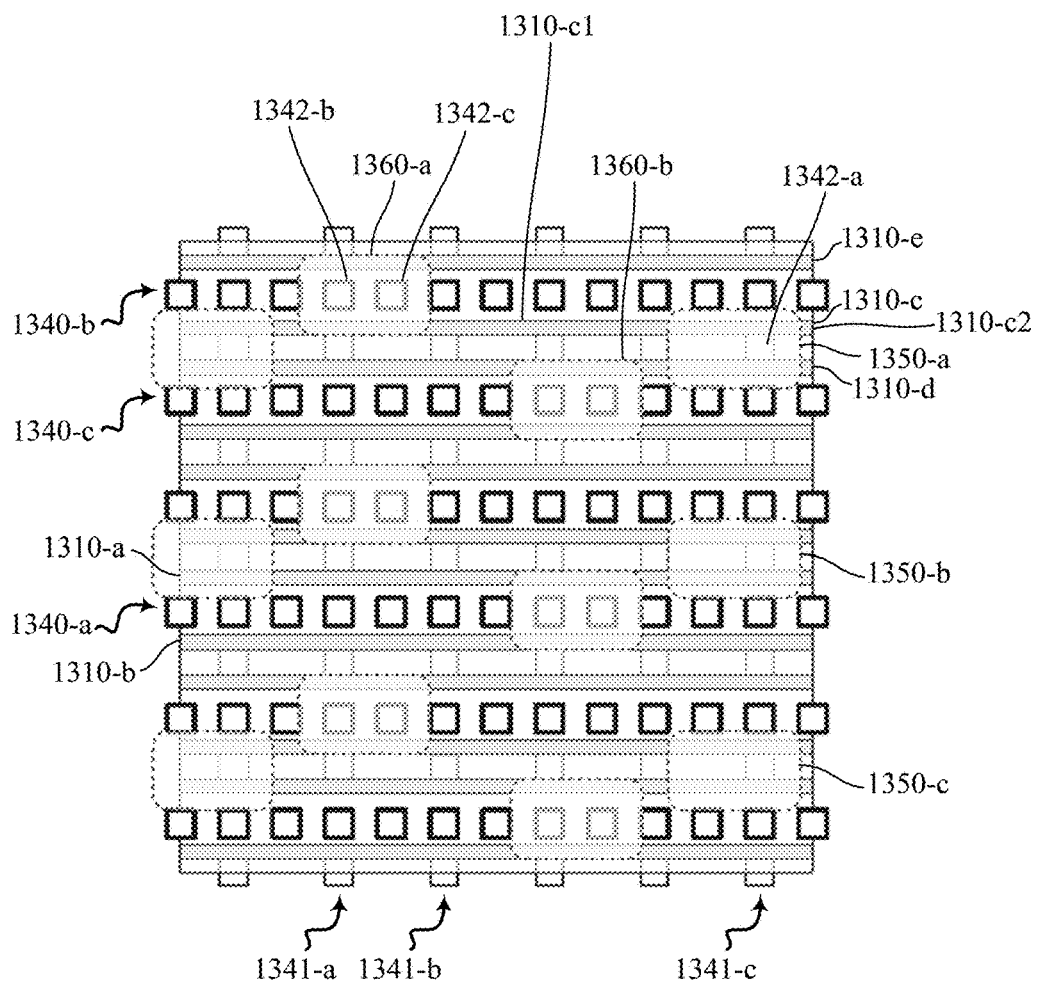
FIG. 13 illustrates an exemplary layout of a socket region that supports a cross-point memory array and related fabrication techniques in accordance with embodiments of the present disclosure.
Figure 14:
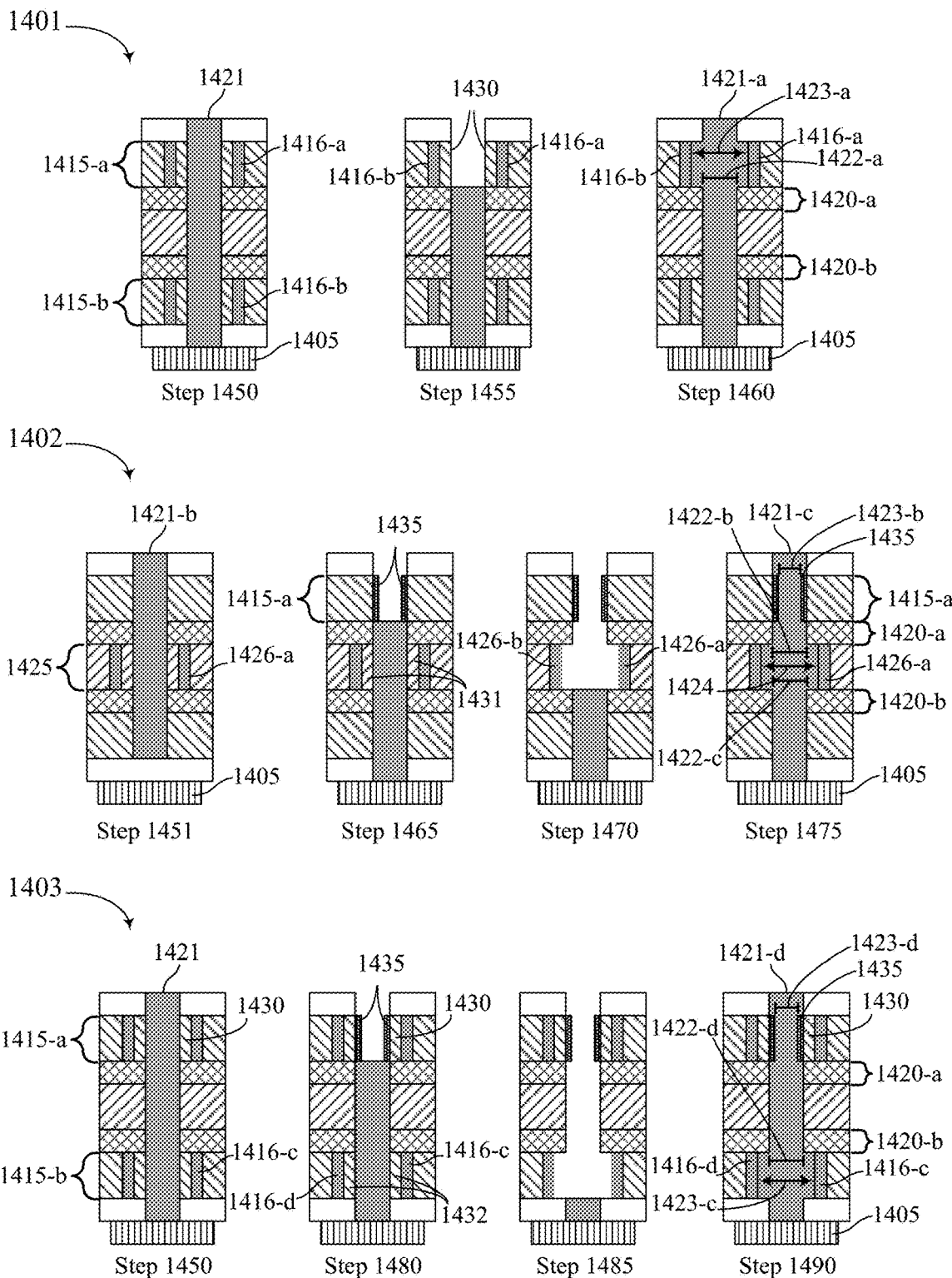
FIG. 14 illustrates example methods of making connections in a socket region that supports a cross-point memory array and related fabrication techniques in accordance with embodiments of the present disclosure.

FIGS. 13 through 14 illustrate various aspects of forming sockets in accordance with fabrication techniques of the present disclosure, which may be used for example, to make a 3D memory array such as the example of memory array 202 illustrated in FIG. 2. In the context of 3D memory array architecture, a socket region may include various interconnects between a memory array and other components (e.g., row decoder 120, sense component 125, or column decoder 130, as described with reference to FIG. 1) in a memory device. In some cases, a socket region may include features (e.g., gaps) created for electrical isolation purposes (e.g., separating loops 450 of conductive material into multiple distinct segments, which may be configured as access lines).

The fabrication techniques described herein may include using a subset of a pattern of vias (e.g., access vias), where the pattern of vias may also be used for concurrent formation of two or more decks of memory cells, each deck comprising a 3D cross-point structure that includes access lines and memory cells. The subset of the pattern of vias may be used for separating (e.g., dividing into a plurality of distinct portions) loops of access line material (e.g., loops 455 or loops 460 described with reference to FIG. 4B) such that each loop of access line material may form at least two distinct access lines. In some cases, the subset of vias may also be used to connect access lines (e.g., word lines, bit lines) to various nodes of other components (e.g., row decoder 120, sense component 125, or column decoder 130) of a memory device.

FIG. 13 illustrates an exemplary layout 1301 of a socket region of a 3D cross-point memory array that may include two or more decks of memory cells in accordance with the present disclosure. Layout 1301 illustrates a 2D matrix of vias that includes groups of first vias, each group of first vias arranged in a row in a horizontal direction (x-direction) (e.g., groups of first vias 1340-*a*, 1340-*b*, 1340-*c*), and groups of second vias, each group of second vias arranged in a row in a vertical direction (y-direction) (e.g., groups of second vias 1341-*a*, 1341-*b*, 1341-*c*). Layout 1301 also illustrates a pattern of first openings (e.g., openings 1350-*a* through 1350-*c*) and a pattern of second openings (e.g., openings 1360-*a* through 1360-*b*).

Each group of first vias may have been used to form access lines extending in the horizontal direction (x-direction) (e.g., word line 1310-*a* and word line 1310-*b*) at each first layer of a stack (e.g., layer 315-*a* and layer 315-*b*, as described with FIG. 3). For example, group of first vias 1340-*a* may have been used to form a word line 1310-*a* and a word line 1310-*b* at each first layer of the stack. As such, the exemplary layout 1301 may depict a socket region for word lines (e.g., the access lines extending in the horizontal direction). In some cases, access lines extending in vertical direction (y-direction) (e.g., bit lines) may be absent in the socket region for word lines. Similarly, a socket region for bit lines may be formed (not shown) in a different area of the 3D cross-point memory array using similar techniques. In some cases, word lines may be absent in the socket region for bit lines.

First openings (e.g., opening 1350-*a*) may be a part of a pattern of first openings created using a first socket mask (e.g., SM1 mask). SM1 mask may be used to form a number of first openings (e.g., each opening corresponding to lack of photoresist or lack of hardmask material) in a top (e.g., exposed) layer of a stack, which may facilitate the formation of structures in one or more lower (e.g., buried) layers of the stack. The stack may include any number of electrode layers and memory layers. The first openings (e.g., opening 1350-*a*) may overlap with a via (e.g., via 1342-*a*). As illustrated in layout 1301, the first openings may have a relaxed design rule when compared to the first vias and the second vias—e.g., a size of a first opening or a distance between first openings may be greater than a size of vias or a distance between vias.

A first opening may serve as a via of a different geometry (e.g., as a via larger than either a first via or a second via) for the purpose of socket formation, or may isolate one or more first vias or second vias (e.g., make the one or more first vias or second vias accessible for a subsequent processing step while making one or more other first vias or second vias inaccessible for the subsequent processing step). In some cases, a first opening may be used to form a gap in a target electrode by anisotropically etching through the target electrode, thereby dividing the target electrode into two distinct electrodes (e.g., two distinct access lines). For example, opening 1350-*a* may create a gap in word line 1310-*c* and word line 1310-*d* by anisotropically etching through the electrode material of word line 1310-*c* as well as the electrode material of word line 1310-*d*. Word line 1310-*c* may have been formed using group of first vias 1340-*b*, and word line 1310-*d* may have been formed using group of second vias 1340-*c*. Word line 1310-*c* may be parallel (or substantially parallel) to word line 1310-*d*.

In other cases, a first opening (e.g., opening 1350-*a*) may facilitate forming a gap in a target electrode by forming a second via hole through a via with which the first opening overlaps (e.g., via 1342-*a*, which may be included in group of second vias 1341-*c*). The second via hole (e.g., the second via hole corresponding to via 1342-*a*) may extend through a stack to a target layer that includes a target electrode in which a gap is to be created. Subsequently, a portion of the target electrode may be removed through the second via hole, and through the overlapping first opening—e.g., by using an isotropic etch step. As such, the target electrode (e.g., an access line at the target layer) may be separated into at least two distinct segments isolated from each other.

As a result of creating a gap in a target electrode, either using the first opening (e.g., opening 1350) to anisotropically etch through the target electrode material at an electrode layer or using the first opening (e.g., opening 1350) to create a second via hole corresponding to a via with which the first opening overlaps (e.g., a second via hole corresponding to via 1342-*a*) and isotropically etching the target electrode material at an electrode layer (e.g., the electrode layer comprising the target electrode material), an access line (e.g., an electrode comprising the target electrode material) may become isolated from a collinear access line at the electrode layer. For example, a word line 1310-*c* (e.g., an access line) may have at least two segments, namely a left segment (e.g., segment 1310-*c*1) and a right segment (e.g., segment 1310-*c*2) with respect to opening 1350-*a*, and the left segment may be isolated from and collinear with the right segment (e.g., may be a collinear access line). In some cases, a subset of the plurality of first electrodes (e.g., word lines) may have a common longitudinal axis as a result of creating a gap in the first electrode.

Second openings (e.g., opening 1360-*a*) may be a part of a pattern of second openings created using a second socket mask (SM2 mask) that defines a number of second openings (e.g., lack of photoresist or lack of hardmask material). SM2 mask may be used to form a number of second openings (e.g., each opening corresponding to lack of photoresist or lack of hardmask material) in a top (e.g., exposed) layer of a stack, which may facilitate the formation of structures in one or more lower (e.g., buried) layers of the stack. The stack may include any number of electrode layers and memory layers. The second openings (e.g., opening 1360-*a*) may overlap with one or more vias (e.g., via 1342-*b*, via 1342-*c*) that may have been used to form a pair of access lines. For example, via 1342-*b* (and via 1342-*c*) may be a part of a group of first vias (e.g., group of first vias 1340-*b*), which may have been used to form word lines 1310-*c* and 1310-*e*. As illustrated in layout 1301, the second openings may have a relaxed design rule when compared to the first vias and the second vias—e.g., a size of a second opening or a distance between second openings may be greater than a size of vias or a distance between vias.

In some cases, the second openings may be used to make connections (e.g., interconnects) between a number of access lines (e.g., electrodes) within a stack and a conductive element, which may be positioned beneath the stack and may be in contact with the stack (e.g., may be in contact with a lowest layer of the stack, which may comprise an etch-stop material, such as a hardmask material). The stack may include an electrode layer comprising a target electrode material (e.g., the electrode layer may comprise access lines that comprise the electrode material) and a memory layer. The conductive element may correspond to a node of a circuit component of a memory device (e.g., an output node of a row decoder 120, an input node of a sense component 125). In some cases, such a circuit component may be placed in a substrate (e.g. substrate 204 described with reference to FIG. 2) or another layer below the stack. The conductive element may be connected to the circuit component through a number of metallic layers and interconnects between the metallic layers.

In some cases, a second opening (e.g., opening 1360-*a*) may facilitate forming a via hole that extends through the stack to reach the conductive element. The via hole may correspond to a via (e.g., via 1342-*b*, via 1342-*c*), with which the second opening may overlap (e.g., opening 1360-*a*). A conductive material may fill the via hole to form a conductive plug that is coupled with the conductive element. Further, the conductive plug may be coupled to a target electrode (e.g., a word line, a bit line) within the stack such that the target electrode may be electrically coupled, by the conductive plug, with the conductive element of a circuit component of a memory device.

FIG. 14 illustrates example methods of making connections between a target electrode at a target layer in a stack to a conductive element in accordance with fabrication techniques of the present disclosure. The stack may comprise a 3D cross-point memory array structure that may include two or more decks of memory cells in accordance with the present disclosure. FIG. 14 illustrates diagram 1401, 1402, and 1403, as illustrative examples of fabrication techniques described herein. The stack of layers in FIG. 14 may correspond to a stack such as the stack described with reference to FIGS. 5 and 6 (e.g., stack 305 described with reference to FIG. 3). For example, the stack of layers in FIG. 14 may include two decks of memory cells, and each deck of memory cells may comprise one sets of word lines (e.g., word lines 910-*a* and 910-*b* of an upper deck 945-*a* or word lines 910-*c* and 910-*d* of a lower deck 945-*b*) and one set of bit lines (e.g., bit lines 915, which may be common for both decks of memory cells).

The fabrication techniques described herein may be used for making connections between any target electrode at any target layer in a stack (e.g., stack 305) to a conductive element. For example, diagram 1401 illustrates making connections between word lines of an upper deck (e.g., word line 910-*a* of upper deck 945-*a*) and a conductive element (e.g., conductive element 1450) while diagram 1403 illustrates making connections between word lines of a lower deck (e.g., word line 910-*c* of lower deck 945-*b*) and a conductive element (e.g., conductive element 1450). Similarly, diagram 1402 illustrates making connections between bit lines (e.g., bit line 915 which may be common for both upper deck 945-*a* and lower deck 945-*b*) and a conductive element (e.g., conductive element 1450). In some cases, a socket region for word lines (e.g., a region where connections between word lines and conductive elements are made) may be located in a different area of a 3D cross-point memory array from an area where a socket region for bit lines (e.g., a region where connections between bit lines and conductive elements are made) may be located.

Diagram 1401 illustrates a method of making a connection between a target electrode (e.g., a target electrode 1416-*a* at D1 layer 1415-*a*) and a conductive element (e.g., conductive element 1405). The target electrode 1416-*a* may be an example of a word line 910 of an upper deck of memory cells (e.g., word line 910-*a*)—e.g., the upper deck of memory cells may be above one or more other decks of memory cells in a memory device.

At processing step 1450, a via hole may be formed through a stack. The via hole may be formed by using a via included in a via pattern (e.g., a via shape in HM layer as described with reference to FIGS. 5 and 6), and a second opening (e.g., opening 1360-*a* described with reference to FIG. 13) may overlap the via used to form the via hole. The via hole may extend through the stack to the conductive element 1405. A conductive material may subsequently fill the via hole. In some cases, the conductive material that fills the via hole may be the same as an electrode material—e.g., the conductive material that fills the via hole and a target electrode in the stack may in some cases comprise the same conductive material. In some cases, a via hole filled with a conductive material may be referred to as a conductive plug (e.g., plug 1421). The structure illustrated at step 1450 of the diagram 1401 may correspond to the structure illustrated at step 530 of the diagram 502 after subsequently having a via hole formed and filled with a conductive material.

At processing step 1455, an etch step may remove a portion of the conductive material from the via hole to expose a dielectric buffer (e.g., buffer 1430) interposed between the via hole and the target electrode (e.g., target electrode 1416-*a*). Subsequently, an etch step (e.g., an isotropic etch step) may remove (e.g., through chemical selectivity) the dielectric buffer 1430 to expose the target electrode (e.g., target electrode 1416-*a*). The removal of the dielectric buffer 1430 that exposes the target electrode (e.g., target electrode 1416-*a*) may simultaneously expose a second target electrode (e.g., target electrode 1416-*b*) within the target electrode layer (e.g., D1 layer 1415-*a*). Further, the second target electrode (e.g., target electrode 1416-*b*) may be located on an opposite side of the via hole relative to the target electrode (e.g., target electrode 1416-*a*). For example, the via used to form the via hole at processing step 1450 may have previously been used to form the target electrode and the second target electrode (e.g., target electrode 1416-*a* and target electrode 1416-*b*, which may have been formed as described above in reference to FIG. 5), and thus the via hole formed at processing step 1450 may be interposed between the target electrode and the second target electrode.

At processing step 1460, a conductive material may fill the space created in the via hole at processing step 1455, thereby coupling the target electrode 1416-*a* (and the second target electrode 1416-*b*) with the conductive element 1405 through the conductive plug (e.g., plug 1421-*a*). At the completion of processing step 1460, the conductive plug 1421-*a* (e.g., via hole filled with a conductive material) may have a first width (e.g., diameter 1422-*a*) at a memory layer (e.g., memory layer 1420) and a second width (e.g., diameter 1423-*a*) at an electrode layer (e.g., D1 layer 1425-*a*). The second width (e.g., diameter 1423-*a*) may be larger than the first width (e.g., diameter 1422-*a*).

In some cases, at the completion of processing step 1460, a target electrode (e.g., the electrode of a word line of an upper deck of memory array) may be connected to a node of a circuit component (e.g., a row decoder 120) by the conductive plug (e.g., plug 1421-*a*) such that a memory controller (e.g., memory controller 140) may activate the target electrode (e.g., a word line 910-*a*) of the upper deck of memory cells (e.g., upper deck 945-*a*).

Diagram 1402 illustrates a method of making a connection between a target electrode (e.g., a target electrode 1426-*a* at D2 layer 1425) and a conductive element (e.g., conductive element 1405). The target electrode 1426-*a* may be an example of a bit line (or other type of access line) that is common for both an upper and a lower deck of memory cells (e.g., bit line 915-*a*)—e.g., the upper deck of memory cells may be above one or more other decks of memory cells in a memory device, including the lower deck of memory cells.

At processing step 1451, a via hole may be formed through a stack. The via hole may be formed by using a via included in a via pattern (e.g., a via shape in HM layer as described with reference to FIGS. 5 and 6), and a second opening (e.g., opening 1360-*a* described with reference to FIG. 13) may overlap the via used to form the via hole. The via hole may extend through the stack to the conductive element 1405. A conductive material may subsequently fill the via hole. In some cases, the conductive material that fills the via hole may be the same as an electrode material—e.g., the conductive material that fills the via hole and a target electrode in the stack may in some cases comprise the same conductive material. In some cases, a via hole filled with a conductive material may be referred to as a conductive plug (e.g., plug 1421-b). The structure illustrated at step 1451 of the diagram 1402 may correspond to the structure illustrated at step 630 of the diagram 602 after subsequently having a via hole formed and filled with a conductive material. In some cases, processing step 1450 and processing step 1451 may occur concurrently—that is, plug 1421 and plug 1421-b may be formed simultaneously.

At processing step 1465, an etch step may remove a portion of the conductive material from the via hole such that a dielectric layer (e.g., D1 layer 1415-a) may be exposed. Subsequently, a layer of a conformal liner (e.g., liner 1435) may be formed at the exposed surface of the dielectric layer (e.g., D1 layer 1415-a). The conformal liner (e.g., liner 1435) may comprise any material configured to protect the exposed surface of the dielectric layer (e.g., D1 layer 1415-a) to prevent subsequent etch steps from removing the dielectric material of D1 layer 1415-a. In some cases, formation of a conformal liner may be omitted if selectivity associated with subsequent etch steps may be sufficient to preserve (substantially preserve) the dielectric material of D1 layer 1415-a.

At processing step 1470, an etch step may remove an additional portion of the conductive material from the via hole to expose another dielectric buffer (e.g., buffer 1431) interposed between the via hole and the target electrode (e.g., target electrode 1426-a). Subsequently, an etch step (e.g., an isotropic etch step) may remove (e.g., through chemical selectivity) the dielectric buffer 1431 to expose the target electrode (e.g., the target electrode 1426-a). The removal of the dielectric buffer 1431 that exposes the target electrode (e.g., target electrode 1426-a) may simultaneously expose a second target electrode (e.g., target electrode 1426-b) within the target electrode layer (e.g., D2 layer 1425). Further, the second target electrode (e.g., target electrode 1426-b) may be located on an opposite side of the via hole relative to the target electrode (e.g., target electrode 1426-a). For example, the via used to form the via hole at processing step 1451 may have previously been used to form the target electrode and the second target electrode (e.g., target electrode 1426-a and target electrode 1426-b, which may have been formed as described above in reference to FIG. 6), and thus the via hole formed at processing step 1451 may be interposed between the target electrode and the second target electrode.

At processing step 1475, a conductive material may fill the space created in the via hole at processing step 1470, thereby coupling the target electrode 1426-a (and the second target electrode 1426-b) with the conductive element 1405 through the conductive plug (e.g., plug 1421-c). At the completion of processing step 1475, the conductive plug 1421-c (e.g., via hole filled with a conductive material) may have a first width (e.g., either diameter 1422-b or diameter 1422-c) at a memory layer (e.g., a memory layer 1420) and a second width (e.g., diameter 1424) at an electrode layer (e.g., D2 layer 1425). The second width (e.g., diameter 1424) may be larger than the first width (e.g., either diameter 1422-b or diameter 1422-c). Further, the conformal liner 1435 may be interposed between the conductive plug 1421-c (e.g., via hole filled with a conductive material) and a dielectric material (e.g., first dielectric material of D1 layer 1415-a) at the completion of processing step 1475. Thus, the conductive plug 1421-c may have a third width (e.g., diameter 1423-b) at another electrode layer (e.g., D1 layer 1415-a). In some cases, the third with (e.g., diameter 1423-b) may be less than the first width (e.g., either diameter 1422-a or diameter 1422-b).

In some cases, at the completion of processing step 1475, a target electrode (e.g., the electrode of a bit line that may be common to both upper and lower deck of memory array) may be connected to (e.g. coupled with) a node of a circuit component (e.g., a column decoder 130) by the conductive plug (e.g., plug 1421-c) such that a memory controller (e.g., memory controller 140) may activate the target electrode (e.g., the bit line 915) of both the upper and lower decks of memory cells.

Diagram 1403 illustrates a method of making a connection between a target electrode (e.g., a target electrode 1416-c at another D1 layer 1415-b) and a conductive element (e.g., conductive element 1405). The target electrode 1416-c may be an example of a word line 910 of a lower deck of memory cells (e.g., word line 910-c)—e.g., the lower deck of memory cells may be below one or more other decks of memory cells in a memory device.

Aspects of processing step 1450 of diagram 1403 may be the same as processing step 1450 of diagram 1401. The via structure illustrated in diagram 1401 may be subsequently used to make a connection between the target electrode 1416-a at D1 layer 1415-a and the conductive element 1405 while the via structure illustrated in diagram 1403 may be subsequently used to make a connection between the target electrode 1416-c at D1 layer 1415-b and the conductive element 1405.

At processing step 1480, an etch step may remove a portion of the conductive material from the via hole such that a dielectric layer (e.g., D1 layer 1415-a) may be exposed. The dielectric layer exposed may be the same as the layer that includes dielectric buffer 1430 depicted in diagram 1401. Subsequently, a layer of a conformal liner (e.g., liner 1435) may be formed at the exposed surface of the dielectric buffer (e.g., the buffer 1430 at D1 layer 1415-a). The conformal liner (e.g., liner 1435) may comprise any material configured to protect the exposed surface of the dielectric buffer (e.g., the buffer 1430 at D1 layer 1415-a) to prevent subsequent etch steps from removing the dielectric buffer (e.g., the buffer 1430 at D1 layer 1415-a). In some cases, formation of a conformal liner may be omitted if selectivity associated with subsequent etch steps may be sufficient to preserve (substantially preserve) the dielectric buffer (e.g., the buffer 1430 at D1 layer 1415-a).

At processing step 1485, an etch step may remove an additional portion of the conductive material from the via hole to expose another dielectric buffer (e.g., buffer 1432 at D1 layer 1415-b) interposed between the via hole and the target electrode (e.g., target electrode 1416-c). Subsequently, an etch step (e.g., an isotropic etch step) may remove (e.g., through chemical selectivity) the dielectric buffer 1432 to expose the target electrode (e.g., the target electrode 1416-c). The removal of the dielectric buffer 1432 that exposes the target electrode (e.g., target electrode 1416-c) may simultaneously expose a second target electrode (e.g., target electrode 1416-d) within the target electrode layer (e.g., D1 layer 1415-b).

At processing step 1490, a conductive material may fill the space created in the via hole at processing step 1485, thereby coupling the target electrode 1416-c (and the second target electrode 1416-d) with the conductive element 1405 through the conductive plug (e.g., plug 1421-d). At the completion of processing step 1490, the conductive plug 1421-d (e.g., via hole filled with a conductive material) may have a first width (e.g., diameter 1422-d) at a memory layer (e.g., memory layer 1420) and a second width (e.g., diameter 1423-*c*) at the target electrode layer (e.g., D1 layer 1415-*b*). The second width (e.g., diameter 1423-*c*) may be larger than the first width (e.g., diameter 1422-*d*). Further, the conformal liner 1435 may be interposed between the conductive plug 1421-*d* (e.g., via hole filled with a conductive material) and a dielectric material (e.g., the dielectric buffer 1430 at D1 layer 1415-*a*) at the completion of processing step 1490. Thus, the conductive plug 1421-*d* may have a third width (e.g., diameter 1423-*d*) at another electrode layer (e.g., D1 layer 1415-*a*). In some cases, the third with (e.g., diameter 1423-*d*) may be less than the first width (e.g., 1422-*d*).

In some cases, at the completion of processing step 1490, a target electrode (e.g., the electrode of a word line of a lower deck of memory array) may be connected to a node of a circuit component (e.g., a row decoder 120) by the conductive plug (e.g., plug 1421-*d*) such that a memory controller (e.g., memory controller 140) may activate the target electrode (e.g., a word line 910-*c*) of the lower deck of memory cells (e.g., lower deck 945-*b*).

In some cases, an apparatus that includes a socket region of a 3D cross-point memory array (e.g., a socket region that may be built using the fabrication techniques described with reference to FIGS. 13 and 14) may include a stack that includes an electrode layer and a memory layer, a conductive element in contact with the stack, a conductive plug that extends through the stack and is coupled with the conductive element, the conductive plug having a first width at the memory layer and a second width at the electrode layer, the second width larger than the first width, and a first electrode at the electrode layer, the first electrode coupled with the conductive plug.

In some cases, the apparatus described above may further include a second electrode at the electrode layer, the second electrode coupled with the conductive plug. In some examples of the apparatus described above, the second electrode is isolated from a collinear electrode at the electrode layer. In some examples of the apparatus described above, the first electrode is parallel to the second electrode.

In some cases, the apparatus described above may further include a conformal liner at a second electrode layer within the stack, the conformal liner interposed between the conductive plug and a dielectric material. In some examples of the apparatus described above, the dielectric material is interposed between the conformal liner and a third electrode at the second electrode layer.

Figure 15:
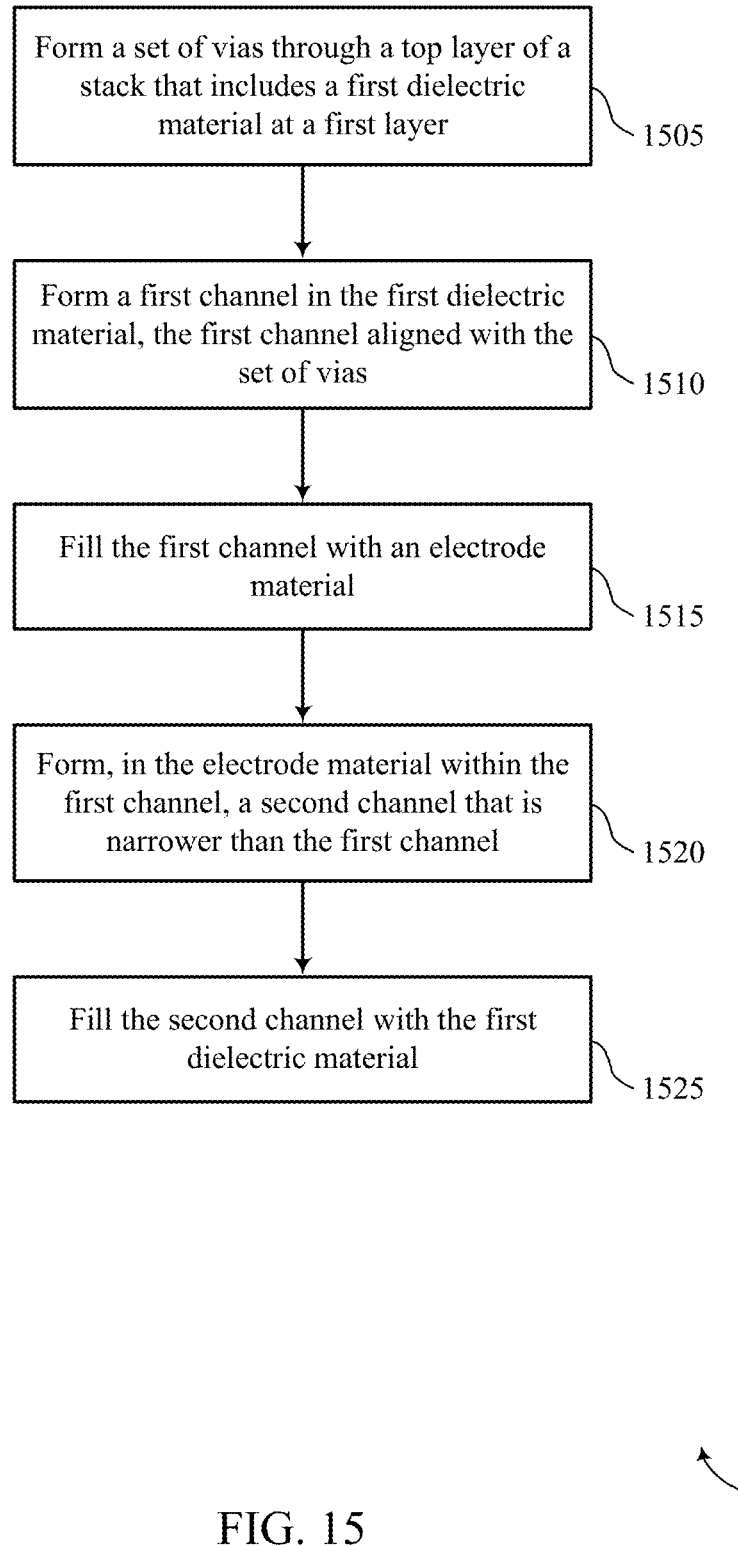
FIGS. 15 through 20 illustrate methods that support a cross-point memory array and related fabrication techniques in accordance with embodiments of the present disclosure.

FIG. 15 shows a flowchart illustrating a method 1500 for a cross-point memory array and related fabrication techniques in accordance with embodiments of the present disclosure. The operations of method 1500 may be implemented by the method described herein, for example with reference to FIGS. 3 through 8.

At block 1505 a plurality of vias may be formed through a top layer of a stack that comprises a first dielectric material at a first layer. The operations of block 1505 may be performed according to the methods described herein. In certain examples, aspects of the operations of block 1505 may be performed as part of one or more processes as described with reference to FIGS. 3 through 8.

At block 1510 a first channel in the first dielectric material may be formed, the first channel aligned with the plurality of vias. The operations of block 1510 may be performed according to the methods described herein. In certain examples, aspects of the operations of block 1510 may be performed as part of one or more processes as described with reference to FIGS. 3 through 8.

At block 1515 the first channel may be filled with an electrode material. The operations of block 1515 may be performed according to the methods described herein. In certain examples, aspects of the operations of block 1515 may be performed as part of one or more processes as described with reference to FIGS. 3 through 8.

At block 1520 a second channel may be formed in the electrode material within the first channel, the second channel that is narrower than the first channel. The operations of block 1520 may be performed according to the methods described herein. In certain examples, aspects of the operations of block 1520 may be performed as part of one or more processes as described with reference to FIGS. 3 through 8.

At block 1525 the second channel may be filled with the first dielectric material. The operations of block 1525 may be performed according to the methods described herein. In certain examples, aspects of the operations of block 1525 may be performed as part of one or more processes as described with reference to FIGS. 3 through 8.

In some cases, the method 1500 may also include forming a conformal liner within the first channel, the conformal liner interposed between the first dielectric material and the electrode material. In some cases, the method 1500 may also include forming a plurality of second vias through the top layer of the stack, wherein the plurality of second vias form a second row of vias that intersects a first row of vias formed by the plurality of vias, and wherein the stack comprises a second dielectric material at a second layer. Some examples of the method 1500 described above may further include forming a third channel in the second dielectric material that may be aligned with the plurality of second vias. Some examples of the method 1500 described above may further include filling the third channel with the electrode material. Some examples of the method 1500 described above may further include forming, in the electrode material within the third channel, a fourth channel that may be narrower than the third channel. Some examples of the method 1500 described above may further include filling the fourth channel with the second dielectric material.

In some examples of the method 1500 described above, forming the first channel comprises forming a plurality of first cavities in the first dielectric material. In some examples of the method 1500 described above, forming the plurality of first cavities comprises removing, through the plurality of vias, a portion of the first dielectric material from the first layer. In some examples of the method 1500 described above, removing the portion of the first dielectric material comprises applying an isotropic etchant that may be chemically selective between the first dielectric material and at least one other material in the stack. In some examples of the method 1500 described above, forming the second channel comprises forming a plurality of second cavities in the electrode material within the first channel.

In some examples of the method 1500 described above, forming the plurality of second cavities comprises removing, through the plurality of vias, a portion of the electrode material from the first channel. In some examples of the method 1500 described above, removing the portion of the electrode material comprises applying an isotropic etchant that may be chemically selective between the electrode material and at least one other material in the stack. In some examples of the method 1500 described above, the stack further comprises a second layer comprising a second dielectric material and a third layer between the first layer and the second layer, the third layer comprising a chalcogenide material. In some examples of the method described above, filling the second channel with the first dielectric material creates a loop of electrode material at the first layer.

Figure 16:
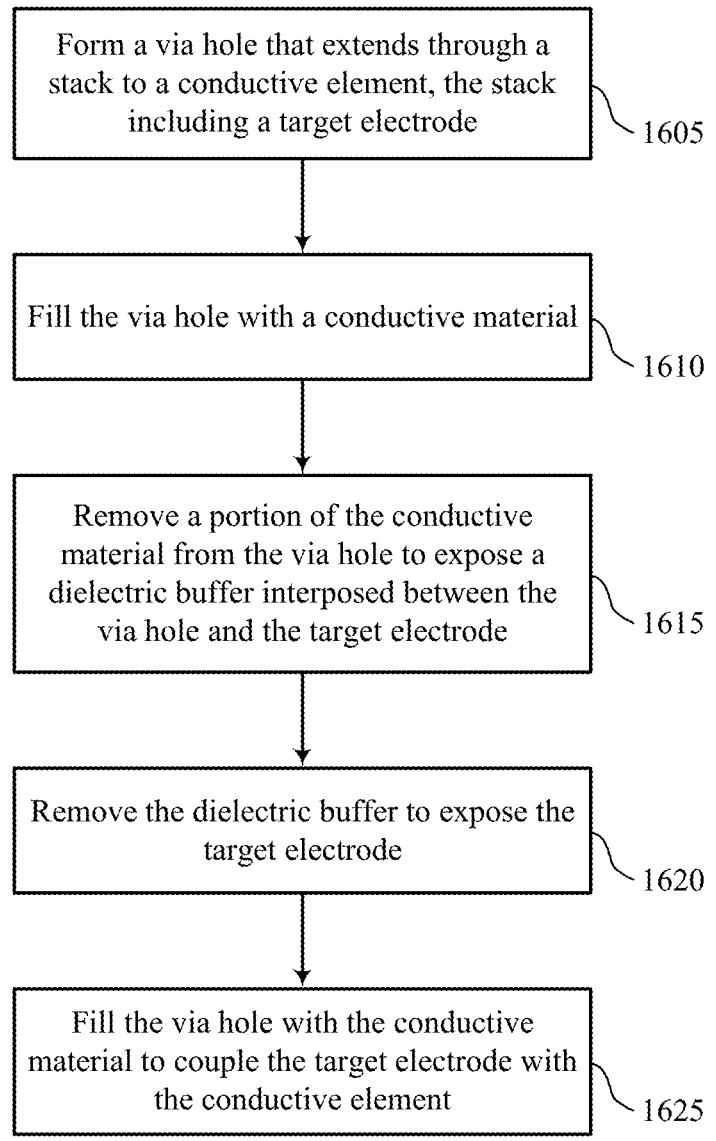

FIG. 16 shows a flowchart illustrating a method 1600 for a cross-point memory array and related fabrication techniques in accordance with embodiments of the present disclosure. The operations of method 1600 may be implemented by the method described herein, for example with reference to FIGS. 3 through 7, 13, and 14.

At block 1605 a via hole may be formed that extends through a stack to a conductive element, the stack comprising a target electrode. The operations of block 1605 may be performed according to the methods described herein. In certain examples, aspects of the operations of block 1605 may be performed as part of one or more processes as described with reference to FIGS. 3 through 7, 13, and 14.

At block 1610 the via hole may be filled with a conductive material. The operations of block 1610 may be performed according to the methods described herein. In certain examples, aspects of the operations of block 1610 may be performed as part of one or more processes as described with reference to FIGS. 3 through 7, 13, and 14.

At block 1615 a portion of the conductive material from the via hole may be removed to expose a dielectric buffer interposed between the via hole and the target electrode. The operations of block 1615 may be performed according to the methods described herein. In certain examples, aspects of the operations of block 1615 may be performed as part of one or more processes as described with reference to FIGS. 3 through 7, 13, and 14.

At block 1620 the dielectric buffer may be removed to expose the target electrode. The operations of block 1620 may be performed according to the methods described herein. In certain examples, aspects of the operations of block 1620 may be performed as part of one or more processes as described with reference to FIGS. 3 through 7, 13, and 14.

At block 1625 the via hole may be filled with the conductive material to couple the target electrode with the conductive element. The operations of block 1625 may be performed according to the methods described herein. In certain examples, aspects of the operations of block 1625 may be performed as part of one or more processes as described with reference to FIGS. 3 through 7, 13, and 14.

In some cases, the method 1600 may also include forming a conformal liner at a different electrode layer within the stack. In some cases, the method 1600 may also include forming a gap in the target electrode.

In some examples of the method 1600 described above, removing the dielectric buffer to expose the target electrode simultaneously exposes a second target electrode within a target electrode layer that includes the target electrode, the second target electrode being on an opposite side of the via hole relative to the target electrode. In some examples of the method 1600 described above, filling the via hole with the conductive material to couple the target electrode with the conductive element further comprises coupling the target electrode with the second target electrode. In some examples of the method 1600 described above, forming the gap in the target electrode comprises anisotropically etching through the target electrode. In some examples of the method 1600 described above, forming the gap in the target electrode comprises forming a second via hole that extends through the stack to at least a target layer that includes the target electrode, and isotropically removing, through the second via hole, a portion of the target electrode.

Figure 17:
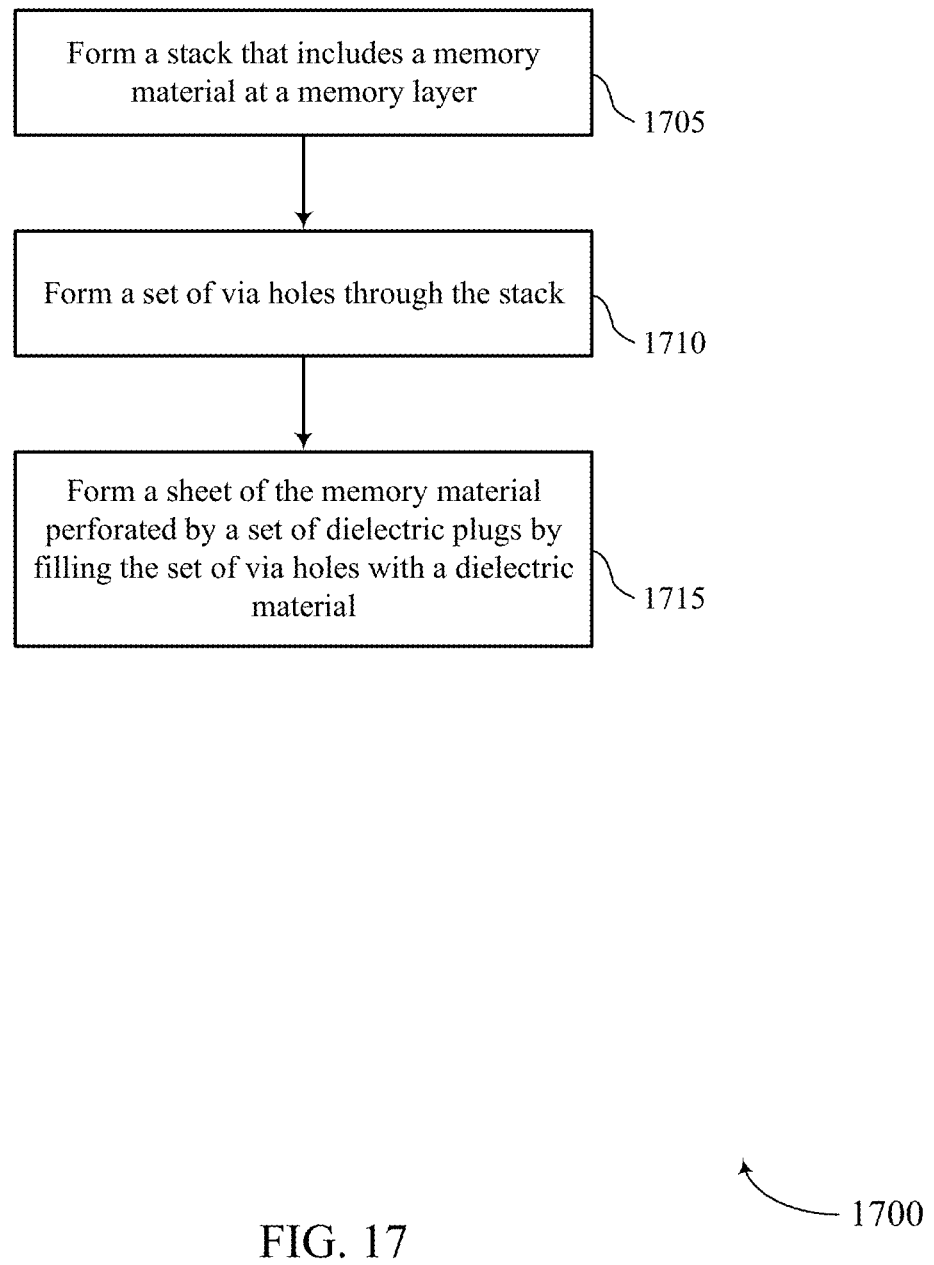

FIG. 17 shows a flowchart illustrating a method 1700 for a cross-point memory array and related fabrication techniques in accordance with embodiments of the present disclosure. The operations of method 1700 may be implemented by the method described herein, for example with reference to FIGS. 3 through 7 and 9.

At block 1705 a stack may be formed that comprises a memory material at a memory layer. The operations of block 1705 may be performed according to the methods described herein. In certain examples, aspects of the operations of block 1705 may be performed as part of one or more processes as described with reference to FIGS. 3 through 7 and 9.

At block 1710 a plurality of via holes may be formed through the stack. The operations of block 1710 may be performed according to the methods described herein. In certain examples, aspects of the operations of block 1710 may be performed as part of one or more processes as described with reference to FIGS. 3 through 7 and 9.

At block 1715 a sheet of the memory material perforated by a plurality of dielectric plugs may be formed by filling the plurality of via holes with a dielectric material. The operations of block 1715 may be performed according to the methods described herein. In certain examples, aspects of the operations of block 1715 may be performed as part of one or more processes as described with reference to FIGS. 3 through 7 and 9.

In some cases, the method 1700 may also include forming a plurality of second via holes through the stack, and filling the plurality of second via holes with a second dielectric material to form additional dielectric plugs in the sheet of memory material. In some cases, the method 1700 may also include forming a first channel in the dielectric material at a first layer of the stack, the first channel aligned with the plurality of via holes, forming, in the electrode material within the first channel, a second channel that may be narrower than the first channel, and filling the second channel with the dielectric material. In some cases, the method 1700 may also include forming a plurality of second via holes through the stack, wherein the plurality of second via holes form a second row of via holes in a second direction that intersects a first direction corresponding to a first row of via holes formed by the plurality of via holes, and wherein the stack comprises a second dielectric material at a second layer, forming a third channel in the second dielectric material, the third channel aligned with the plurality of second via holes, filling the third channel with the electrode material, forming, in the electrode material within the third channel, a fourth channel that may be narrower than the third channel, and filling the fourth channel with the second dielectric material.

In some examples of the method 1700 described above, the plurality of via holes may be disposed in a first linear configuration having a first direction. In some examples of the method 1700 described above, the plurality of second via holes may be disposed in a second linear configuration having a second direction that intersects the first direction. In some examples of the method 1700 described above, the second direction may be orthogonal to the first direction. In some examples of the method 1700 described above, the sheet of the memory material comprises rows of dielectric plugs. In some examples of the method 1700 described above, a dielectric plug may be common to the rows of dielectric plugs.

In some examples of the method 1700 described above, forming the first channel comprises forming a plurality of first cavities in the dielectric material, wherein contiguous first cavities of the plurality of first cavities merge to form the first channel. In some examples of the method 1700 described above, forming the plurality of first cavities comprises removing, through the plurality of via holes, a portion of the dielectric material from the first layer. In some examples of the method 1700 described above, the memory material comprises a chalcogenide material.

Figure 18:
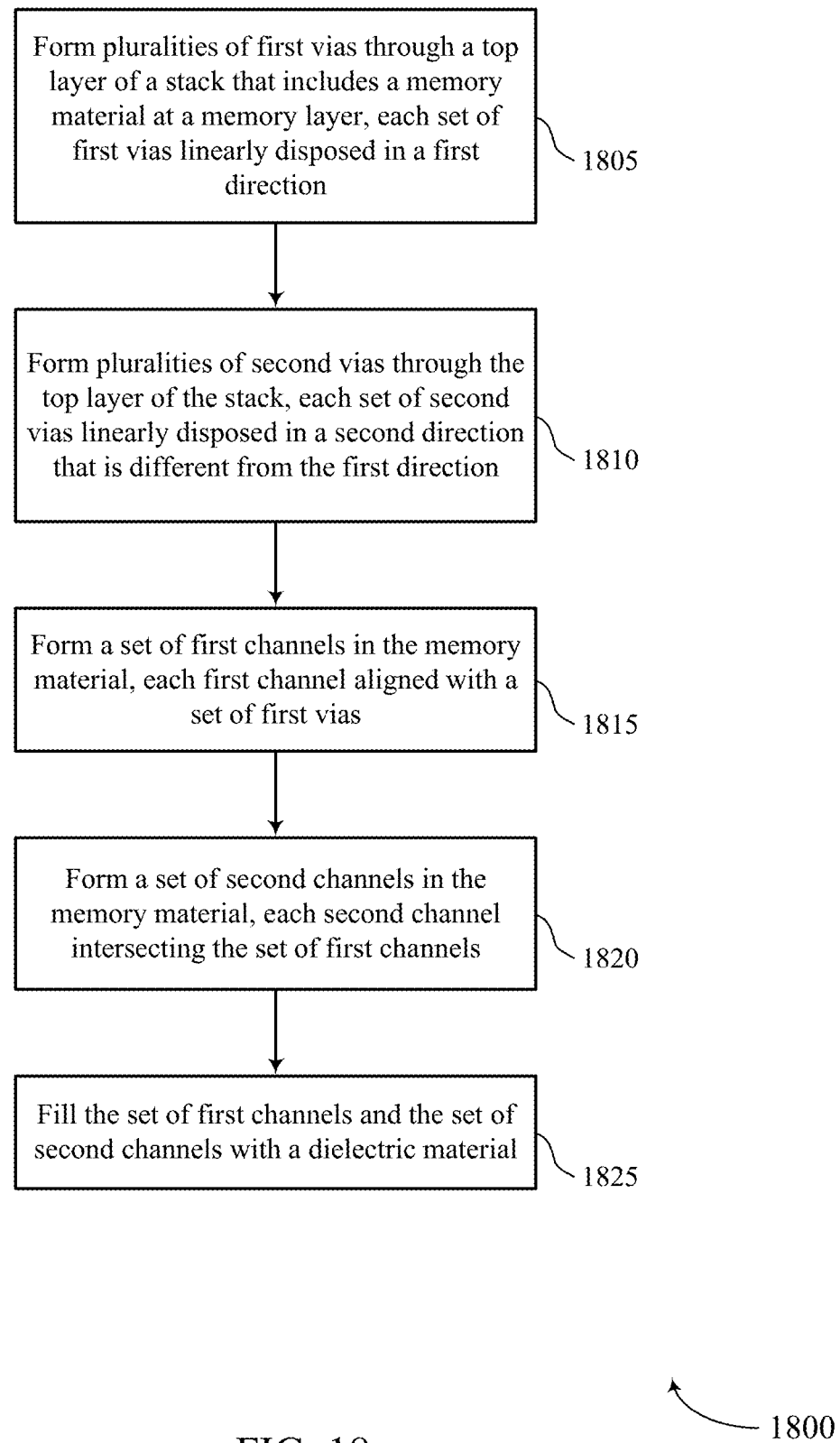

FIG. 18 shows a flowchart illustrating a method 1800 for a cross-point memory array and related fabrication techniques in accordance with embodiments of the present disclosure. The operations of method 1800 may be implemented by the method described herein, for example with reference to FIGS. 3 through 7 and 10.

At block 1805 pluralities of first vias may be formed through a top layer of a stack that comprises a memory material at a memory layer, each plurality of first vias linearly disposed in a first direction. The operations of block 1805 may be performed according to the methods described herein. In certain examples, aspects of the operations of block 1805 may be performed as part of one or more processes as described with reference to FIGS. 3 through 7 and 10.

At block 1810 pluralities of second vias may be formed through the top layer of the stack, each plurality of second vias linearly disposed in a second direction that is different from the first direction. The operations of block 1810 may be performed according to the methods described herein. In certain examples, aspects of the operations of block 1810 may be performed as part of one or more processes as described with reference to FIGS. 3 through 7 and 10.

At block 1815 a plurality of first channels may be formed in the memory material, each first channel aligned with a plurality of first vias. The operations of block 1815 may be performed according to the methods described herein. In certain examples, aspects of the operations of block 1815 may be performed as part of one or more processes as described with reference to FIGS. 3 through 7 and 10.

At block 1820 a plurality of second channels may be formed in the memory material, each second channel intersecting the plurality of first channels. The operations of block 1820 may be performed according to the methods described herein. In certain examples, aspects of the operations of block 1820 may be performed as part of one or more processes as described with reference to FIGS. 3 through 7 and 10.

At block 1825 the plurality of first channels and the plurality of second channels may be filled with a dielectric material. The operations of block 1825 may be performed according to the methods described herein. In certain examples, aspects of the operations of block 1825 may be performed as part of one or more processes as described with reference to FIGS. 3 through 7 and 10.

In some examples of the method 1800 described above, forming the plurality of second channels forms a plurality of memory material elements at the memory layer, each memory material element coupled with at least four electrodes. In some examples of the method 1800 described above, forming the plurality of first channels comprises forming a plurality of first cavities in the memory material, each first cavity corresponding to a first via, wherein contiguous first cavities corresponding to a plurality of first vias form a first channel.

Figure 19:
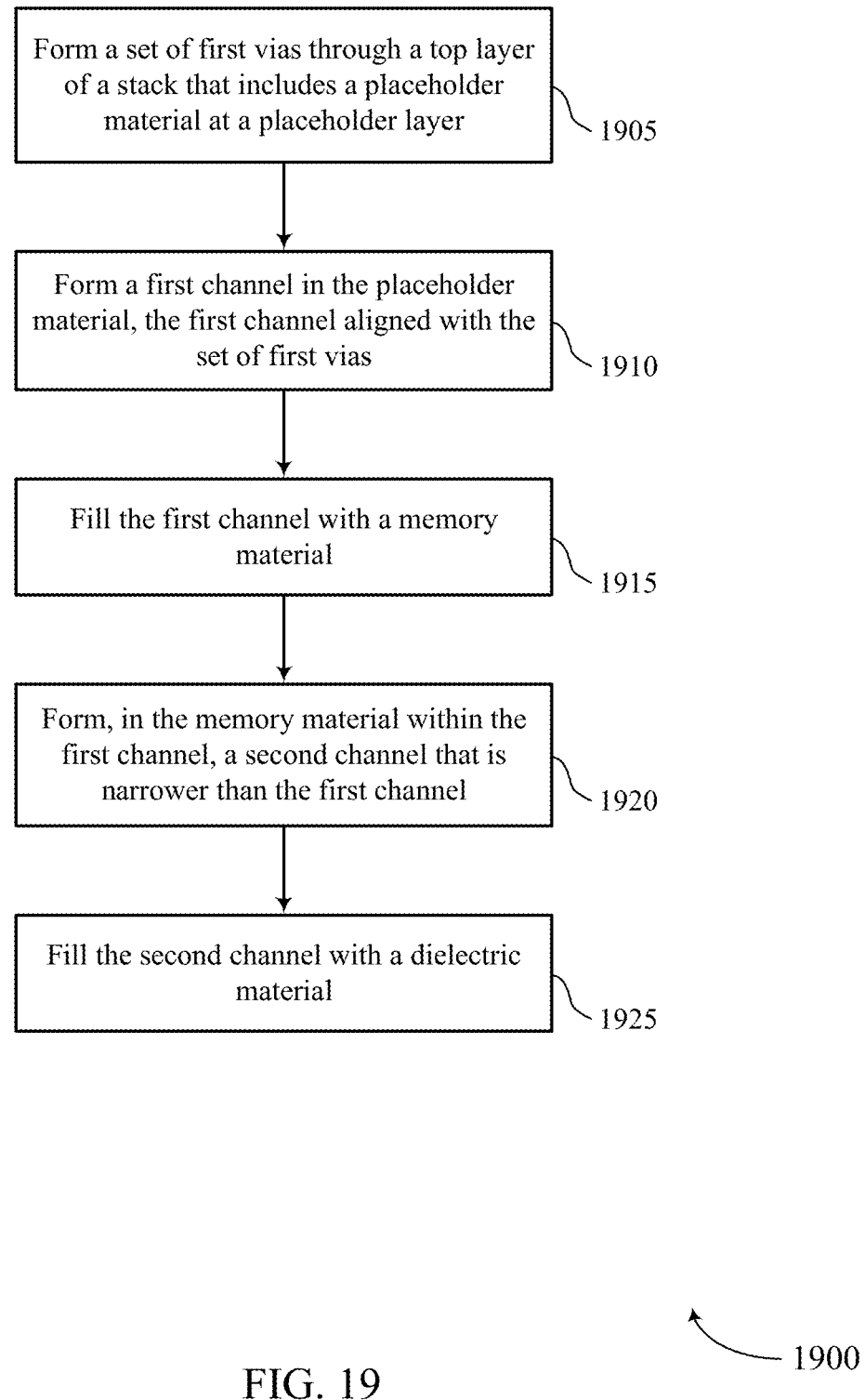

FIG. 19 shows a flowchart illustrating a method 1900 for a cross-point memory array and related fabrication techniques in accordance with embodiments of the present disclosure. The operations of method 1900 may be implemented by the method described herein, for example with reference to FIGS. 3 through 7 and 11.

At block 1905 a plurality of first vias may be formed through a top layer of a stack that comprises a placeholder material at a placeholder layer. The operations of block 1905 may be performed according to the methods described herein. In certain examples, aspects of the operations of block 1905 may be performed as part of one or more processes as described with reference to FIGS. 3 through 7 and 11.

At block 1910 a first channel may be formed in the placeholder material, the first channel aligned with the plurality of first vias. The operations of block 1910 may be performed according to the methods described herein. In certain examples, aspects of the operations of block 1910 may be performed as part of one or more processes as described with reference to FIGS. 3 through 7 and 11.

At block 1915 the first channel may be filled with a memory material. The operations of block 1915 may be performed according to the methods described herein. In certain examples, aspects of the operations of block 1915 may be performed as part of one or more processes as described with reference to FIGS. 3 through 7 and 11.

At block 1920 a second channel may be formed in the memory material within the first channel, the second channel that is narrower than the first channel. The operations of block 1920 may be performed according to the methods described herein. In certain examples, aspects of the operations of block 1920 may be performed as part of one or more processes as described with reference to FIGS. 3 through 7 and 11.

At block 1925 the second channel may be filled with a dielectric material. The operations of block 1925 may be performed according to the methods described herein. In certain examples, aspects of the operations of block 1925 may be performed as part of one or more processes as described with reference to FIGS. 3 through 7 and 11.

In some cases, the method 1900 may also include forming a third channel at the placeholder layer, wherein the third channel extends in a different direction than the first channel and separates the memory material within the first channel into a plurality of memory material elements.

In some examples of the method 1900 described above, forming the first channel comprises forming a plurality of first cavities in the placeholder material, wherein contiguous first cavities merge to form the first channel. In some examples of the method 1900 described above, forming the plurality of first cavities comprises removing, through the plurality of first vias, a portion of the placeholder material from the placeholder layer. In some examples of the method 1900 described above, forming the second channel comprises removing, through the plurality of first vias, a portion of the memory material from the first channel. In some examples of the method 1900 described above, filling the second channel with the dielectric material creates a band of memory material that surrounds the dielectric material in the second channel.

In some examples of the method 1900 described above, forming the third channel comprises forming a plurality of second vias through the top layer of the stack, wherein the plurality of second vias form a second row of vias that intersects a first row of vias formed by the plurality of first vias. In some examples of the method 1900 described above, each memory material element of the plurality of memory material elements may be coupled with at least three electrodes. In some examples of the method 1900 described above, the memory material comprises a chalcogenide material.

Figure 20:
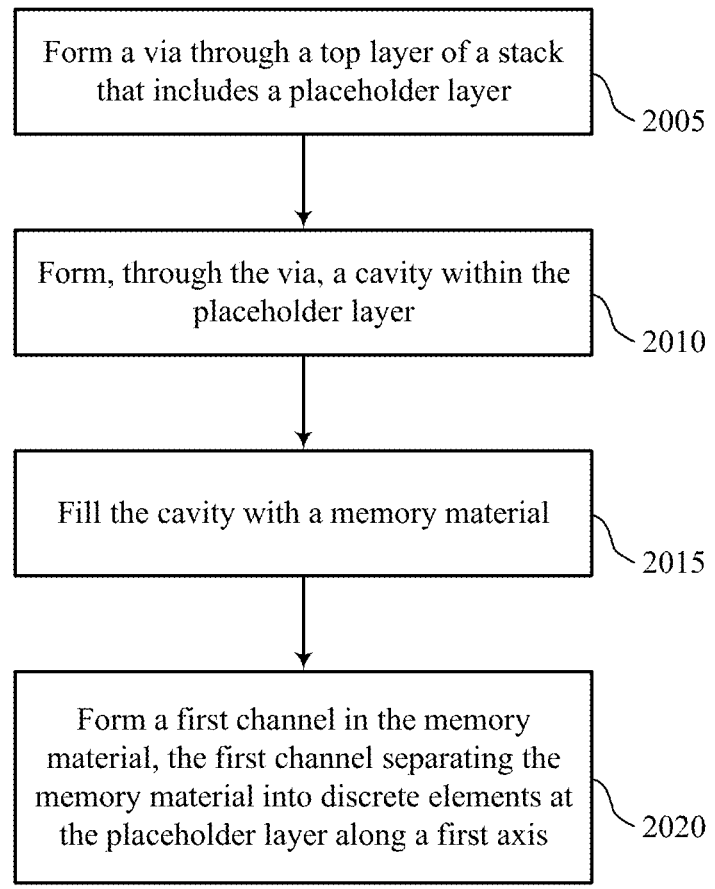

FIG. 20 shows a flowchart illustrating a method 2000 for a cross-point memory array and related fabrication techniques in accordance with embodiments of the present disclosure. The operations of method 2000 may be implemented by the method described herein, for example with reference to FIGS. 3 through 7 and 12.

At block 2005 a via may be formed through a top layer of a stack that comprises a placeholder layer. The operations of block 2005 may be performed according to the methods described herein. In certain examples, aspects of the operations of block 2005 may be performed as part of one or more processes as described with reference to FIGS. 3 through 7 and 12.

At block 2010 a cavity within the placeholder layer may be formed through the via. The operations of block 2010 may be performed according to the methods described herein. In certain examples, aspects of the operations of block 2010 may be performed as part of one or more processes as described with reference to FIGS. 3 through 7 and 12.

At block 2015 the cavity may be filled with a memory material. The operations of block 2015 may be performed according to the methods described herein. In certain examples, aspects of the operations of block 2015 may be performed as part of one or more processes as described with reference to FIGS. 3 through 7 and 12.

At block 2020 a first channel in the memory material may be formed, the first channel separating the memory material into discrete elements at the placeholder layer along a first axis. The operations of block 2020 may be performed according to the methods described herein. In certain examples, aspects of the operations of block 2020 may be performed as part of one or more processes as described with reference to FIGS. 3 through 7 and 12.

In some cases, the method 2000 may also include removing a portion of the memory material through the via, prior to forming the first channel, to form a ring of memory material at the placeholder layer, the ring of memory material surrounding a vertical axis of the via (e.g., an orthogonal direction with respect to a substrate). In some cases, the method 2000 may also include forming a second channel in the memory material, the second channel separating the memory material into additional discrete elements at the placeholder layer along a second axis different from the first axis.

In some examples of the method 2000 described above, forming the first channel comprises removing, through a plurality of vias that includes the via, a portion of the memory material from the placeholder layer. In some examples of the method 2000 described above, forming the second channel creates four memory material elements, each memory material element having a curved surface. In some examples of the method 2000 described above, the memory material comprises a chalcogenide material.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The term "electronic communication" and "coupled" refer to a relationship between components that support electron flow between the components. This may include a direct connection between components or may include intermediate components. Components in electronic communication or coupled to one another may be actively exchanging electrons or signals (e.g., in an energized circuit) or may not be actively exchanging electrons or signals (e.g., in a de-energized circuit) but may be configured and operable to exchange electrons or signals upon a circuit being energized. By way of example, two components physically connected via a switch (e.g., a transistor) are in electronic communication or may be coupled regardless of the state of the switch (i.e., open or closed).

As used herein, the term "substantially" means that the modified characteristic (e.g., a verb or adjective modified by the term substantially) need not be absolute but is close enough so as to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory device 100.

Chalcogenide materials may be materials or alloys that include at least one of the elements S, Se, and Te. Chalcogenide materials may include alloys of S, Se, Te, Ge, As, Al, Si, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. The hyphenated chemical composition notation, as used herein, indicates the elements included in a particular compound or alloy and is intended to represent all stoichiometries involving the indicated elements. For example, Ge—Te may include $Ge_xTe_y$, where x and y may be any positive integer. Other examples of variable resistance materials may include binary metal oxide materials or mixed valence oxide including two or more metals, e.g., transition metals, alkaline earth metals, and/or rare earth metals. Embodiments are not limited to a particular variable resistance material or materials associated with the memory components of the memory cells. For example, other examples of variable resistance materials can be used to form memory components and may include chalcogenide materials, colossal magnetoresistive materials, or polymer-based materials, among others.

The term "isolated" refers to a relationship between components in which electrons are not presently capable of flowing between them; components are isolated from each other if there is an open circuit between them. For example, two components physically connected by a switch may be isolated from each other when the switch is open.

The devices discussed herein, including a memory device 100, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A transistor or transistors discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers.

Combinations of the above are also included within the scope of computer-readable media.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming pluralities of first vias through a top layer of a stack that comprises a memory material at a memory layer, each plurality of first vias linearly disposed in a first direction;
    forming pluralities of second vias through the top layer of the stack, each plurality of second vias linearly disposed in a second direction that is different from the first direction;
    forming a plurality of first channels in the memory material, each first channel aligned with a plurality of first vias;
    forming a plurality of second channels in the memory material, each second channel intersecting the plurality of first channels; and
    filling the plurality of first channels and the plurality of second channels with a dielectric material.

2. The method of claim 1, wherein forming the plurality of second channels forms a plurality of memory material elements at the memory layer, each memory material element coupled with at least four electrodes.

3. The method of claim 2, wherein each memory material element is configured to comprise a plurality of memory cells.

4. The method of claim 2, wherein the at least four electrodes comprise two first electrodes located above a respective memory material element of the plurality of memory material elements and two second electrodes located below the respective memory material element, the two first electrodes both extending in one of the first direction or the second direction, and the two second electrodes both extending in another of the second direction or the first direction.

5. The method of claim 1, further comprising:
    forming a third channel in the dielectric material at a first layer of the stack, the third channel aligned with the plurality of first vias;
    filling the third channel with an electrode material;
    forming, in the electrode material within the third channel, a fourth channel that is narrower than the third channel; and
    filling the fourth channel with the dielectric material.

6. The method of claim 5, further comprising:
    forming a fifth channel in the dielectric material at a second layer of the stack, the fifth channel aligned with a plurality of second vias;
    filling the fifth channel with the electrode material;
    forming, in the electrode material within the fifth channel, a sixth channel that is narrower than the fifth channel; and
    filling the sixth channel with the dielectric material.

7. The method of claim 1, wherein forming the plurality of first channels comprises:
    forming a plurality of first cavities in the memory material, each first cavity corresponding to a first via, wherein contiguous first cavities corresponding to a plurality of first vias form a first channel.

8. The method of claim 1, wherein the second direction is orthogonal to the first direction.

9. A method, comprising:
    forming a stack that comprises a memory material at a memory layer;
    forming a plurality of via holes in the memory material; and
    forming a sheet of the memory material perforated by a plurality of dielectric plugs by filling the plurality of via holes with a dielectric material.

10. The method of claim 9, further comprising:
    forming a plurality of second via holes through the stack; and
    filling the plurality of second via holes with a second dielectric material to form additional dielectric plugs in the sheet of the memory material.

11. The method of claim 10, wherein:
    the plurality of via holes are disposed in a first linear configuration having a first direction; and
    the plurality of second via holes are disposed in a second linear configuration having a second direction that intersects the first direction.

12. The method of claim 11, wherein the second direction is orthogonal to the first direction.

13. The method of claim 10, wherein the sheet of the memory material comprises rows of dielectric plugs.

14. The method of claim 13, wherein a dielectric plug is common to the rows of dielectric plugs.

15. The method of claim 9, wherein the sheet of the memory material is configured to comprise a plurality of memory cells.

16. The method of claim 9, further comprising:
    forming a first channel in the dielectric material at a first layer of the stack, the first channel aligned with the plurality of via holes;
    filling the first channel with an electrode material;
    forming, in the electrode material within the first channel, a second channel that is narrower than the first channel; and
    filling the second channel with the dielectric material.

17. The method of claim 16, wherein forming the first channel comprises:
    forming a plurality of first cavities in the dielectric material, wherein contiguous first cavities of the plurality of first cavities merge to form the first channel.

18. The method of claim 17, wherein forming the plurality of first cavities comprises:
    removing, through the plurality of via holes, a portion of the dielectric material from the first layer.

19. The method of claim 16, further comprising:
    forming a plurality of second via holes through the stack, wherein the plurality of second via holes form a second row of via holes in a second direction that intersects a first direction corresponding to a first row of via holes formed by the plurality of via holes, and wherein the stack comprises a second dielectric material at a second layer;
    forming a third channel in the second dielectric material, the third channel aligned with the plurality of second via holes;
    filling the third channel with the electrode material;
    forming, in the electrode material within the third channel, a fourth channel that is narrower than the third channel; and filling the fourth channel with the second dielectric material.

20. The method of claim 9, wherein the memory material comprises a chalcogenide material.

* * * * *